(12) United States Patent
Nakayama et al.

(10) Patent No.: US 9,188,868 B2
(45) Date of Patent: Nov. 17, 2015

(54) LITHOGRAPHIC PRINTING PLATE PRECURSORS AND PROCESSES FOR PREPARING LITHOGRAPHIC PRINTING PLATES

(71) Applicant: FUJIFILM Corporation, Minato-ku, Tokyo (JP)

(72) Inventors: Takafumi Nakayama, Haibara-gun (JP); Yu Iwai, Haibara-gun (JP); Junya Abe, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/167,587

(22) Filed: Jan. 29, 2014

(65) Prior Publication Data

US 2014/0147789 A1 May 29, 2014

Related U.S. Application Data

(63) Continuation of application No. PCT/JP2012/070292, filed on Aug. 9, 2012.

(30) Foreign Application Priority Data

Aug. 22, 2011 (JP) .................. 2011-180797

(51) Int. Cl.
*G03F 7/00* (2006.01)
*G03F 7/09* (2006.01)
(Continued)

(52) U.S. Cl.
CPC .............. *G03F 7/092* (2013.01); *B41C 1/1016* (2013.01); *C08F 220/36* (2013.01); *C08F 230/02* (2013.01); *G03F 7/027* (2013.01); *G03F 7/11* (2013.01); *G03F 7/3035* (2013.01); *G03F 7/32* (2013.01); *G03F 7/322* (2013.01); *B41C 2201/02* (2013.01); *B41C 2201/04* (2013.01); *B41C 2201/06* (2013.01); *B41C 2201/10* (2013.01); *B41C 2201/12* (2013.01); *B41C 2201/14* (2013.01); *B41C 2210/04* (2013.01); *B41C 2210/06* (2013.01); *B41C 2210/10* (2013.01); *B41C 2210/24* (2013.01);
(Continued)

(58) Field of Classification Search
CPC ...................................... B41C 1/1016
See application file for complete search history.

(56) References Cited

U.S. PATENT DOCUMENTS

2006/0046185 A1    3/2006 Goto

FOREIGN PATENT DOCUMENTS

| JP | 2006-65065 A | | 3/2006 |
|---|---|---|---|
| JP | 2006-215263 A | | 8/2006 |
| JP | 2006239860 A | * | 9/2006 |

OTHER PUBLICATIONS

International Search Report for PCT/JP2012/070292 dated Oct. 23, 2012.

(Continued)

*Primary Examiner* — Chanceity Robinson
(74) *Attorney, Agent, or Firm* — Sughrue Mion, PLLC

(57) ABSTRACT

A lithographic printing plate precursor having excellent printing durability, staining resistance and developability as well as processes for preparing lithographic printing plates therefrom. The lithographic printing plate precursor may comprise a primer layer and an image-recording layer in this order in a substrate, wherein the primer layer comprises a polymer containing a repeat unit having a carbon-carbon backbone, a —C(=O)— group directly attached thereto, a —C(=O)—NR⁰— group, a carboxyl group or a salt thereof, and an ethylenically unsaturated bond.

20 Claims, 2 Drawing Sheets

(51) Int. Cl.
- *B41C 1/10* (2006.01)
- *C08F 230/02* (2006.01)
- *C08F 220/36* (2006.01)
- *G03F 7/11* (2006.01)
- *G03F 7/027* (2006.01)
- *G03F 7/30* (2006.01)
- *G03F 7/32* (2006.01)
- *B41N 1/14* (2006.01)
- *G03F 7/028* (2006.01)
- *G03F 7/033* (2006.01)

(52) U.S. Cl.
CPC .................. *B41N 1/14* (2013.01); *G03F 7/028* (2013.01); *G03F 7/033* (2013.01)

(56) References Cited

OTHER PUBLICATIONS

English translation of the International Preliminary Report on Patentability mailed Mar. 6, 2014 in International Application No. PCT/JP2012/070292.

International Preliminary Report on Patentability mailed Mar. 6, 2014 for International Application No. PCT/JP2012/070292.

Extended European Search Report (EESR) dated Mar. 4, 2015 in counterpart European Application No. 12 82 5662.5.

* cited by examiner

LITHOGRAPHIC PRINTING PLATE PRECURSORS AND PROCESSES FOR PREPARING LITHOGRAPHIC PRINTING PLATES

The present application is a continuation of PCT/JP2012/070292 filed on Aug. 9, 2012 and claims priority under 35 U.S.C. §119 of Japanese Patent Application No. 180797/2011, filed on Aug. 22, 2011, the content of which is herein incorporated by reference in their entirety.

TECHNICAL FIELD

The present invention relates to lithographic printing plate precursors that can be applied to directly make plates using various lasers under the control of digital signals from computers and the like, i.e., those applicable to so-called computer-to-plate systems, as well as processes for preparing lithographic printing plates therefrom, especially it relates to lithographic printing plate precursors suitable for simplified processing and processes for preparing lithographic printing plates therefrom.

BACKGROUND ART

Solid-state laser, semiconductor laser, and gas laser capable of emitting ultraviolet radiation, visible light and infrared radiation, over a wavelength range of 300 nm to 1200 nm, have been becoming more readily available in larger output and smaller size, and these types of laser are very important as recording light sources in direct plate making process using digital data output from a computer or the like. Recording materials sensitive to these various lasers have been extensively studied, and a first category of typical examples includes materials on which images can be recorded with infrared lasers at a wavelength of 760 nm or more such as positive-working recording materials and negative-working recording materials susceptible to acid-catalyzed cross-linking and the like. A second category includes recording materials sensitive to ultraviolet or visible light lasers at 300 nm to 700 nm such as negative-working recording materials susceptible to radical polymerization.

On the other hand, conventional lithographic printing plate precursors (hereinafter also referred to as PS plates) required a step for dissolving non-image areas away using an aqueous strongly alkaline solution (developing step) after imagewise exposure, and further required a post-treatment step during which the printing plates bearing a developed image are washed with water, or treated with a rinsing solution containing a surfactant, or treated with a desensitizing solution containing gum arabic or a starch derivative. The necessity of these additional wet processes is a major problem with conventional PS plates. The first half (imagewise exposure) of a plate making process may be simplified by the digital processing described above, but the effect of simplification would be insufficient so far as the second half (developing step) is a complex wet process. Especially given that global environmental protection has recently drawn a great deal of interest from the whole industry, it would also be desirable to use a developer at a pH closer to the neutral range or to reduce liquid waste for the purpose of environmental protection. Specifically, it would be desirable that the wet post-treatment process be simplified or replaced by a dry process.

An approach for simplifying the process to solve these problems is a one-solution or one-bath method in which development and gumming take place at the same time. This is a simplified development process comprising imagewise exposing a printing plate precursor without subjecting it to a water pre-washing step, followed by removal of the protective layer, removal of non-image areas and gumming at the same time using one solution or one bath, and drying the resulting plate without subjecting it to a water post-washing step, and then transferring it to a printing step. Lithographic printing plate precursors suitable for such simplified development must have an image-recording layer soluble in non-strongly alkaline solutions because no water post-washing step is included, but also they must have a hydrophilic substrate surface to improve staining resistance of non-image areas.

Such lithographic printing plate precursors are known from patent document 1 and patent document 2.

REFERENCES

Patent Documents

Patent document 1: JP-A2006-65065
Patent document 2: JP-A2006-215263

SUMMARY OF THE INVENTION

Problems to be Solved by the Invention

However, patent document 1 cited above proposes a specially designed protective layer, which is a quite different approach from that of the present invention. Further, patent document 1 describes that a binder corresponding to the binder used in the primer layer in the present invention is used in an image-forming layer, but does not describe that it is used in a primer layer.

Moreover, patent document 1 describes at paragraph 0103 that the binder has a hydrophobic substituent. Those skilled in the art normally avoid using such a hydrophobic binder polymer in a primer layer because it may cause insufficient development or staining resistance loss if it is used in a primer layer especially in lithographic printing plates that are treated with a weak alkali or developed on press. On the other hand, we reviewed patent document 2 to find that staining resistance and developability were unsatisfactory when a binder having the structure described in patent document 2 was used.

Thus, it was practically impossible to achieve high printing durability and developability with conventional PS plates while satisfying such a demand for staining resistance (especially staining resistance over time).

The present invention aims to overcome these disadvantages of the prior art, and to provide lithographic printing plate precursors having excellent printing durability, staining resistance and developability as well as processes for preparing lithographic printing plates therefrom.

Means for Solving the Problems

As a result of careful studies under these circumstances, we found that the problems described above can be solved by employing a primer layer comprising a polymer containing a repeat unit having a carbon-carbon backbone, a —C(=O)— group directly attached thereto, a —C(=O)—NR⁰— group (wherein R⁰ represents a hydrogen atom or an optionally substituted alkyl group), a carboxyl group or a salt thereof, and an ethylenically unsaturated bond. Specifically, the problems described above were solved by means of <1> below. Preferably, they were solved by means of [2] to [16] below.
[1] A lithographic printing plate precursor comprising a primer layer and an image-recording layer in this order in a substrate, wherein the primer layer comprises (A) a polymer containing a repeat unit represented by formula (1);

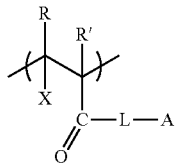

Formula (1)

in formula (1), R and R' each represent a hydrogen atom, halogen atom, or methyl group, L represents a divalent linking group containing —C(=O)—$NR^0$— (wherein $R^0$ represents a hydrogen atom or an optionally substituted alkyl group); A and X each represent a monovalent organic group, provided that at least one of A and X represents an organic group containing a carboxyl group or a salt of a carboxylic group and at least one of A and X represents an organic group containing an ethylenically unsaturated bond.

[2] The lithographic printing plate precursor according to [1], wherein the polymer (A) contains a repeat unit represented by formula (2) and/or a repeat unit represented by formula (3);

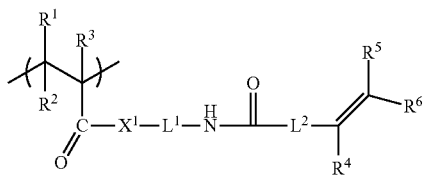

Formula (2)

in formula (2), $R^1$, $R^2$ and $R^3$ each represent a hydrogen atom, halogen atom or methyl group, X represents —O— or —$N(R^7)$— wherein $R^7$ represents a hydrogen atom or an optionally substituted alkyl group, $L^1$ represents a divalent linking group, and $L^2$ represents a single bond or an optionally substituted divalent linking group; $R^4$, $R^5$ and $R^6$ each represent a hydrogen atom, halogen atom, carboxyl group, hydroxyl group, or an optionally substituted alkyl group or aryl group, provided that at least one of the substituent which $L^2$ has, $R^4$, $R^5$ and $R^6$ represents a carboxyl group or a salt of a carboxylic group, or a group substituted by a carboxyl group or a salt of a carboxylic group; any two or more of the substituent which $L^2$ has, $R^4$, $R^5$ and $R^6$ may be joined together to form a ring;

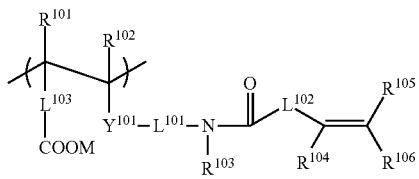

Formula (3)

in formula (3), $R^{101}$ and $R^{102}$ each represent a hydrogen atom, halogen atom or methyl group, $Y^{101}$ represents —CO—O— or —CO—$N(R^{107})$— wherein $R^{107}$ represents a hydrogen atom or an optionally substituted alkyl group, $R^{103}$ represents a hydrogen atom or an optionally substituted alkyl group, $L^{101}$ represents a divalent linking group, and $L^{102}$ represents a single bond or an optionally substituted divalent linking group; $R^{104}$, $R^{105}$ and $R^{106}$ each represent a hydrogen atom, halogen atom, carboxyl group, hydroxyl group, or an optionally substituted alkyl group or an optionally substituted aryl group, or any two or more of $L^{102}$, $R^{104}$, $R^{105}$, and $R^{106}$ may be joined together to form a ring; $L^{103}$ represents a single bond or an optionally substituted divalent linking group, and M represents a hydrogen atom or a monovalent metal ion or ammonium.

[3] The lithographic printing plate precursor according to [1], wherein the polymer (A) contains at least one of a repeat unit represented by formula (3), a repeat unit represented by formula (4) and a repeat unit represented by formula (5);

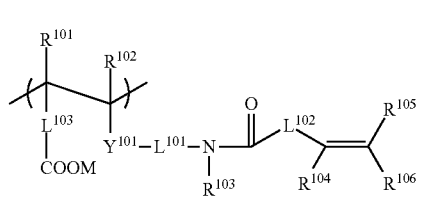

Formula (3)

in formula (3), $R^{101}$ and $R^{102}$ each represent a hydrogen atom, halogen atom or methyl group, $Y^{101}$ represents —CO—O— or —CO—$N(R^{107})$ wherein $R^{107}$ represents a hydrogen atom or an optionally substituted alkyl group, $R^{103}$ represents a hydrogen atom or an optionally substituted alkyl group, $L^{101}$ represents a divalent linking group, and $L^{102}$ represents a single bond or an optionally substituted divalent linking group; $R^{104}$, $R^{105}$ and $R^{106}$ each represent a hydrogen atom, halogen atom, carboxyl group, hydroxyl group, or an optionally substituted alkyl group or an optionally substituted alkyl aryl group, or any two or more of $L^{102}$, $R^{104}$, $R^{105}$, and $R^{106}$ may be joined together to form a ring; $L^{103}$ represents a single bond or an optionally substituted divalent linking group, and M represents a hydrogen atom or a monovalent metal ion or ammonium;

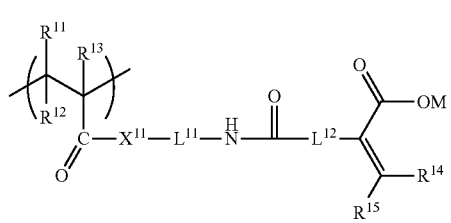

Formula (4)

in formula (4), $R^{11}$, $R^{12}$ and $R^{13}$ each represent a hydrogen atom, halogen atom or methyl group, $X^{11}$ represents —O— or —$N(R^{16})$— wherein $R^{16}$ represents a hydrogen atom or an optionally substituted alkyl group, $L^{11}$ represents a divalent linking group, and $L^{12}$ represents a single bond or an optionally substituted divalent linking group; $R^{14}$ and $R^{15}$ each represent a hydrogen atom, halogen atom, carboxyl group, hydroxyl group, or an optionally substituted alkyl group or an optionally substituted aryl group, or any two or more of $L^{12}$, $R^{14}$ and $R^{15}$ may be joined together to form a ring; M represents a hydrogen atom or a monovalent metal ion or ammonium;

Formula (5)

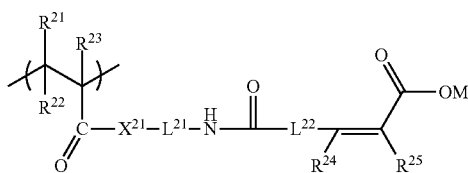

in formula (5), $R^{21}$, $R^{22}$ and $R^{23}$ each represent a hydrogen atom, halogen atom or methyl group, $X''$ represents —O— or —N($R^{26}$)— wherein $R^{26}$ represents a hydrogen atom or an optionally substituted alkyl group, $L^{21}$ represents a divalent linking group, and $L^{22}$ represents a single bond or an optionally substituted divalent linking group; $R^{24}$ and $R^{25}$ each represent a hydrogen atom, halogen atom, carboxyl group, hydroxyl group, or an optionally substituted alkyl group or an optionally substituted aryl group, or any two or more of $L^{22}$, $R^{24}$ and $R^{25}$ may be joined together to form a ring; M represents a hydrogen atom or a monovalent metal ion or ammonium.

[4] The lithographic printing plate precursor according to [1] to [3], wherein the polymer (A) further contains (a2) a repeat unit having a structure interacting with the substrate surface in a side chain and/or (a3) a repeat unit having a hydrophilic group in a side chain.

[5] The lithographic printing plate precursor according to [4], wherein the repeat unit (a2) having a structure interacting with the substrate surface in a side chain has any one or more of structures represented by formulae (a2-1) to (a2-6) below in a side chain;

(a2-1)
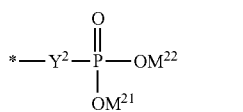

(a2-2)
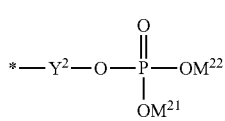

(a2-3)
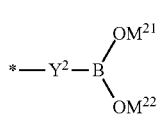

(a2-4)
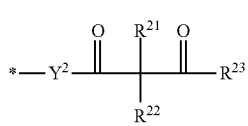

(a2-5)
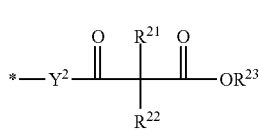

(a2-6)
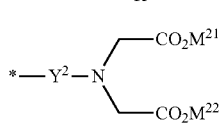

in formulae (a2-1), (a2-2), (a2-3), (a2-4), (a2-5) and (a2-6), $M^{21}$ and $M^{22}$ each represent a hydrogen atom, a metal atom categorized into an alkali metal or an alkaline earth metal, or ammonium; $R^{21}$ to $R^{23}$ each independently represent a hydrogen atom or alkyl group; $Y^2$ represents a single bond or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

[6] The lithographic printing plate precursor according to [4] or [5], wherein the repeat unit (a3) having a hydrophilic group in a side chain has a structure represented by formula (a3-1) and/or formula (a3-2) below in the side chain;

(a3-1)
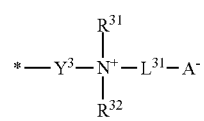

in formula (a3-1), $R^{31}$ and $R^{32}$ each independently represent a hydrogen atom, alkyl group, alkenyl group, alkynyl group, aryl group, or heterocyclyl group, or $R^{31}$ and $R^{32}$ may be joined together to form a ring structure, $L^{31}$ represents a linking group, and $A^-$ represents an anion-containing structure. $Y^3$ represents a divalent linking group attached to the main chain of the polymer compound; the asterisk (*) indicates the point of attachment to the main chain of the polymer compound;

(a3-2)
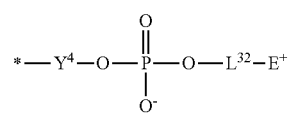

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

[7] The lithographic printing plate precursor according to [1], wherein the polymer (A) contains (a2) and (a3) below: (a2) a repeat unit having any one or more of structures represented by formulae (a2-1) to (a2-6) in a side chain:

(a2-1)
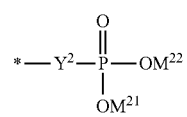

(a2-2)
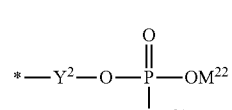

(a2-3)
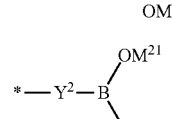

-continued

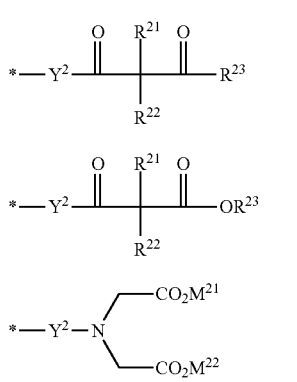

(a2-4)

(a2-5)

(a2-6)

in formulae (a2-1), (a2-2), (a2-3), (a2-4), (a2-5) and (a2-6), $M^{21}$ and $M^{22}$ each represent a hydrogen atom, a metal atom categorized into an alkali metal or an alkaline earth metal, or ammonium; $R^{21}$ to $R^{23}$ each independently represent a hydrogen atom or alkyl group; $Y^2$ represents a single bond or a divalent linking group selected from the group consisting of —CO—, —O—, —NH—, a divalent aliphatic group, a divalent aromatic group and a combination thereof; the asterisk (*) indicates the point of attachment to the main chain of the polymer compound;

(a3) a repeat unit having a structure represented by formula (a3-1) and/or (a3-2) in a side chain:

(a3-1)

in formula (a3-1), $R^{31}$ and $R^{32}$ each independently represent a hydrogen atom, alkyl group, alkenyl group, alkynyl group, aryl group, or heterocyclyl group, or $R^{31}$ and $R^{32}$ may be joined together to form a ring structure, $L^{31}$ represents a linking group, and $A^-$ represents an anion-containing structure; $Y^3$ represents a divalent linking group attached to the main chain of the polymer compound; the asterisk (*) indicates the point of attachment to the main chain of the polymer compound;

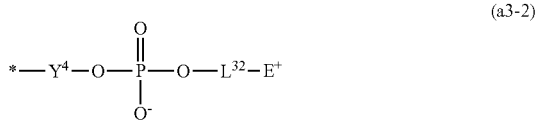

(a3-2)

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

[8] The lithographic printing plate precursor according to any one of [2] to [7], wherein $L^1$ in formula (2), $L^{101}$ in formula (3), $L^{11}$ in formula (4), and $L^{21}$ in formula (5) above represent a divalent aliphatic group, and $L^2$ in formula (2), $L^{102}$ in formula (3), $L^{12}$ in formula (4), and $L^{22}$ in formula (5) above represent a single bond or a divalent aliphatic group.

[9] The lithographic printing plate precursor according to any one of [1] to [8], wherein the image-recording layer comprises (B) a polymerization initiator, (C) a polymerizable compound and (D) a binder.

[10] The lithographic printing plate precursor according to any one of [1] to [9], wherein the image-recording layer can be removed by an aqueous solution at pH 2 to 14.

[11] The lithographic printing plate precursor according to anyone of [1] to [10], wherein the image-recording layer can be removed by at least one of a printing ink and a dampening solution.

[12] A process for preparing a lithographic printing plate, comprising:

imagewise exposing a lithographic printing plate precursor according to any one of [1] to [11]; and developing the exposed lithographic printing plate precursor in the presence of a developer at pH 2 to 14 to remove the image-recording layer in unexposed areas.

[13] The process for preparing a lithographic printing plate according to [12], comprising forming a protective layer on the surface of the image-recording layer opposite to the substrate;

wherein the developing step comprises removing the image-recording layer in unexposed areas and the protective layer simultaneously in the presence of the developer further containing a surfactant provided that no water-washing step is included.

[14] A process for preparing a lithographic printing plate, comprising:

imagewise exposing a lithographic printing plate precursor according to any one of [1] to [11]; and supplying a printing ink and a dampening solution to remove the image-recording layer in unexposed areas on a printing press.

[15] A copolymer comprising (a1) to (a3) below: (a1) a repeat unit represented by formula (1):

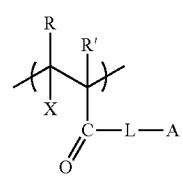

Formula (1)

in formula (1), R and R' each represent a hydrogen atom, halogen atom, or methyl group, L represents a divalent linking group containing —C(=O)—NR⁰— wherein R⁰ represents a hydrogen atom or an optionally substituted alkyl; A and X each represent a monovalent organic group, provided that at least one of A and X represents an organic group containing a carboxyl group or a salt of a carboxylic group and at least one of A and X represents an organic group containing an ethylenically unsaturated bond.

(a2) a repeat unit having any one or more of structures represented by formulae (a2-1) to (a2-6) in a side chain:

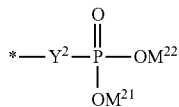
(a2-1)

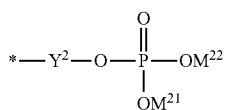
(a2-2)

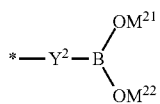
(a2-3)

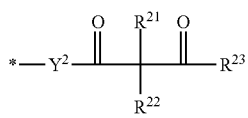
(a2-4)

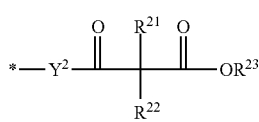
(a2-5)

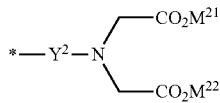
(a2-6)

in formulae (a2-1), (a2-2), (a2-3), (a2-4), (a2-5) and (a2-6), $M^{21}$ and $M^{22}$ each represent a hydrogen atom, a metal atom contained in an alkali metal or an alkaline earth metal, or ammonium; $R^{21}$ to $R^{23}$ each independently represent a hydrogen atom or alkyl group; $Y^2$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound;

(a3) a repeat unit having a structure represented by formula (a3-1) and/or (a3-2) in a side chain:

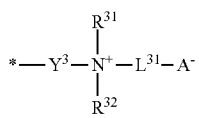
(a3-1)

in formula (a3-1), $R^{31}$ and $R^{32}$ each independently represent a hydrogen atom, alkyl group, alkenyl group, alkynyl group, aryl group, or heterocyclyl, or $R^{31}$ and $R^{32}$ may be joined together to form a ring structure, $L^{31}$ represents a linking group, and $A^-$ represents an anion-containing structure; $Y^3$ represents a divalent linking group attached to the main chain of the polymer compound; the asterisk (*) indicates the point of attachment to the main chain of the polymer compound;

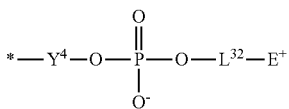
(a3-2)

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

[16] The copolymer according to [15], wherein the repeat unit represented by formula (1) is a repeat unit represented by formula (4) or a repeat unit represented by formula (5):

Formula (4)

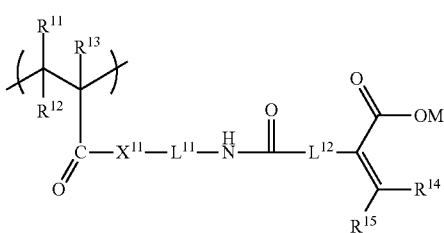

in formula (4), $R^{11}$, $R^{12}$ and $R^{13}$ each represent a hydrogen atom, halogen atom or methyl, $X^{11}$ represents —O— or —N($R^{16}$)— wherein $R^{16}$ represents a hydrogen atom or an optionally substituted alkyl group, $L^{11}$ represents a divalent linking group, and $L^{12}$ represents a single bond or an optionally substituted divalent linking group; $R^{14}$ and $R^{15}$ each represent a hydrogen atom, halogen atom, carboxyl, hydroxyl, or an optionally substituted alkyl or aryl, or any two or more of $L^{12}$, $R^{14}$ and $R^{15}$ may be joined together to form a ring; M represents a hydrogen atom or a monovalent metal ion or ammonium;

Formula (5)

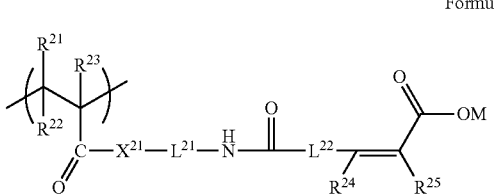

in formula (5), $R^{21}$, $R^{22}$ and $R^{23}$ each represent a hydrogen atom, halogen atom or methyl, $X^{21}$ represents —O— or —N($R^{26}$)— wherein $R^{26}$ represents a hydrogen atom or an optionally substituted alkyl, $L^{21}$ represents a divalent linking group, and $L^{22}$ represents a single bond or an optionally substituted divalent linking group; $R^{24}$ and $R^{25}$ each represent a hydrogen atom, halogen atom, carboxyl, hydroxyl, or an optionally substituted alkyl or aryl, or any two or more of $L^{22}$, $R^{24}$ and $R^{25}$ may be joined together to form a ring. M represents a hydrogen atom or a monovalent metal ion or ammonium.

Advantages of the Invention

The present invention made it possible to provide lithographic printing plate precursors having excellent printing durability, staining resistance and developability as well as processes for preparing lithographic printing plates therefrom.

THE BEST EMBODIMENTS OF THE INVENTION

Figure 1:
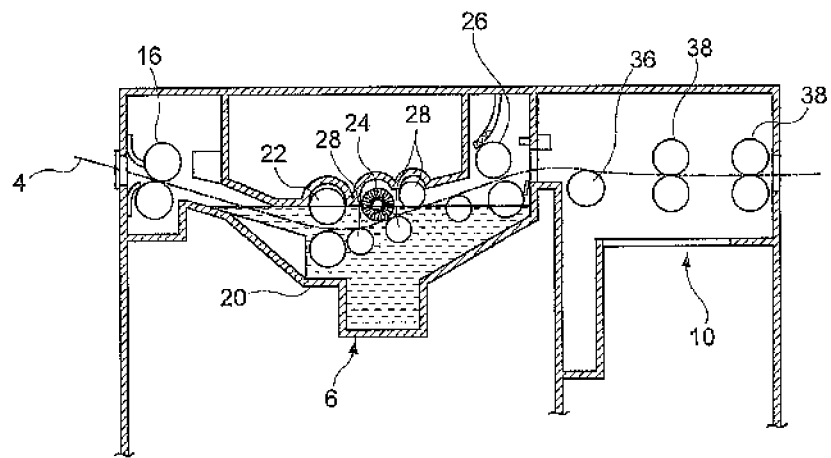
FIG. 1 is an explanatory drawing illustrating an exemplary configuration of an automatic processor.

The present invention will be explained in detail below. As used herein, the numerical ranges expressed with "to" are used to mean the ranges including the values indicated before and after "to" as lower and upper limits. As used herein, any reference to a group in a compound represented by a general formula without indicating that the group is substituted or unsubstituted includes the group not only unsubstituted but also substituted if the group may be further substituted, unless otherwise specified. For example, the reference in a formula that "R represents alkyl, aryl or heterocyclyl" means that "R represents unsubstituted alkyl, substituted alkyl, unsubstituted aryl, substituted aryl, unsubstituted heterocyclyl or substituted heterocyclyl".

[Lithographic Printing Plate Precursors]

The lithographic printing plate precursors of the present invention comprise a primer layer and an image-recording layer in this order in a substrate, characterized in that the primer layer comprises (A) a polymer containing a repeat unit represented by formula (1).

First, the polymer (A) is explained.

The polymer (A) contains a repeat unit represented by formula (1) and may further contain an additional repeat unit, preferably (a2) a repeat unit having a structure interacting with the substrate surface in a side chain and/or (a3) a repeat unit having a hydrophilic group in a side chain.

(a1) Repeat unit represented by formula (1):

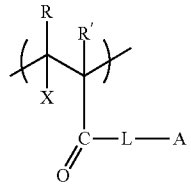

in formula (1), R and R' each represent a hydrogen atom, halogen atom, or methyl group, L represents a divalent linking group containing —C(=O)—NR⁰— (wherein R⁰ represents a hydrogen atom or an optionally substituted alkyl group); A and X each represent a monovalent organic group, provided that at least one of A and X represents an organic group containing a carboxyl group or a salt of a carboxylic group and at least one of A and X represents an organic group containing an ethylenically unsaturated bond. Preferably, the repeat unit represented by formula (1) contains a —NH—C(=O)— structure, more preferably two or more —NH—C(=O)— structures in each repeat unit. Further, L preferably represents a divalent linking group containing an amide bond.

Preferably, the polymer (A) contains a repeat unit represented by formula (2) and/or a repeat unit represented by formula (3):

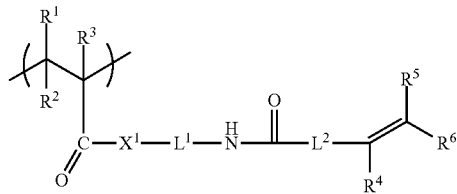

Formula (2)

in formula (2), $R^1$, $R^2$ and $R^3$ each represent a hydrogen atom, halogen atom or methyl group, $X^1$ represents —O— or —N($R^7$)— wherein $R^7$ represents a hydrogen atom or an optionally substituted alkyl group, $L^1$ represents a divalent linking group, and $L^2$ represents a single bond or an optionally substituted divalent linking group; $R^4$, $R^5$ and $R^6$ each represent a hydrogen atom, halogen atom, carboxyl group, hydroxyl group, or an optionally substituted alkyl group or aryl group, provided that at least one of the substituent which $L^2$ has, $R^4$, $R^5$ and $R^6$ represents a carboxyl group or a salt of a carboxylic group, or a group substituted by a carboxyl group or a salt of a carboxylic group; any two or more of the substituent which $L^2$ has, $R^4$, $R^5$ and $R^6$ may be joined together to form a ring.

Preferably, the repeat unit represented by formula (2) contains one or more amide bonds, more preferably two amide bonds.

Preferably, $R^1$, $R^2$ and $R^3$ each represent a hydrogen atom or methyl. When $R^1$, $R^2$ and $R^3$ represent a halogen atom, it is preferably a fluorine atom, chlorine atom, or bromine atom, more preferably a fluorine atom.

Preferably, $X^1$ represents —N($R^7$)—. Preferably, $R^7$ represents a hydrogen atom.

Preferably, $L^1$ represents a divalent linking group selected from the group consisting of —CO—, —O—, —NH—, a divalent aliphatic group, a divalent aromatic group and a combination thereof, more preferably a divalent linking group selected from the group consisting of —O—, a divalent aliphatic group, a divalent aromatic group and a combination thereof, even more preferably a divalent linking group selected from the group consisting of —O—, a divalent aliphatic group, and a combination thereof, especially preferably a divalent aliphatic group, still more preferably a straight-chain alkylene group.

The divalent aliphatic group here refers to alkylene group, substituted alkylene group, alkenylene group, substituted alkenylene group, alkynylene group, substituted alkynylene group or polyalkyleneoxy group. Especially preferred are alkylene group, substituted alkylene group, alkenylene group, substituted alkenylene group and polyalkyleneoxy group, more preferably alkylene group, substituted alkylene group and polyalkyleneoxy group. The divalent aliphatic group preferably has a chain structure rather than a ring structure, more preferably a straight-chain structure rather than a branched chain structure. The divalent aliphatic group preferably contains 1 to 20 carbon atoms, more preferably 1 to 15 carbon atoms, further more preferably 1 to 12 carbon atoms, even more preferably 1 to 10 carbon atoms, still more preferably 1 to 8 carbon atoms, especially preferably 1 to 4 carbon atoms.

Examples of substituents on the divalent aliphatic group include halogen atoms (F, Cl, Br, I), hydroxyl group, carboxyl group, amino group, cyano group, aryl group, alkoxy group, aryloxy group, monoalkylamino group, dialkylamino group, arylamino group and diarylamino group and the like.

Examples of divalent aromatic groups include phenylene group, substituted phenylene group, naphthalene group and substituted naphthalene group, preferably phenylene group. Examples of substituents on the divalent aromatic group include the examples of substituents on the divalent aliphatic group listed above, as well as alkyl group.

Preferably, $L^2$ represents a single bond or a divalent linking group selected from the group consisting of —CO—, —O—, —NH—, a divalent aliphatic group, a divalent aromatic group and a combination thereof, more preferably a single bond or a divalent aliphatic group.

The divalent aliphatic group preferably has a chain structure rather than a ring structure, more preferably a straight-chain structure rather than a branched chain structure. The divalent aliphatic group preferably contains 1 to 20 carbon atoms, more preferably 1 to 15 carbon atoms, further more preferably 1 to 12 carbon atoms, even more preferably 1 to 10 carbon atoms, still more preferably 1 to 8 carbon atoms, especially preferably 1 to 4 carbon atoms. Examples of substituents on the divalent aliphatic group include halogen atoms (F, Cl, Br, I), hydroxyl group, carboxyl group, amino group, cyano group, aryl group, alkoxy group, aryloxy group, monoalkylamino group, dialkylamino group, arylamino group and diarylamino group and the like.

Examples of divalent aromatic groups include phenylene group, substituted phenylene group, naphthalene group and substituted naphthalene group, preferably phenylene group. Examples of substituents on the divalent aromatic group include the examples of substituents on the divalent aliphatic group listed above, as well as alkyl group.

Preferably, $R^4$ to $R^6$ each represent a hydrogen atom, carboxyl group or an optionally substituted C1-50 alkyl group or an optionally substituted C1-50 aryl group, more preferably a hydrogen atom, carboxyl group or an optionally substituted C1-40 alkyl group or an optionally substituted C1-40 aryl group, even more preferably a hydrogen atom or an optionally substituted and optionally branched C1-30 alkyl group, most preferably a hydrogen atom or methyl group. Alternatively, any two or more of $L^2$, $R^4$, $R^5$ and $R^6$ may be joined together to form a ring. Two of the groups may be joined together to form a ring, or three or more of the groups may be joined together to form a fused ring system. Further, two rings may be formed each from two of the groups joined together. Preferably, two of the groups are joined together to form a ring.

Formula (3)

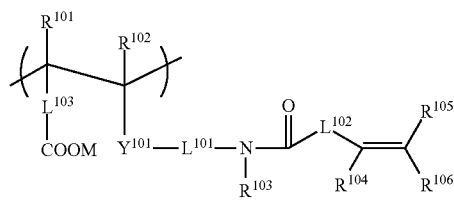

in formula (3), $R^{101}$ and $R^{102}$ each represent a hydrogen atom, halogen atom or methyl group, $Y^{101}$ represents —CO—O— or —CO—N($R^{107}$)— wherein $R^{107}$ represents a hydrogen atom or an optionally substituted alkyl group, $R^{103}$ represents a hydrogen atom or an optionally substituted alkyl group, $L^{101}$ represents a divalent linking group, and $L^{102}$ represents a single bond or an optionally substituted divalent linking group; $R^{104}$, $R^{105}$ and $R^{106}$ each represent a hydrogen atom, halogen atom, carboxyl group, hydroxyl group, or an optionally substituted alkyl group or an optionally substituted aryl group, or any two or more of $L^{102}$, $R^{104}$, $R^{105}$, and $R^{106}$ may be joined together to form a ring; $L^{103}$ represents a single bond or an optionally substituted divalent linking group, and M represents a hydrogen atom or a monovalent metal ion or ammonium.

Preferably, the repeat unit represented by formula (3) contains one or more amide bonds, more preferably two amide bonds.

Preferably, $R^{101}$ and $R^{102}$ each represent hydrogen or methyl.

Preferably, $Y^{101}$ represents —CO—N($R^{107}$)—. Preferably, $R^{107}$ and $R^{103}$ represent a hydrogen atom.

$L^{101}$ has the same meaning as defined for $L^1$ in formula (2), and also covers similar preferred ranges.

$L^{102}$ has the same meaning as defined for $L^2$ in formula (2), and also covers similar preferred ranges.

$R^{104}$ to $R^{106}$ have the same meaning as defined for $R^4$ in formula (2), and also cover similar preferred ranges.

Alternatively, any two or more of $L^{102}$, $R^{104}$, $R^{105}$ and $R^{106}$ may be joined together to form a ring. Two of the groups may be joined together to form a ring, or three or more of the groups may be joined together to form a fused ring system. Further, two rings may be formed each from two of the groups joined together. Preferably, two of the groups are joined together to form a ring.

M represents a hydrogen atom or a monovalent metal ion or ammonium. Monovalent metal ions include lithium ion, sodium ion, potassium ion and the like, among which M preferably represents a hydrogen atom, sodium ion or potassium ion, more preferably a hydrogen atom or sodium ion.

Preferably, the repeat unit represented by formula (2) is a repeat unit represented by formula (4) or a repeat unit represented by formula (5) below:

Formula (4)

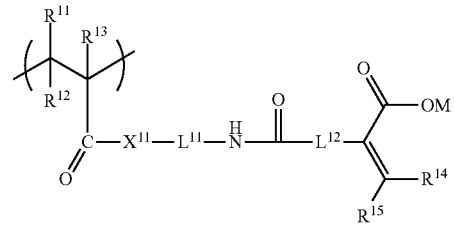

in formula (4), $R^{11}$, $R^{12}$ and $R^{13}$ each represent a hydrogen atom, halogen atom or methyl group, $X^{11}$ represents —O— or —N($R^{16}$)— wherein $R^{16}$ represents a hydrogen atom or an optionally substituted alkyl group, $L^{11}$ represents a divalent linking group, and $L^{12}$ represents a single bond or an optionally substituted divalent linking group; $R^{14}$ and $R^{15}$ each represent a hydrogen atom, halogen atom, carboxyl group, hydroxyl group, or an optionally substituted alkyl group or an optionally substituted aryl group, or any two or more of $L^{12}$, $R^{14}$ and $R^{15}$ may be joined together to form a ring; M represents a hydrogen atom or a monovalent metal ion or ammonium.

Preferably, the repeat unit represented by formula (4) contains one or more amide bonds, more preferably two amide bonds.

Preferably, $R^{11}$, $R^{12}$ and $R^{13}$ each represent a hydrogen atom or methyl.

Preferably, $X^{11}$ represents —N($R^{16}$)—. Preferably, $R^{16}$ represents a hydrogen atom.

$L^{11}$ has the same meaning as defined for $L^1$ in formula (2), and also covers similar preferred ranges.

$L^{12}$ has the same meaning as defined for $L^2$ in formula (2), and also covers similar preferred ranges.

$R^{14}$ and $R^{15}$ have the same meaning as defined for $R^4$ in formula (2), and also cover similar preferred ranges.

Alternatively, any two or more of $L^{12}$, $R^{14}$ and $R^{15}$ may be joined together to form a ring. Two of the groups may be joined together to form a ring, or three or more of the groups may be joined together to form a fused ring system. Further, two rings may be formed each from two of the groups joined together. Preferably, two of the groups are joined together to form a ring.

M represents a hydrogen atom or a monovalent metal ion or ammonium. Monovalent metal ions include lithium ion, sodium ion, potassium ion and the like, among which M preferably represents a hydrogen atom, sodium ion or potassium ion, more preferably a hydrogen atom or sodium ion.

Formula (5)

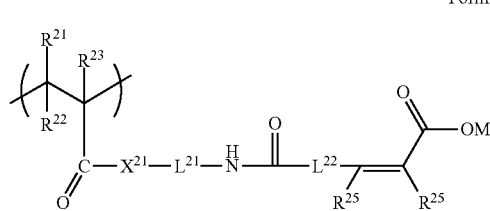

in formula (5), $R^{21}$, $R^{22}$ and $R^{23}$ each represent a hydrogen atom, halogen atom or methyl group, $X^{21}$ represents —O— or —N($R^{26}$)— wherein $R^{26}$ represents a hydrogen atom or an optionally substituted alkyl group, $L^{21}$ represents a divalent linking group, and $L^{22}$ represents a single bond or an optionally substituted divalent linking group; $R^{24}$ and $R^{25}$ each represent a hydrogen atom, halogen atom, carboxyl group, hydroxyl group, or an optionally substituted alkyl group or an optionally substituted aryl group, or any two or more of $L^{22}$, $R^{24}$ and $R^{25}$ may be joined together to form a ring; M represents a hydrogen atom or a monovalent metal ion or ammonium.

Preferably, the repeat unit represented by formula (5) contains one or more amide bonds, more preferably two amide bonds.

Preferably, $R^{21}$, $R^{22}$ and $R^{23}$ each represent a hydrogen atom or methyl.

Preferably, $X^{21}$ represents —N($R^{26}$)—. Preferably, $R^{26}$ represents a hydrogen atom.

$L^{21}$ has the same meaning as defined for $L^1$ in formula (2), and also covers similar preferred ranges.

$L^{22}$ has the same meaning as defined for $L^2$ in formula (2), and also covers similar preferred ranges.

$R^{24}$ and $R^{25}$ each have the same meaning as defined for $R^4$ in formula (2), and also cover similar preferred ranges. Alternatively, any two or more of $L^{22}$, $R^{24}$ and $R^{25}$ may be joined together to form a ring. Two of the groups may be joined together to form a ring, or three or more of the groups may be joined together to form a fused ring system. Further, two rings may be formed each from two of the groups joined together. Preferably, two of the groups are joined together to form a ring.

M represents a hydrogen atom or a monovalent metal ion or ammonium. Monovalent metal ions include lithium ion, sodium ion, potassium ion and the like, among which M preferably represents a hydrogen atom, sodium ion or potassium ion, more preferably a hydrogen atom or sodium ion.

Preferably, the polymer used in the present invention contains (a2) a repeat unit having a structure interacting with the substrate surface in a side chain and/or (a3) a repeat unit having a hydrophilic group in a side chain.

(a2) Repeat unit having a structure interacting with the substrate surface in a side chain Preferably, the polymer (A) used in the present invention contains a repeat unit having a structure interacting with the substrate surface in a side chain, more preferably a repeat unit having any one or more of structures represented by formulae (a2-1) to (a2-6) below in a side chain to improve adhesion to the substrate.

Preferably, it contains (a2) a repeat unit having any one of structures interacting with the substrate surface represented by formulae (a2-1), (a2-2), (a2-3), (a2-4), (a2-5) and (a2-6) below in a side chain.

(a2-1)

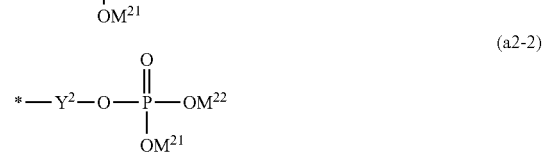

(a2-2)

(a2-3)

(a2-4)

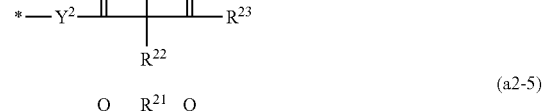

(a2-5)

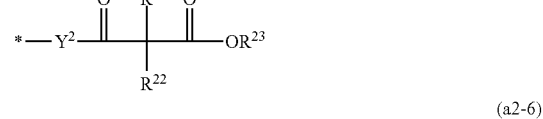

(a2-6)

in formulae (a2-1), (a2-2), (a2-3), (a2-4), (a2-5) and (a2-6), $M^{21}$ and $M^{22}$ each represent a hydrogen atom, a metal atom categorized into an alkali metal or an alkaline earth metal, or ammonium; $R^{21}$ to $R^{23}$ each independently represent a hydrogen atom or alkyl group; $Y^2$ represents a single bond or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

Alkyls represented by $R^{21}$ to $R^{23}$ include methyl group, ethyl group, propyl group, octyl group, isopropyl group, tert-butyl group, isopentyl group, 2-ethylhexyl group, 2-methylhexyl group, cyclopentyl group and the like. Preferably, $R^{21}$ to $R^{23}$ represent a hydrogen atom or methyl group.

$Y^2$ represents a single bond or a divalent linking group selected from the group consisting of —CO—, —O—, —NH—, a divalent aliphatic group, a divalent aromatic group and a combination thereof.

Specific examples of $Y^2$ consisting of the combination described above are shown below. In the examples below, each group is attached to the main chain at the left end.

-$L^1$-: —CO—O-a divalent aliphatic group-

-$L^2$-: —CO—O-a divalent aromatic group-

-$L^3$-: —CO—NH-a divalent aliphatic group-

-$L^4$-: —CO—NH-a divalent aromatic group-.

The divalent aliphatic group here refers to alkylene group, substituted alkylene group, alkenylene group, substituted alkenylene group, alkynylene group, substituted alkynylene group or polyalkyleneoxy group. Especially preferred are alkylene group, substituted alkylene group, alkenylene group, and substituted alkenylene group, more preferably alkylene group and substituted alkylene group.

The divalent aliphatic group preferably has a chain structure rather than a ring structure, more preferably a straight-chain structure rather than a branched chain structure. The divalent aliphatic group preferably contains 1 to 20 carbon atoms, more preferably 1 to 15 carbon atoms, even more preferably 1 to 12 carbon atoms, still more preferably 1 to 10 carbon atoms, especially preferably 1 to 8 carbon atoms, most preferably 1 to 4 carbon atoms. Examples of substituents on the divalent aliphatic group include halogen atoms (F, Cl, Br, I), hydroxyl group, carboxyl group, amino group, cyano group, aryl group, alkoxy group, aryloxy group, acyl group, acyloxy group, monoalkylamino group, dialkylamino group, arylamino group and diarylamino group and the like.

Examples of divalent aromatic groups include phenylene group, substituted phenylene group, naphthalene group and substituted naphthalene group, preferably phenylene group.

Examples of substituents on the divalent aromatic group include the examples of substituents on the divalent aliphatic group listed above, as well as alkyl group.

Preferably, $Y^2$ represents a single bond, a divalent aromatic group, -$L^1$-, -$L^2$-, -$L^3$- and -$L^4$-, most preferably a single bond, -$L^1$- and -$L^2$-.

To improve staining resistance and printing durability, the structure interacting with the substrate surface is preferably (a2-1), (a2-2) or (a2-6), more preferably (a2-1) or (a2-2).

Preferably, $M^{21}$ and $M^{22}$ represent a hydrogen atom. Specifically, the following structures are included. However, it should be understood that the present invention is not limited to these examples.

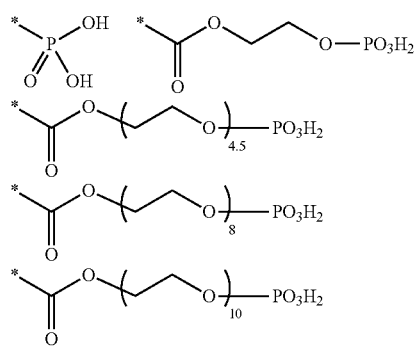

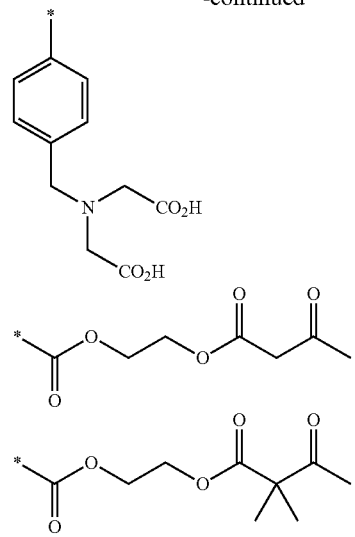

Preferably, the repeat unit (a2) having a structure interacting with the substrate surface in a side chain is a repeat unit represented by formula (A2) below.

Formula (A2)

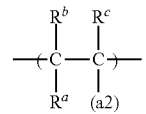

In formula (A2), $R^a$ to $R^c$ each represent a hydrogen atom, C1-6 alkyl or halogen atom.

(a2) represents a structure represented by formulae (a2-1) to (a2-6), and is attached to a carbon atom at the point indicated by the asterisk (*) in formulae (a2-1) to (a2-6).

In the polymer (A) used in the present invention, the proportion of the repeat unit (a2) having a structure represented by formulae (a2-1) to (a2-6) is preferably in the range of 1 to 99 mol %, more preferably in the range of 1 to 90 mol %, even more preferably in the range of 1 to 80 mol % based on the total repeat units to improve staining resistance and developability.

(a3) Repeat unit having a hydrophilic group in a side chain

The polymer (A) used in the present invention may contain (a3) a repeat unit having at least one hydrophilic group in a side chain to confer high hydrophilicity on the substrate surface of non-image areas. The hydrophilic group is selected from those capable of readily forming a hydrogen bond/van der Waals bond/ionic bond with a water molecule, specifically including hydroxyl, carboxyl, amino, sulfo, positively or negatively charged groups, zwitterionic groups and metal salts thereof and the like. These hydrophilic groups may also be used as the repeat unit (a2) having a structure interacting with the substrate surface in a side chain.

Preferably, the polymer used in the present invention contains a repeat unit especially having a zwitterionic structure as a hydrophilic group to confer high hydrophilicity on the substrate surface of non-image areas. Especially, the side chain having a zwitterionic structure is preferably represented by formula (a3-1) or (a3-2) below:

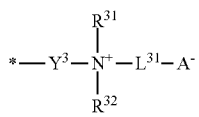 (a3-1)

in formula (a3-1), $R^{31}$ and $R^{32}$ each independently represent a hydrogen atom, alkyl group, alkenyl group, alkynyl group, aryl group, or heterocyclyl group, or $R^{32}$ and $R^{32}$ may be joined together to form a ring structure, $L^{31}$ represents a linking group, and $A^-$ represents an anion-containing structure. $Y^3$ represents a divalent linking group attached to the main chain of the polymer compound; the asterisk (*) indicates the point of attachment to the main chain of the polymer compound.

The ring structure formed by $R^{31}$ and $R^{32}$ joined together is preferably a 5- to 10-membered ring, more preferably a 5- or 6-membered ring optionally containing a heteroatom such as an oxygen atom or the like.

Preferably, $R^{31}$ and $R^{32}$ contain 1 to 30 carbon atoms, more preferably 1 to 20 carbon atoms, even more preferably 1 to 15 carbon atoms, still more preferably 1 to 8 carbon atoms, especially preferably 1 to 4 carbon atoms including carbon atoms of the optionally present substituents described below.

Examples of alkyls represented by $R^{31}$ and $R^{32}$ include methyl group, ethyl group, propyl group, octyl group, isopropyl group, tert-butyl group, isopentyl group, 2-ethylhexyl group, 2-methylhexyl group, cyclopentyl group and the like.

Examples of alkenyls represented by $R^{31}$ and $R^{32}$ include vinyl group, allyl group, prenyl group, geranyl group, oleyl group and the like.

Examples of alkynyls represented by $R^{31}$ and $R^{32}$ include ethynyl group, propargyl group, trimethylsilylethynyl group and the like.

Examples of aryls represented by $R^{31}$ and $R^{32}$ include phenyl group, 1-naphthyl group, 2-naphthyl group and the like. Further, heterocyclyls include furanyl group, thiophenyl group, pyridinyl group and the like.

These groups may be further substituted. Examples of substituents include halogen atoms (F, Cl, Br, I), hydroxyl group, carboxyl group, amino group, cyano group, aryl group, alkoxy group, aryloxy group, acyl group, alkoxycarbonyl group, aryloxycarbonyl group, acyloxy group, monoalkylamino group, dialkylamino group, monoarylamino group and diarylamino group and the like.

Especially preferred examples of each of $R^{31}$ and $R^{32}$ include a hydrogen atom, methyl group, or ethyl group because of the resulting effect and availability.

Preferably, the divalent linking group represented by $Y^3$ attached to the main chain of the polymer compound is a single bond or a divalent linking group selected from the group consisting of —CO—, —O—, —NH—, a divalent aliphatic group, a divalent aromatic group and a combination thereof.

Specific examples of $Y^3$ consisting of the combination described above are shown below. In the examples below, each group is attached to the main chain at the left end.
-$L^1$-: —CO—O-a divalent aliphatic group-
-$L^2$-: —CO—O-divalent aromatic group-
-$L^3$-: —CO—NH-a divalent aliphatic group-
-$L^4$-: —CO—NH-divalent aromatic group-.

The divalent aliphatic group here refers to alkylene, substituted alkylene, alkenylene, substituted alkenylene, alkynylene, substituted alkynylene or polyalkyleneoxy. Especially preferred are alkylene, substituted alkylene, alkenylene, and substituted alkenylene, more preferably alkylene and substituted alkylene, even more preferably unsubstituted alkylene.

The divalent aliphatic group preferably has a chain structure rather than a ring structure, more preferably a straight-chain structure rather than a branched chain structure. The divalent aliphatic group preferably contains 1 to 20 carbon atoms, more preferably 1 to 15 carbon atoms, even more preferably 1 to 12 carbon atoms, still more preferably 1 to 10 carbon atoms, especially preferably 1 to 8 carbon atoms, most preferably 1 to 4 carbon atoms. Examples of substituents on the divalent aliphatic group include halogen atoms (F, Cl, Br, I), hydroxyl group, carboxyl group, amino group, cyano group, aryl group, alkoxy group, aryloxy group, acyl group, acyloxy group, monoalkylamino group, dialkylamino group, arylamino group and diarylamino group and the like.

Examples of divalent aromatic groups include phenylene group, substituted phenylene group, naphthalene group and substituted naphthalene group, preferably phenylene group. Examples of substituents on the divalent aromatic group include the examples of substituents on the divalent aliphatic group listed above, as well as alkyl group.

More preferably, $Y^3$ represents a single bond, —CO—, a divalent aliphatic group, a divalent aromatic group, or -$L^1$- to -$L^4$-. To improve staining resistance, $Y^3$ preferably represents -$L^1$- or -$L^3$-, more preferably -$L^3$-. Further, the divalent aliphatic group in -$L^3$- is preferably a straight-chain alkylene containing 2 to 4 carbon atoms, most preferably a straight-chain alkylene containing 3 carbon atoms for convenience of synthesis.

$L^{31}$ represents a linking group, preferably a linking group selected from the group consisting of —CO—, —O—, —NH—, a divalent aliphatic group, a divalent aromatic group and a combination thereof; and preferably contains 30 or less carbon atoms including carbon atoms of the optionally present substituents described below. Specific examples of substituents include alkylenes (preferably alkylenes containing 1 to 20 carbon atoms, more preferably alkylenes containing 1 to 10 carbon atoms, even more preferably alkylenes containing 2 to 6 carbon atoms), and arylenes (preferably arylenes containing 5 to 15 carbon atoms, more preferably arylenes containing 6 to 10 carbon atoms) such as phenylene, xylylene and the like. Preferably, $L^{31}$ represents a straight-chain alkylene containing 3 to 5 carbon atoms, more preferably a straight-chain alkylene containing 4 or 5 carbon atoms, even more preferably a straight-chain alkylene containing 4 carbon atoms to improve staining resistance.

Specific examples of $L^{31}$ include, for example, the following linking groups:

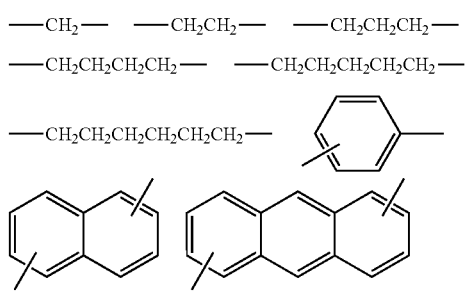

These linking groups may be further substituted. Examples of substituents include halogen atoms (F, Cl, Br, I), hydroxyl group, carboxyl group, amino group, cyano group, aryl group, alkoxy group, aryloxy group, acyl group, alkoxycarbonyl group, aryloxycarbonyl group, acyloxy group, monoalkylamino group, dialkylamino group, monoarylamino group and diarylamino group and the like.

In formula (a3-1) above, $A^-$ preferably represents carboxylate, sulfonate, phosphonate, or phosphinate. Specifically, the following anions are included.

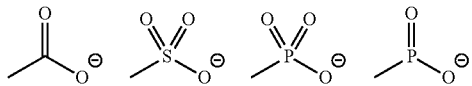

To improve staining resistance, $A^-$ is most preferably sulfonate. Further, in a preferred combination of $L^{31}$ and $A^-$ in formula (a3-1), $L^{31}$ is a straight-chain alkylene containing 4 or 5 carbon atoms and $A^-$ is sulfonate, most preferably $L^{31}$ is a straight-chain alkylene containing 4 carbon atoms and $A^-$ is sulfonate.

In a preferred combination, $Y^3$ is $-L^1$- or $-L^3$-, $R^{31}$ and $R^{32}$ are each ethyl or methyl, $L^{31}$ is a straight-chain alkylene containing 4 or 5 carbon atoms, and $A^-$ is sulfonate. In a more preferred combination, $Y^3$ is $-L^3$-, $R^{31}$ and $R^{32}$ are each methyl, $L^{31}$ is a straight-chain alkylene containing 4 carbon atoms, and $A^-$ is sulfonate.

Specifically, the following structural formulae are preferred.

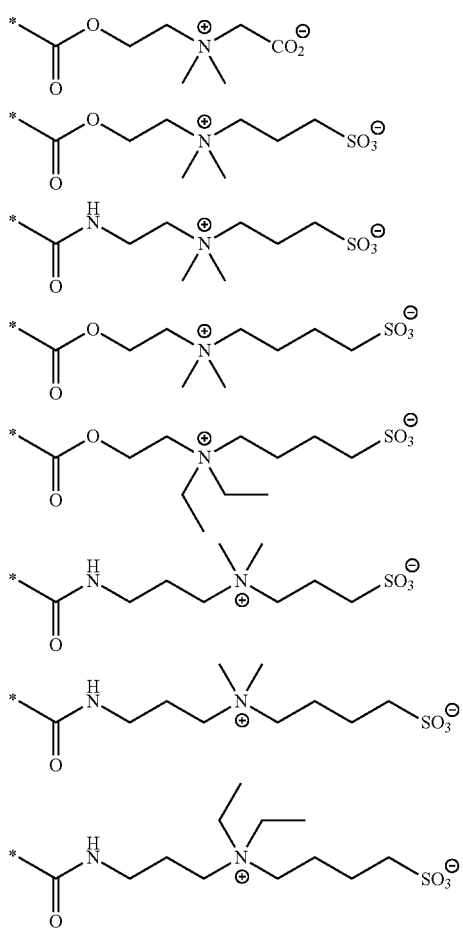

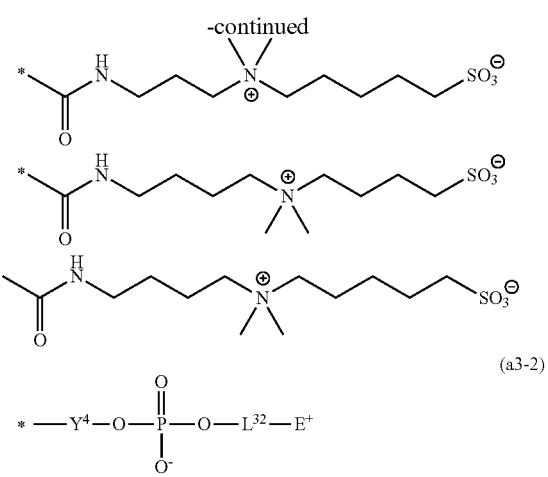

(a3-2)

$$* \text{---} Y^4 \text{---} O \text{---} \underset{\underset{O^-}{\|}}{\overset{\overset{O}{\|}}{P}} \text{---} O \text{---} L^{32} \text{---} E^+$$

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

In formula (a3-2) above, $L^{32}$ represents a linking group preferably selected from the group consisting of —CO—, —O—, —NH—, a divalent aliphatic group, a divalent aromatic group and a combination thereof.

$L^{32}$ represents a linking group, preferably a linking group selected from the group consisting of —CO—, —O—, —NH—, a divalent aliphatic group, a divalent aromatic group and a combination thereof. Further, $L^{32}$ preferably contains 30 or less carbon atoms including carbon atoms of the optionally present substituents described below. Specific examples of substituents include alkylenes (preferably alkylenes containing 1 to 20 carbon atoms, more preferably alkylenes containing 1 to 10 carbon atoms, even more preferably alkylenes containing 2 to 6 carbon atoms), and arylenes (preferably arylenes containing 5 to 15 carbon atoms, more preferably arylenes containing 6 to 10 carbon atoms) such as phenylene, xylylene and the like. Preferably, $L^{32}$ represents a straight-chain alkylene containing 1 to 5 carbon atoms, more preferably a straight-chain alkylene containing 1 to 3 carbon atoms to improve staining resistance.

Specific examples of $L^{32}$ include, for example, the following linking groups:

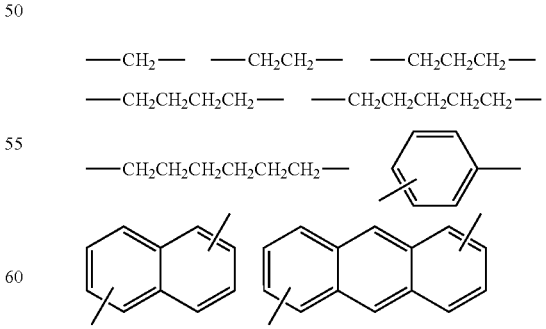

These linking groups may be further substituted. Examples of substituents include halogen atoms (F, Cl, Br, I), hydroxyl group, carboxyl group, amino group, cyano group, aryl group, alkoxy group, aryloxy group, acyl group, alkoxycarbonyl group, aryloxycarbonyl group, acyloxy group, monoalkylamino group, dialkylamino group, monoarylamino group and diarylamino group and the like.

$Y^4$ has the same meaning as defined for $Y^3$ in formula (a3-1) above, and also covers similar preferred ranges.

$E^+$ represents a cation-containing structure, preferably a structure containing ammonium, phosphonium, iodonium, or sulfonium, more preferably a structure containing ammonium or phosphonium, especially preferably a structure containing ammonium. Examples of cation-containing structures include trimethylammonio, triethylammonio, tributylammonio, benzyldimethylammonio, diethylhexylammonio, (2-hydroxyethyl)dimethylammonio, pyridinio, N-methylimidazolio, N-acridinio, trimethylphosphonio, triethylphosphonio, triphenylphosphonio and the like.

In a more preferred combination of $L^{32}$, $Y^4$ and $E^+$, $L^{32}$ is an alkylene containing 2 to 4 carbon atoms, $Y^4$ is $-L^1-$ or $-L^3-$, and $E^+$ is trimethylammonio or triethylammonio. Specifically, the following structures are included.

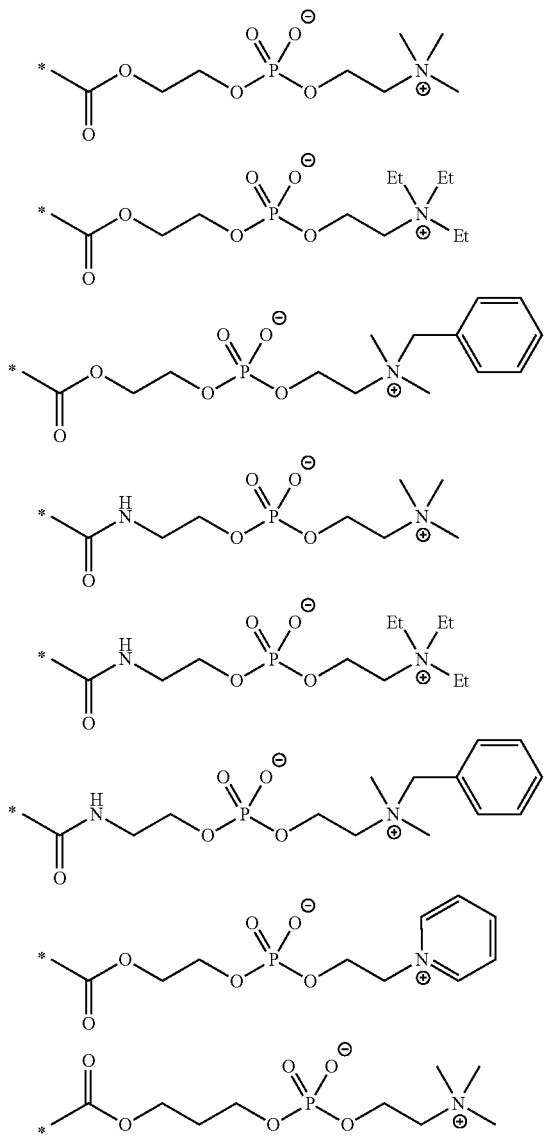

-continued

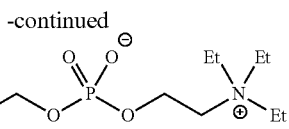

In the present invention, the repeat unit (a3) having a hydrophilic group in a side chain is preferably represented by formula (a3-3) below, specifically.

Formula (a3-3):

(a3-3)

In formula (a3-3), $R^a$ to $R^c$ each independently represent a hydrogen atom, C1-6 alkyl or halogen atom. W represents a divalent linking group having a hydrophilic group, or a structure represented by formula (a3-1) or formula (a3-2), and is attached to a carbon atom at the point indicated by the asterisk (*) in formula (a3-1) or formula (a3-2).

In the polymer used in the present invention, the proportion of the repeat unit (a3) having a structure represented by formula (a3-1) or formula (a3-2) is preferably in the range of 1 to 70 mol %, more preferably in the range of 1 to 50 mol %, even more preferably in the range of 1 to 30 mol % based on the total repeat units to improve staining resistance and developability.

Further, the polymer (A) may be a copolymer having an additional repeat unit other than the repeat units described above. Monomers that can be copolymerized with the polymer include, for example, monomers selected from acrylic acid esters, methacrylic acid esters, N,N-disubstituted acrylamides, N,N-disubstituted methacrylamides, styrenes, acrylonitriles, methacrylonitriles and the like. These additional repeat units are preferably contained at 20 mol % or less of the polymer (A).

Specific examples include, for example, acrylic acid esters such as alkyl acrylates (wherein the alkyl group preferably contains 1 to 20 carbon atoms) (specifically, e.g., methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate and the like), and aryl acrylates (e.g., phenyl acrylate and the like); methacrylic acid esters such as alkyl methacrylates (wherein the alkyl group preferably contains 1 to 20 carbon atoms) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate and the like), and aryl methacrylates (e.g., phenyl methacrylate, cresyl methacrylate, nephthyl methacrylate and the like); styrenes such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene and the like), alkoxystyrenes (e.g., methoxystyrene, 4-methoxy-3-methylstyrene, dimethoxystyrene and the like), and halogenated styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene and the like); acrylonitrile, methacrylonitrile, methacrylic acid, acrylic acid, 2-acrylamide-2-methylpropanesulfonic acid and the like.

Preferably, the polymer (A) in the present invention contains an additional repeat unit especially having an alkyl ether chain (preferably represented by —(CH$_2$)$_n$—O— wherein n is an integer of 1 to 4) repeated 2 to 150 times, preferably 9 to 150 times to improve staining resistance, more preferably 9 to 100 times, even more preferably 20 to 100 times, especially preferably 50 to 100 times in a side chain. More preferably, the repeat unit has a structure represented by the formula below:

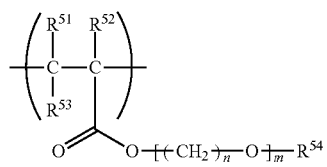

wherein $R^{51}$ to $R^{53}$ each represent a hydrogen atom, C1-6 alkyl or halogen atom, preferably a hydrogen atom or methyl. $R^{54}$ represents a hydrogen atom or C1-6 alkyl, more preferably a hydrogen atom, methyl or ethyl. n represents an integer of 1 to 4, preferably an integer of 2 or 3. m represents an integer of 2 to 150, preferably 9 to 150 to improve staining resistance, more preferably 9 to 100, even more preferably 20 to 100, especially preferably 50 to 100. When the polymer (A) containing such a repeat unit is used in a primer layer in an on-press developable lithographic printing plate precursor, good on-press developability can be achieved. Preferably, the repeat unit having an alkyl ether chain in a side chain is contained in the range of 0 to 20 mol % of the polymer (A).

The mass average molar mass (Mw) of the polymer (A) in the present invention can be appropriately selected depending on the performance design of the lithographic printing plate precursor. To improve printing durability and staining resistance, the mass average molar mass is preferably 2,000 to 1,000,000, more preferably 2,000 to 500,000, most preferably 8,000 to 300,000.

Specific examples of the polymer (A) used in the present invention are shown below, but it should be understood that the present invention is not limited to these examples. Each repeat unit is expressed in terms of mole fraction.

(P-1)

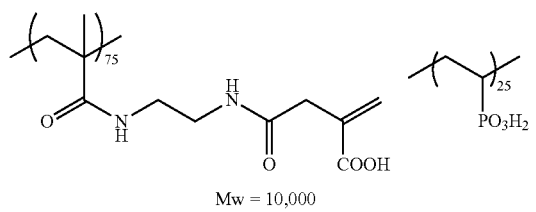

Mw = 10,000

(P-2)

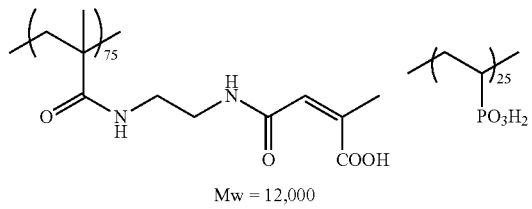

Mw = 12,000

(P-3)

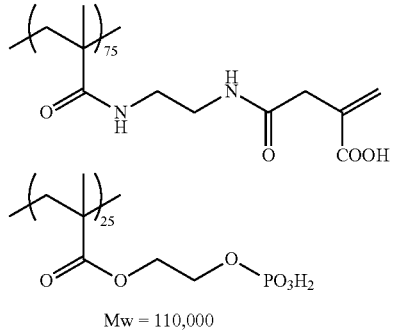

Mw = 110,000

(P-4)

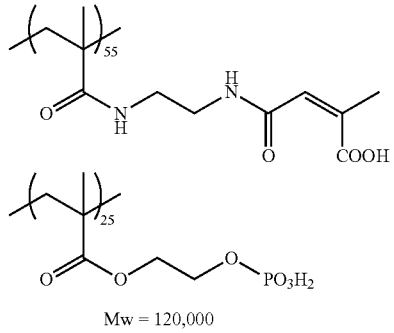

Mw = 120,000

(P-5)

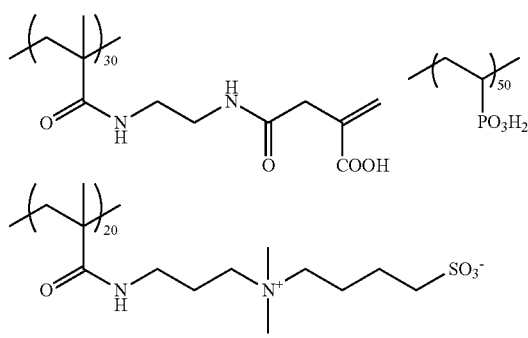

Mw = 12,000

(P-6)

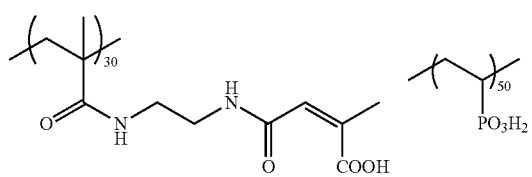

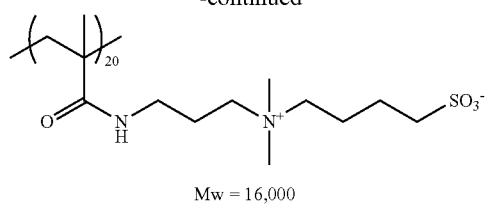
Mw = 16,000
(P-7)
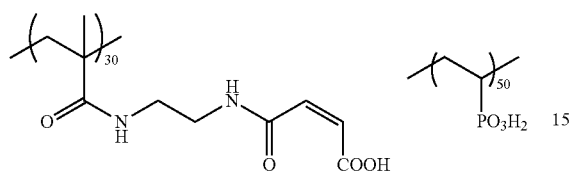
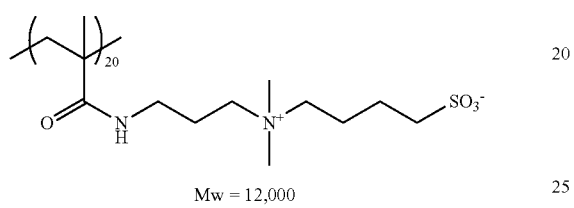
Mw = 12,000
(P-8)
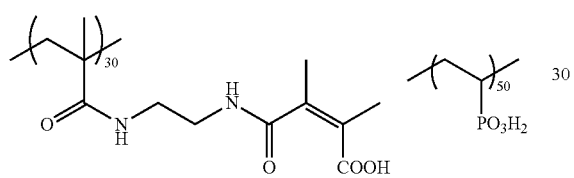
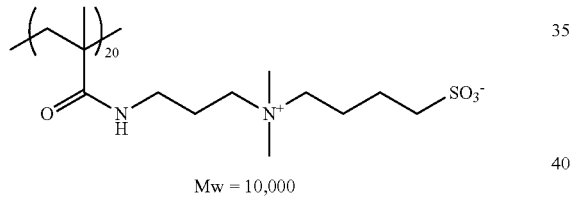
Mw = 10,000
(P-9)
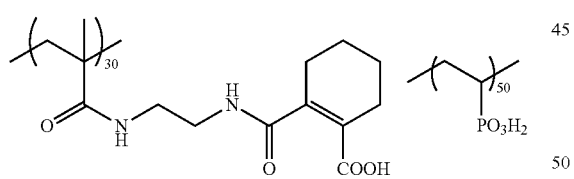
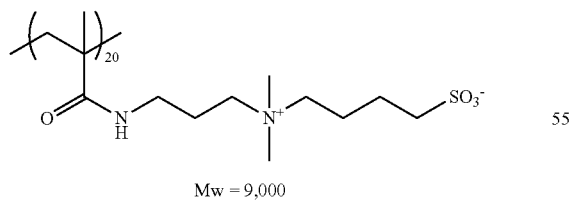
Mw = 9,000
(P-10)
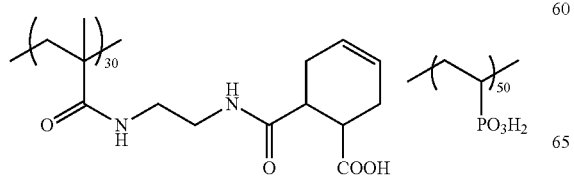
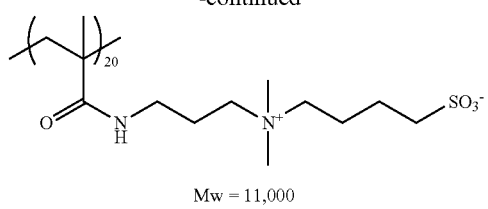
Mw = 11,000
(P-11)
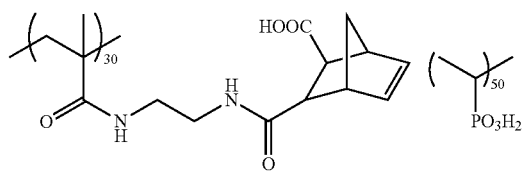
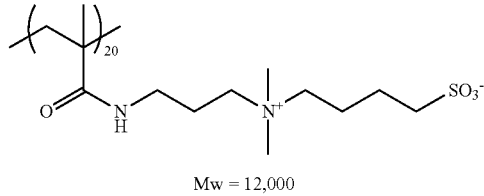
Mw = 12,000
(P-12)
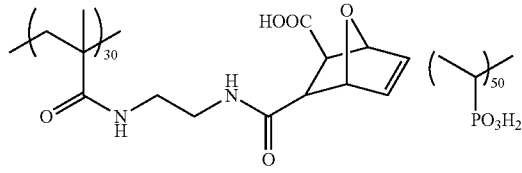
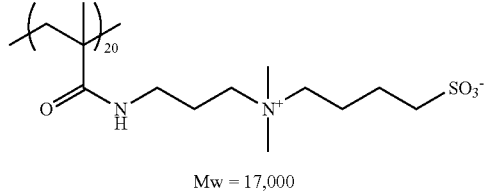
Mw = 17,000
(P-13)
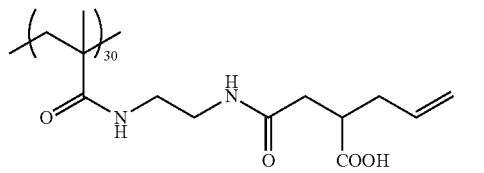
Mw = 13,000
(P-14)
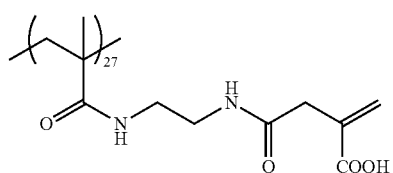

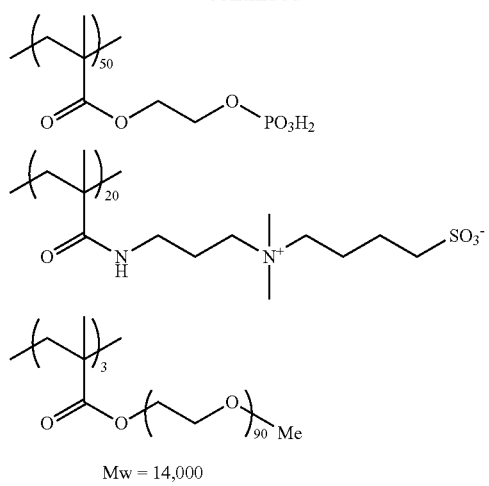
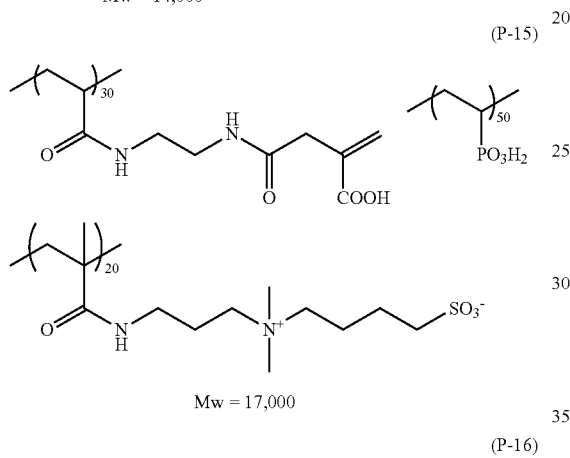
(P-15)
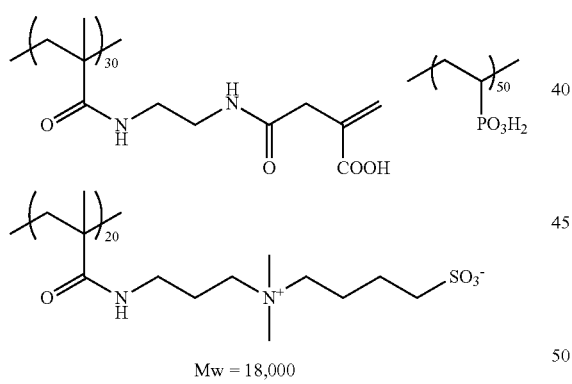
(P-16)
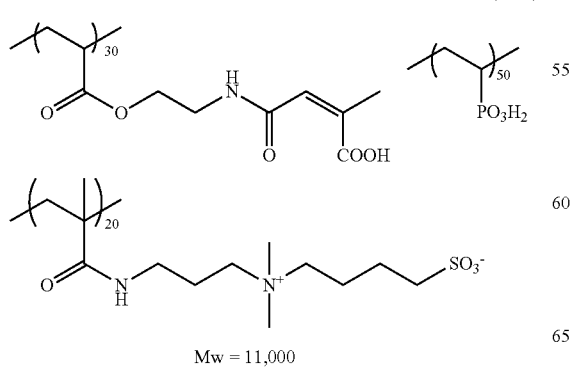
(P-17)
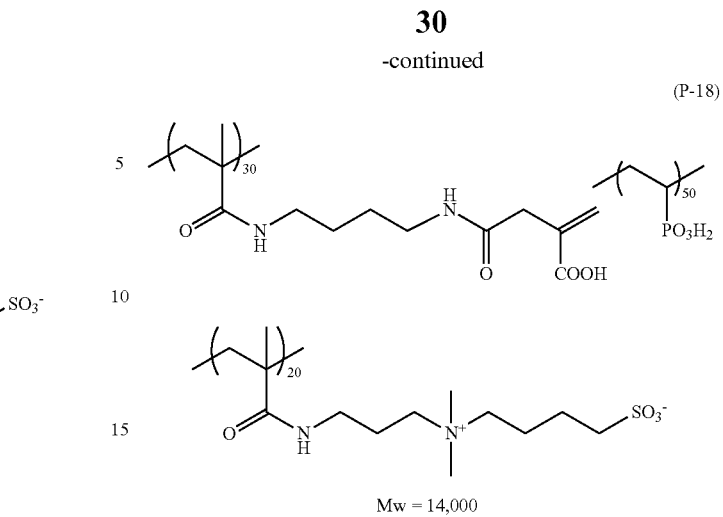
(P-18)
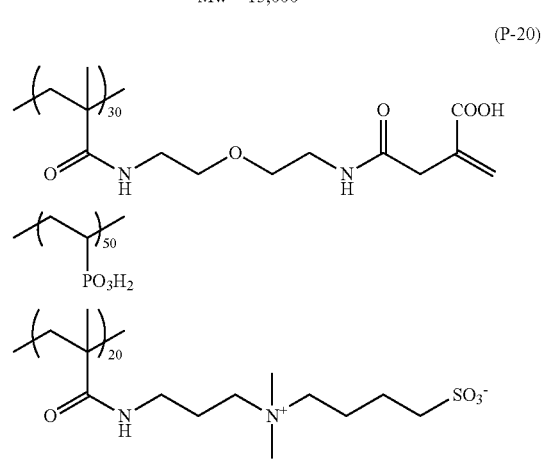
(P-19)
(P-20)
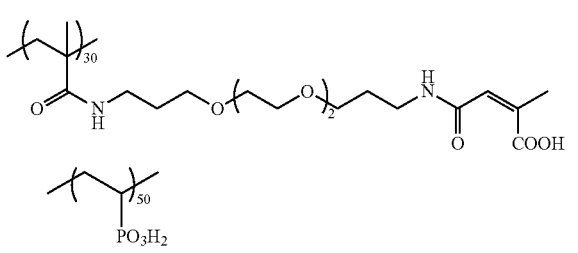
(P-21)

-continued
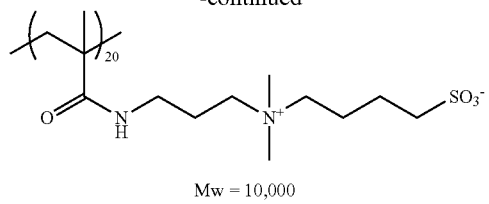
Mw = 10,000
(P-22)
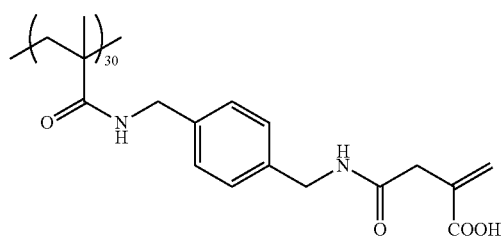
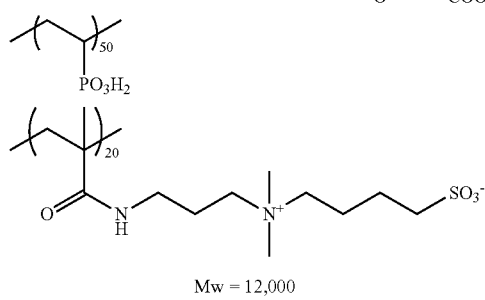
Mw = 12,000
(P-23)
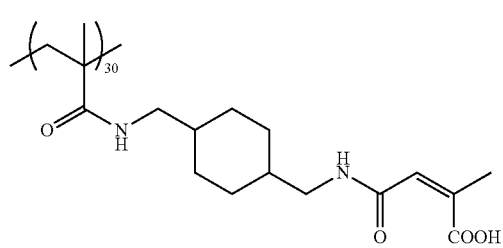
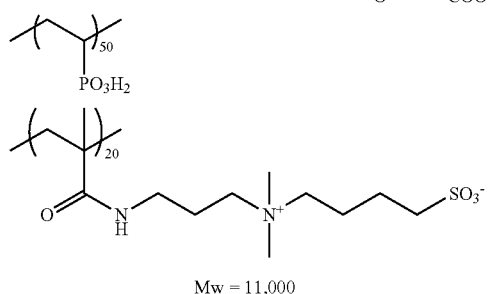
Mw = 11,000
(P-24)
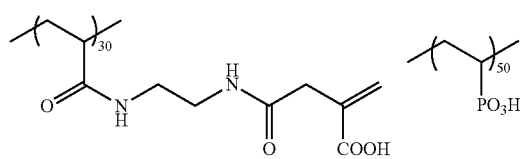
Mw = 9,000
-continued
(P-25)
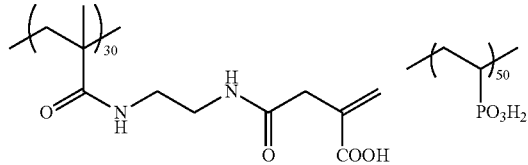
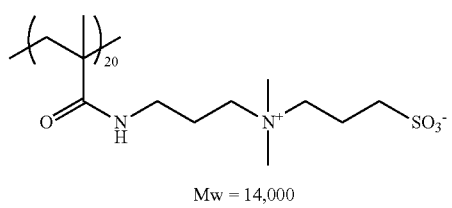
Mw = 14,000
(P-26)
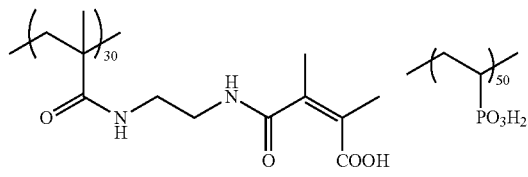
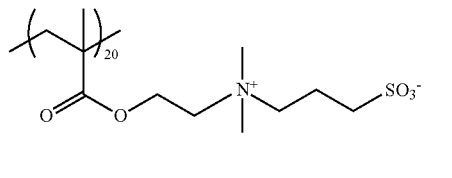
Mw = 15,000
(P-27)
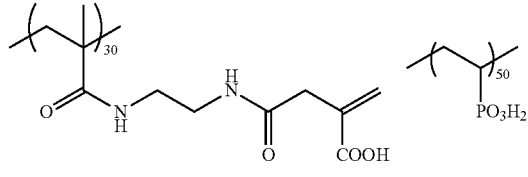
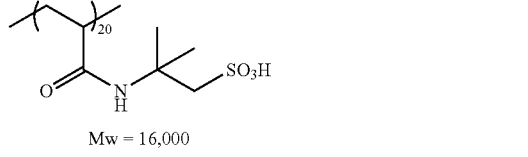
Mw = 16,000
(P-28)
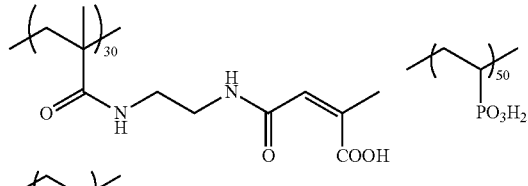
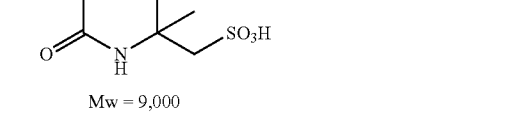
Mw = 9,000

(P-29)
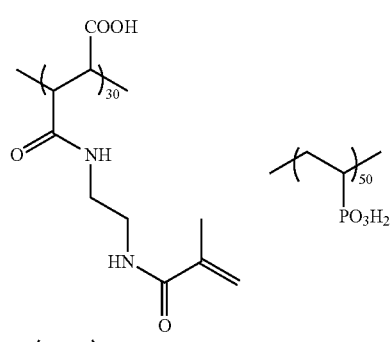
Mw = 30,000
(P-30)
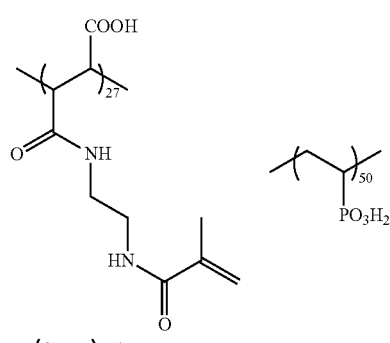
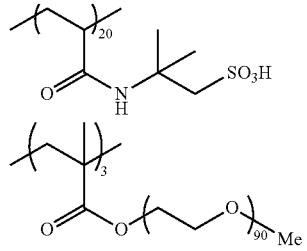
Mw= 42,000
(P-31)
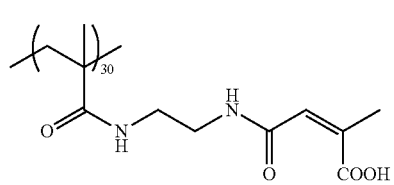
Mw = 12,000
(P-32)
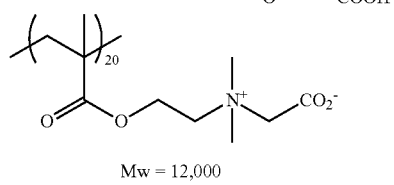
(P-29 cont.)
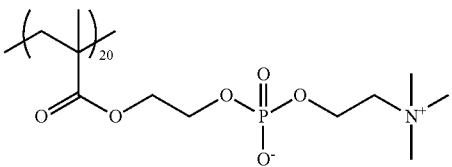
Mw = 16,000
(P-33)
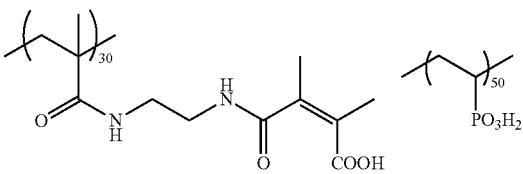
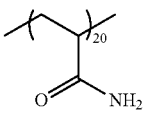
Mw = 15,000
(P-34)
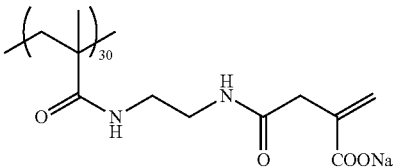
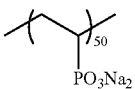
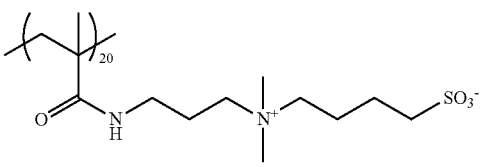
Mw = 18,000
(P-35)
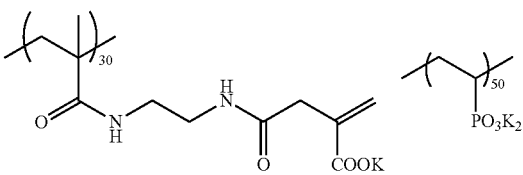
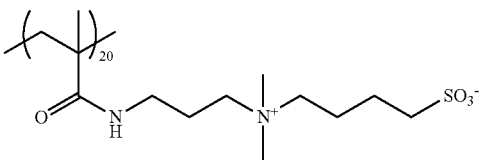
Mw = 19,000
(P-36)
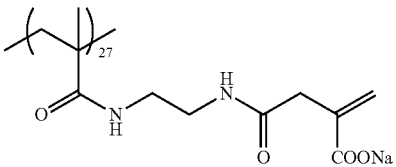

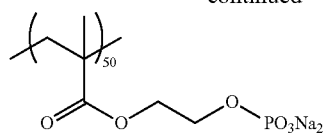
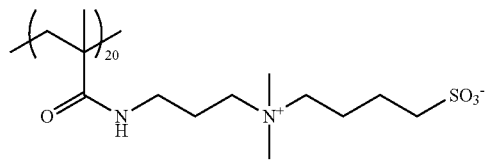
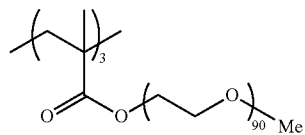
Mw = 16,000
(P-37)
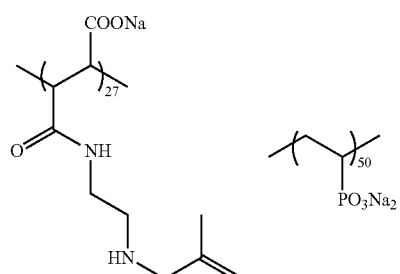
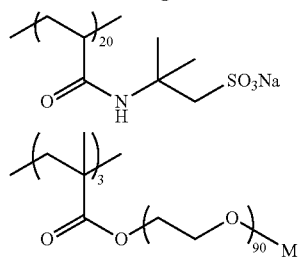
Mw = 40,000
(P-38)
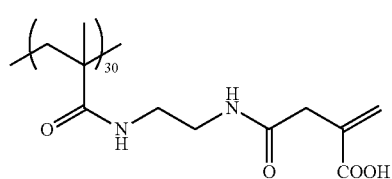
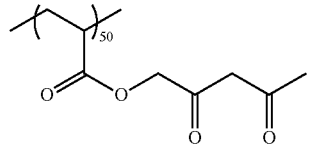
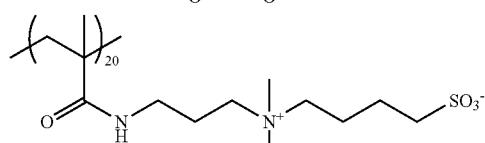
Mw = 80,000
(P-39)
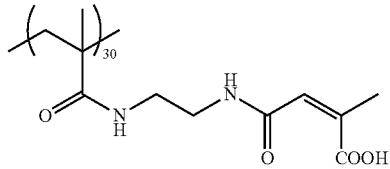
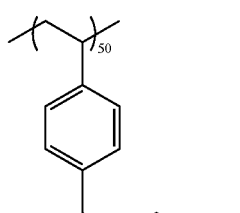
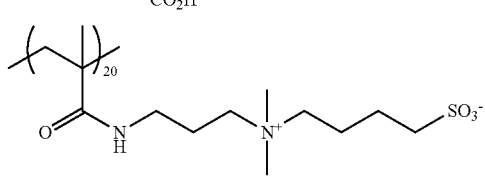
Mw = 120,000
(P-40)
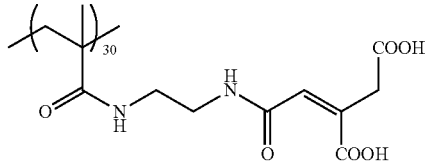
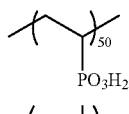
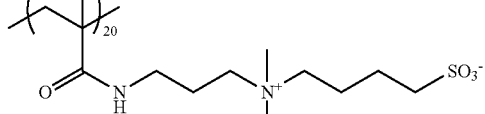
Mw = 10,000
(P-41)
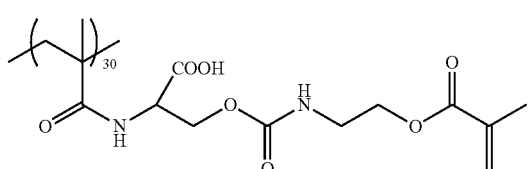
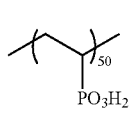
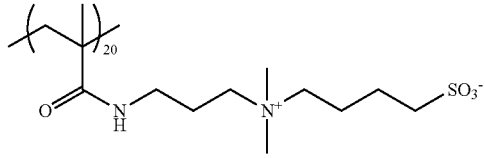
Mw = 150,000

(P-42)

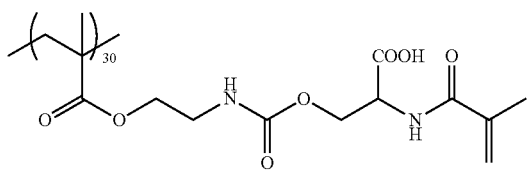

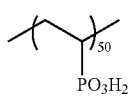

Mw = 140,000

(P-43)

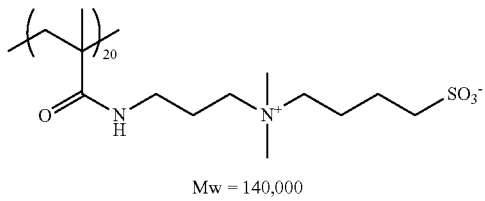

Mw = 80,000

(P-44)

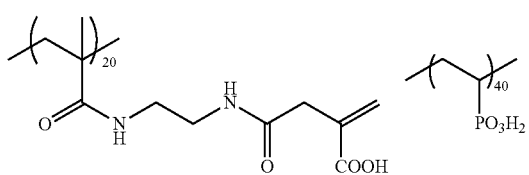

Mw = 6,000

(P-45)

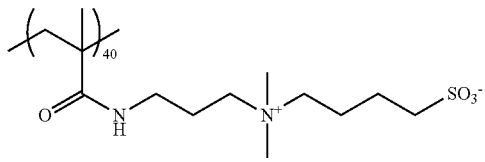

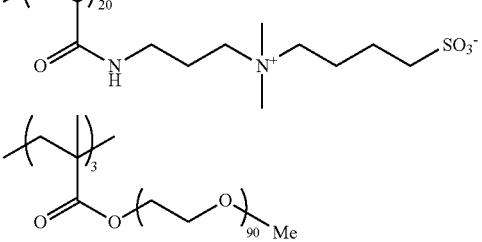

Mw = 330,000

<Processes for Preparing the Polymer (A)>

The polymer (A) can be synthesized by known methods, but preferably by using radical polymerization followed by ureation reaction between the amino group in a polymer side chain and an isocyanate having a radically polymerizable reactive group.

Typical techniques for radical polymerization are described in, for example, "New Polymer Experimental Chemistry, vol. 3" (Edited by the Society of Polymer Science, Japan, published by KYORITSU SHUPPAN CO., LTD., Mar. 28, 1996); "Synthesis and Reaction of Polymers, vol. 1" (Edited by the Society of Polymer Science, Japan, published by KYORITSU SHUPPAN CO., LTD., May 1992); "New Textbook of Experimental Chemistry, vol. 19, Polymer Chemistry (I) (Edited by the Chemical Society of Japan, published by Maruzen Company, Limited, Nov. 20, 1980); "Textbook of Material Engineering, Polymer Synthetic Chemistry" (published by Tokyo Denki University Press, September 1995) and the like, and these techniques can be applied.

Preferred embodiments of the lithographic printing plate precursors of the present invention are explained in detail below.

The lithographic printing plate precursors of the present invention comprise a primer layer and an image-recording layer in this order on a substrate. Further, the lithographic printing plate precursors of the present invention may optionally comprise an extra layer between the substrate and the image-recording layer.

Further, the lithographic printing plate precursors of the present invention preferably comprise a protective layer on the surface of the image-recording layer opposite to the substrate.

Further, the lithographic printing plate precursors of the present invention may comprise a back coating layer on the bottom of the substrate as appropriate.

Preferably, the lithographic printing plate precursors of the present invention can be applied to directly make plates using various lasers under the control of digital signals from computers and the like, i.e., they can be applied to so-called computer-to-plate systems. Preferably, they can also be developed in aqueous solutions at pH 2 to 14, more preferably pH 3.5 to 13, even more preferably pH 6 to 13, especially preferably pH 6.5 to 10.5 or on a printing press.

The individual layers constituting the lithographic printing plate precursors of the present invention are explained in order below, and processes for forming the lithographic printing plate precursors of the present invention are also explained.

<Primer Layer>

When the lithographic printing plate precursor of the present invention has a primer layer, the primer layer preferably contains the copolymer (A). In this case, the content of the copolymer (A) is as described for the content of the copolymer (A) in the photosensitive layer. The primer layer may further contain additional compounds other than the copolymer (A), and such additional compounds preferably include the silane coupling agents containing an addition-polymerizable ethylenic double bond-reactive group described in JP-A-H10-282679, the phosphorus compounds containing an ethylenic double bond-reactive group described in JP-A-H2-304441 and the like. Especially preferred compounds are compounds having a polymerizable group such as methacryl, allyl and the like and a substrate-adsorbing group such as sulfonic acid, phosphoric acid, phosphoric acid ester and the like. Other preferred compounds include compounds containing a hydrophilicity-conferring group such as ethylene oxide and the like in addition to the polymerizable group and substrate-adsorbing group.

The primer layer can be provided by applying a solution of the compound dissolved in water or an organic solvent such as methanol, ethanol, methyl ethyl ketone or the like or a mixed solvent thereof on the substrate and drying it, or immersing the substrate in a solution of the compound dissolved in water or an organic solvent such as methanol, ethanol, methyl ethyl ketone or the like or a mixed solvent thereof to allow the compound to be adsorbed, and then washing it with water or the like and drying it. In the former method, a solution of the compound at a concentration of 0.005 to 10% by mass can be applied by various techniques. Any technique can be used, such as bar coating, spin coating, spray coating, curtain coating and the like, for example. In the latter method, the concentration of the solution is 0.01 to 20% by mass, preferably 0.05 to 5% by mass, the immersion temperature is 20 to 90° C., preferably 25 to 50° C., and the immersion time is 0.1 second to 20 minutes, preferably 2 seconds to 1 minute.

The coating mass of the primer layer (expressed as solids) is preferably 0.1 to 100 mg/m$^2$, more preferably 1 to 30 mg/m$^2$.

<Image-recording Layer>

The image-recording layer of the lithographic printing plate precursors of the present invention preferably comprises (B) a polymerization initiator, (C) a polymerizable compound, and (D) a binder, more preferably (B) a polymerization initiator, (C) a polymerizable compound, (D) a binder, and (E) a dye.

(B) Polymerization Initiator

The photosensitive layer of the present invention preferably contains a polymerization initiator (hereinafter also referred to as an "initiator compound"). In the present invention, a radical polymerization initiator is preferably used.

The initiator compound may be arbitrarily selected from compounds known among those skilled in the art without limitation. Specific examples include trihalomethyl compound, carbonyl compound, organic peroxide, azo compound, azide compound, metallocene compound, hexaarylbiimidazole compound, organic boron compound, disulfone compound, oxim ester compound, onium salt, and iron arene complex. In particular, the initiator compound is preferably at least one species selected from the group consisting of hexaarylbiimidazole compound, onium salt, trihalomethyl compound and metallocene compound, and is particularly hexaarylbiimidazole compound, or onium salt. Two or more species of them may be used in combination as the polymerization initiator.

The hexaarylbiimidazole compound is exemplified by lophine dimers described in European Patent Nos. 24,629 and No. 107,792, and U.S. Pat. No. 4,410,621, which are exemplified by 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(0-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenyl biimidazole. It is particularly preferable that the hexaarylbiimidazole compound is used in combination with a sensitizing dye which shows maximum absorption in the wavelength range from 300 to 450 nm.

The onium salt is exemplified by diazonium salts described in S. I. Schlesinger, Photogr. Sci. Eng., 18, 387 (1974), T. S. Bal et al., Polymer, 21, 423 (1980), and Japanese Laid-Open Patent Publication No. H05-158230; ammonium salts described for example in U.S. Pat. No. 4,069,055, and Japanese Laid-Open Patent Publication No. H04-365049; phosphonium salts described in U.S. Pat. Nos. 4,069,055 and 4,069,056; iodonium salts described in European Patent Nos. 104,143, United States Patent Publication No. 2008/0311520, Japanese Laid-Open Patent Publication Nos. H02-150848 and 2008-195018, and J. V. Crivello et al., Macromolecules, 10(6), 1307 (1977); sulfonium salts described in European Patent No. 370,693, ibid. No. 233,567, ibid. No. 297,443, ibid. No. 297,442, U.S. Pat. No. 4,933,377, ibid. No. 4,760,013, ibid. No. 4,734,444 and ibid. No. 2,833,827, and German Patent No. 2,904,626, ibid. No. 3,604,580 and ibid. No. 3,604,581; selenonium salts described in J. V. Crivello et al., J. Polymer Sci., Polymer Chem. Ed., 17, 1047 (1979); arsonium salts described in C. S. Wen et al., The Proc. Conf. Rad. Curing ASIA, p 478, Tokyo, October (1988); and azinium salts described in Japanese Laid-Open Patent Publication No. 2008-195018.

Among them, more preferable examples include iodonium salt, sulfonium salt and azinium salts. Specific examples of these compounds will be shown below, without limiting the present invention.

The iodonium salt is preferably diphenyliodonium salt, more preferably diphenyliodonium salt substituted by an electron donor group such as alkyl group or alkoxyl group, and still more preferably asymmetric diphenyliodonium salts. Specific examples include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate, and bis(4-t-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl)benzenesulfonate, and tris(4-chlorophenyl)sulfonium hexafluorophosphate.

Examples of the azinium salt include 1-cyclohexylmethyloxypyrydinium hexafluorophosphate, 1-cyclohexyloxy-4-phenylpyrydinium hexafluorophosphate, 1-ethoxy-4-phenylpyrydinium hexafluorophosphate, 1-(2-ethylhexyloxy)-4-phenylpyrydinium hexafluorophosphate, 4-chloro-1-cyclohexylmethyloxypyrydinium hexafluorophosphate, 1-ethoxy-4-cyanopyrydinium hexafluorophosphate, 3,4-dichloro-1-(2-ethylhexyloxy)pyrydinium hexafluorophosphate, 1-benzyloxy-4-phenylpyrydinium hexafluorophosphate, 1-phenetyloxy-4-phenylpyrydinium hexafluorophosphate, 1-(2-ethylhexyloxy)-4-phenylpyrydinium p-toluenesulfonate, 1-(2-ethylhexyloxy)-4-phenylpyrydinium perfluorobutanesulfonate, 1-(2-ethylhexyloxy)-4-phenylpyrydinium bromide, and 1-(2-ethylhexyloxy)-4-phenylpyrydinium tetrafluoroborate.

It is particularly preferable that the onium salt is used in combination with an infrared absorber which shows maximum absorption in the wavelength range from 750 to 1400 nm.

Besides them, also polymerization initiators described in paragraphs [0071] to [0129] of Japanese Laid-Open Patent Publication No. 2007-206217 are preferably used.

The polymerization initiator is preferably used alone, or in combination of two or more species.

The content of the polymerization initiator in the image-recording layer is preferably 0.01 to 20% by mass relative to the total solid content of the image recording layer, more preferably 0.1 to 15% by mass, and still more preferably 1.0 to 10% by mass.

(C) Polymerizable Compound

The polymerizable compound used for the image-recording layer is an addition polymerizable compound having at least one ethylenic unsaturated double bond, and is selected from compounds having at least one, and preferably two, terminal ethylenic unsaturated bonds. These compounds typically have any of chemical forms including monomer; prepolymer such as dimer, trimer and oligomer; and mixtures of them. Examples of the monomer include unsaturated carboxylic acid (for example, acrylic acid, methacrylic acid, itaconic acid, crotonic acid, isocrotonic acid, maleic acid), esters of them, and amides of them. More preferable examples include esters formed between unsaturated carboxylic acid and polyhydric alcohol compound, and amides formed between unsaturated carboxylic acid and polyvalent amine compound. Still other preferable examples include adducts of unsaturated carboxylate esters or amides having nucleophilic substituent group such as hydroxy group, amino group, mercapto group or the like, formed together with monofunctional or polyfunctional isocyanates or epoxys; and dehydration condensation product formed together with monofunctional or polyfunctional carboxylic acid. Still other preferable examples include adducts of unsaturated carboxylate esters or amides having electrophilic substituent group such as isocyanate group and epoxy group, formed together with monofunctional or polyfunctional alcohols, amines, or thiols; and substitution products of unsaturated carboxylate esters or amides having eliminative substituent group such as halogen group and tosyloxy group, formed together with monofunctional or polyfunctional alcohols, amines, or thiols.

Also compounds obtained by replacing the above-described unsaturated carboxylic acid with unsaturated phosphonic acid, styrene, vinyl ether or the like are also adoptable. These compounds are disclosed in Published Japanese Translation of PCT International Publication for Patent Application No. 2006-508380, Japanese Laid-Open Patent Publication Nos. 2002-287344, 2008-256850, 2001-342222, H09-179296, H09-179297, H09-179298, 2004-294935, 2006-243493, 2002-275129, 2003-64130, 2003-280187, and H10-333321.

Specific examples of the monomer in the form of acrylate ester formed between polyhydric alcohol compound and unsaturated carboxylic acid include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanurate ethylene oxide (EO)-modified triacrylate, and polyester acrylate oligomer. Examples of methacrylate ester include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryl oxy-2-hydroxypropoxy)phenyl]dimethylmethane, and bis-[p-(methacryloxyethoxy)phenyl]dimethylmethane. Specific examples of the monomer in the form of amide formed between polyvalent amine compound and unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Also urethane-based addition polymerizable compound, obtainable by addition polymerization between the isocyanate and hydroxy group, is preferable. Preferable examples of this sort of compound include vinyl urethane compound having two or more polymerizable vinyl groups per one molecule, which is obtainable by addition reaction between a vinyl monomer having a hydroxy group represented by the formula (P) below, and a polyisocyanate compound having two or more isocyanate groups per one molecule, as described in Examined Japanese Patent Publication No. S48-41708.

$$CH_2=C(R^{104})COOCH_2CH(R^{105})OH \qquad (P)$$

(where, each of $R^{104}$ and $R^{105}$ represents H or $CH_3$.)

Other preferable examples include urethane acrylates described in Japanese Laid-Open Patent Publication No. S51-37193, Examined Japanese Patent Publication No. H02-32293, ibid. H02-16765, Japanese Laid-Open Patent Publication No. 2003-344997, ibid. No. 2006-65210; urethane compounds having ethylene oxide-based skeleton described in Examined Japanese Patent Publication Nos. S58-49860, ibid. S56-17654, ibid. S62-39417, ibid. No. S62-39418, Japanese Laid-Open Patent Publication No. 2000-250211, ibid. No. 2007-94138; and urethane compound having hydrophilic group described in U.S. Pat. No. 7,153,632, Published Japanese Translation of PCT International Publication for Patent Application No. H08-505958, Japanese Laid-Open Patent Publication No. 2007-293221, and ibid. No. 2007-293223.

Among them, for the lithographic printing plate precursor adapted to the on-machine development, isocyanurate of ethylene oxide-modified acrylate such as tris(acryloyloxyethyl) isocyanurate, and bis(acryloyloxyethyl)hydroxyethyl isocyanurate are particularly preferable, from the viewpoint of good balance between hydrophilicity contributive to the on-press developability and polymerizability contributive to the printing durability.

Structure of the polymerizable compound (C), and method of use, including whether it is used alone or in combination with other species, or amount of use, may be arbitrarily determined depending on a final desired goal of performance design of lithographic printing plate precursor. The content of the polymerizable compound (C) is preferably 5 to 75% by mass of the total solid content of the image-recording layer, more preferably 25 to 70% by mass, and particularly 30 to 60% by mass.

(D) Binder

The binder (D) contained in the image-recording layer of the lithographic printing plate precursor according to the present invention is selected from those capable of keeping the image-recording layer component on the support, and removable by the developer. Examples of the binder (E) include (meth)acrylic polymer, polyurethane resin, polyvinyl alcohol resin, polyvinyl butyral resin, polyvinyl formal resin, polyamide resin, polyester resin, and epoxy resin. In particular, (meth)acrylic polymer, polyurethane resin, and polyvinyl butyral resin are preferably used. More preferable examples include (meth)acrylic polymer, polyurethane resin, and polyvinyl butyral resin.

In the present invention, "(meth)acrylic polymer" means copolymer having, as a polymerizable component, (meth)acrylic acid derivative such as (meth)acrylic acid, (meth)acryliate ester (alkyl ester, aryl ester, allylester, etc.), (meth)acrylamide and (meth)acrylamide derivative. "Polyurethane resin" means polymer produced by condensation reaction between a compound having two or more isocyanate groups and a compound having two or more hydroxy groups. "Polyvinyl butyral resin" means polymer synthesized by allowing polyvinyl alcohol obtained by partially or totally saponifying polyvinyl acetate to react with butyl aldehyde under an acidic condition (acetal forming reaction), which also includes polymer having introduced therein acid group and so forth, obtained by allowing the residual hydroxy group to react with a compound having acid group.

One preferable example of the (meth)acrylic polymer is a copolymer having a repeating unit which contains an acid group. The acid group is exemplified by carboxylate group, sulfonate group, phosphonate group, phosphate group, and sulfonamide group, wherein carboxylate group is particularly preferable. The repeating unit having acid group preferably used herein includes a repeating unit derived from (meth)acrylic acid, or a unit represented by the formula (I) below:

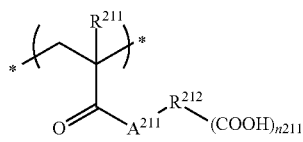

Formula (I)

In the formula (I), $R^{211}$ represents a hydrogen atom or methyl group, $R^{212}$ represents a single bond or $n_{211}$ monovalent linking groups. $A^{211}$ represents an oxygen atom or $-NR^{213}-$, and $R^{213}$ represents a hydrogen atom or $C_{1-10}$ monovalent hydrocarbon group. $n_{211}$ represents an integer from 1 to 5.

The linking group represented by $R^{212}$ in the formula (I) is composed of hydrogen atom, carbon atom, oxygen atom, nitrogen atom, sulfur atom and halogen atom, with a total number of atoms of preferably 1 to 80. More specifically, the alkylene group, substituted alkylene group, arylene group, and substituted arylene group are exemplified. A plurality of these divalent groups may be linked with any of amide bond, ether bond, urethane bond, urea bond and ester bond. $R^{212}$ preferably has a structure in which a plurality of single bonds, alkylene groups, substituted alkylene groups and alkylene groups and/or substituted alkylene groups are linked with any of amide bond, ether bond, urethane bond, urea bond, and ester bond; more preferably has a structure in which a plurality of single bonds, $C_{1-5}$ alkylene groups, $C_{1-5}$ substituted alkylene groups and $C_{1-5}$ alkylene groups and/or $C_{1-5}$ substituted alkylene groups are linked with any of amide bond, ether bond, urethane bond, urea bond, and ester bond; and particularly has a structure in which a plurality of single bonds, $C_{1-3}$ alkylene group, $C_{1-3}$ substituted alkylene group, and $C_{1-3}$ alkylene group and/or $C_{1-3}$ substituted alkylene groups are linked with any of amide bond, ether bond, urethane bond, urea bond, and ester bond.

Examples of the substituent group possibly bound to the linking group represented by $R^{212}$ includes group of monovalent non-metallic atoms excluding hydrogen atom, wherein examples of which include halogen atom (—F, —Br, —Cl, —I), hydroxy group, cyano group, alkoxy group, aryloxy group, mercapto group, alkylthio group, arylthio group, alkylcarbonyl group, arylcarbonyl group, carboxyl group and its conjugate base group, alkoxy carbonyl group, aryloxy carbonyl group, carbamoyl group, aryl group, alkenyl group, and alkynyl group.

$R^{213}$ is preferably a hydrogen atom or $C_{1-5}$ hydrocarbon group, more preferably a hydrogen atom or $C_{1-3}$ hydrocarbon group, and particularly a hydrogen atom or methyl group.

$n_{211}$ is preferably 1 to 3, more preferably 1 or 2, and particularly 1.

Ratio of the content (mol %) of the polymerizable component having carboxylate group, relative to the total polymerizable components of the (meth)acrylic polymer is preferably 1 to 70% from the viewpoint of developability, more preferably 1 to 50% considering a good balance between the developability and printing durability, and particularly 1 to 30%.

It is preferable for the (meth)acrylic polymer used in the present invention to additionally have a crosslinkable group. The crosslinkable group herein means a group capable of crosslinking the binder (D), in the process of radical polymerization reaction which proceeds in the image-recording layer, when the lithographic printing plate precursor is exposed to light. While the functional group is not specifically limited so long as it can exhibit the above-described function, examples of the functional group capable of proceeding addition polymerization reaction include ethylenic unsaturated binding group, amino group, and epoxy group. The functional group may also be a functional group capable of producing a radical upon being exposed to light, and this sort of crosslinkable group is exemplified by thiol group and halogen group. Among them, ethylenic unsaturated binding group is preferable. The ethylenic unsaturated binding group is preferably styryl group, (meth)acryloyl group, or allyl group.

The binder (D) cures in such a way that a free radical (polymerization initiating radical, or propagating radical in the process of polymerization of radical or polymerizable compound) attaches to the crosslinkable functional group, and crosslinkage is formed among the polymer molecules thereof, by addition polymerization which proceeds directly among the polymer molecules or by sequential polymerization of the polymerizable compounds. Alternatively, the binder cures in such a way that atoms (for example, hydrogen atoms on carbon atoms adjacent to the functional crosslinking groups) in the polymer are abstracted by free radicals to produce polymer radicals, and the resultant polymer radicals then combine with each other to produce the crosslinkages among the polymer molecules.

The content of the crosslinkable group in the (meth)acrylic polymer (content of radical polymerizable unsaturated double bond determined by iodometry) is preferably 0.01 to 10.0 mmol per one gram of the binder (D), more preferably 0.05 to 9.0 mmol, and particularly 0.1 to 8.0 mmol.

Besides the above-described repeating unit having an acid group, and the polymerization unit having a crosslinkable group, the (meth)acrylic polymer used in the present invention may have a polymerization unit of alkyl (meth)acrylate or aralkyl (meth)acrylate, polymerization unit of (meth)acrylamide or its derivative, polymerization unit of α-hydroxymethyl acrylate, or polymerization unit of styrene derivative. The alkyl group of alkyl (meth)acrylate is preferably a $C_{1-5}$ alkyl group, or an alkyl group having the above-described $C_{2-8}$ substituent group, and more preferably methyl group.

The aralkyl (meth)acrylate is exemplified by benzyl (meth) acrylate. The (meth)acrylamide derivative is exemplified by N-isopropylacrylamide, N-phenylmethacrylamide, N-(4-methoxycarbonylphenyl)methacrylamide, N,N-dimethylacrylamide, and morpholinoacrylamide. The α-Hydroxymethyl acrylate is exemplified by ethyl α-hydroxymethyl acrylate, and cyclohexyl α-hydroxymethyl acrylate. The styrene derivative is exemplified by styrene, and 4-tert-butylstyrene.

For the case where the lithographic printing plate precursor is intended for on-machine development, the binder (D) preferably has a hydrophilic group. The hydrophilic group contributes to impart on-press developability to the image-recording layer. In particular, by allowing the crosslinkable group and the hydrophilic group to coexist, the printing durability and the on-press developability may be compatible.

Examples of the hydrophilic group possibly bound to the binder (D) include hydroxy group, carboxyl group, alkylene oxide structure, amino group, ammonium group, amide group, sulfo group, and phosphate group. Among them, the alkylene oxide structure having 1 to 9 $C_{2-3}$ alkylene oxide units is preferable. The hydrophilic group may be introduced into the binder, typically by allowing monomers having hydrophilic group to copolymerize.

Preferable examples of the polyurethane resin include those described in paragraphs [0099] to [0210] of Japanese Laid-Open Patent Publication No. 2007-187836, paragraphs [0019] to [0100] of Japanese Laid-Open Patent Publication No. 2008-276155, paragraphs [0018] to [0107] of Japanese Laid-Open Patent Publication No. 2005-250438, and paragraphs [0021] to [0083] of Japanese Laid-Open Patent Publication No. 2005-250158.

Preferable examples of the polyvinyl butyral resin include those described in paragraphs [0006] to [0013] of Japanese Laid-Open Patent Publication No. 2001-75279.

The binder (D) may be neutralized by a basic compound at a part of the acid groups. The basic compound is exemplified by compounds having basic nitrogen atom, alkali metal hydroxide, and quaternary ammonium salt of alkali metal.

The binder (D) preferably has a mass average molecular weight of 5,000 or larger, more preferably 10,000 to 300,000, and preferably has a number average molecular weight of 1,000 or larger, and more preferably 2000 to 250,000. The polydispersibility (mass average molecular weight/number average molecular weight) is preferably 1.1 to 10.

The binder (D) may be used alone or in combination of two or more species.

The content of the binder (D) is preferably 5 to 75% by mass of the total solid content of the image-recording layer, from the viewpoint of satisfactory levels of strength in the image-forming area and image formability, and more preferably 10 to 70% by mass, and still more preferably 10 to 60% by mass.

Total content of the polymerizable compound (C) and the binder (D) relative to the total solid content of the image-recording layer is preferably 90% by mass or less. The content exceeding 90% by mass may result in degraded sensitivity and developability. The content is more preferably 35 to 80% by mass.

(E) Sensitizing Dye

The photo sensitive layer preferably contains a dye. The dye is preferably a sensitizing dye (E).

The sensitizing dye used for the image-recording layer of the lithographic printing plate precursor according to the present invention may be arbitrarily selected without special limitation, so long as it can go into an excited state upon absorption of light in the process of pattern-wise exposure, and can supply energy to the polymerization initiator typically by electron transfer, energy transfer or heat generation, so as to improve the polymerization initiating property. In particular, sensitizing dyes showing maximum absorption in the wavelength range from 300 to 450 nm or 750 to 1400 nm are preferably used.

The sensitizing dyes showing maximum absorption in the wavelength range from 350 to 450 nm include merocyanines, benzopyranes, coumarines, aromatic ketones, anthracenes, styryls, and oxazoles.

Among the sensitizing dyes showing maximum absorption in the wavelength range from 350 to 450 nm, preferable dyes are those represented by the formula (IX), from the viewpoint of large sensitivity.

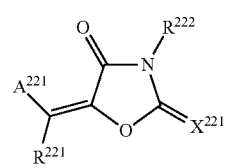

Formula (IX)

In the formula (IX), $A^{221}$ represents an aryl group or heteroaryl group which may have a substituent group, and $X^{221}$ represents an oxygen atom, sulfur atom or $=N(R^{223})$. Each of $R^{221}$, $R^{222}$ and $R^{223}$ independently represents a monovalent group of non-metallic atom, wherein $A^{221}$ and $R^{221}$, or $R^{222}$ and $R^{223}$, may combine respectively to form an aliphatic or aromatic ring.

The formula (IX) will now be further detailed. The monovalent group of non-metallic atom represented by $R^{221}$, $R^{222}$ or $R^{223}$ is preferably a hydrogen atom, substituted or unsubstituted alkyl group, substituted or unsubstituted alkenyl group, substituted or unsubstituted aryl group, substituted or unsubstituted heteroaryl group, substituted or unsubstituted alkoxy group, substituted or unsubstituted alkylthio group, hydroxy group, and halogen atom.

The aryl group and heteroaryl group represented by $A^{221}$, which may have a substituent group, are same as the substituted or unsubstituted aryl group, and substituted or unsubstituted heteroaryl group represented respectively by $R^{221}$, $R^{222}$ and $R^{223}$.

Specific examples of the sensitizing dye preferably used herein include the compounds described in paragraphs [0047] to [0053] of Japanese Laid-Open Patent Publication No. 2007-58170, paragraphs [0036] to [0037] of Japanese Laid-Open Patent Publication No. 2007-93866, and paragraphs [0042] to [0047] of Japanese Laid-Open Patent Publication No. 2007-72816.

Also the sensitizing dyes described in Japanese Laid-Open Patent Publication Nos. 2006-189604, 2007-171406, 2007-206216, 2007-206217, 2007-225701, 2007-225702, 2007-316582, and 2007-328243 are preferably used.

Next, the sensitizing dye showing maximum absorption in the wavelength range from 750 to 1400 nm (also referred to as "infrared absorber", hereinafter) will be described. The infrared absorber preferably used herein is dye or pigment.

The dye adoptable herein may be arbitrarily selected from commercially available dyes and those described in literatures such as "Senryo Binran (Dye Handbook)" (edited by The Society of Synthetic Organic Chemistry, Japan, 1970). The specific examples include azo dye, metal complex azo dye, pyrazolone azo dye, naphthoquinone dye, anthraquinone dye, phthalocyanine dye, carbonium dye, quinone imine dye, methine dye, cyanine dye, squarylium colorant, pyrylium salt dye, and metal thiolate complex dye.

Among them, particularly preferable examples include cyanine colorant, squarylium colorant, pyrylium salt, nickel thiolate complex, and indolenine cyanine colorant. More preferable examples include cyanine colorant and indolenine cyanine colorant, and particularly preferable example include a cyanine colorant represented by the formula (a) below:

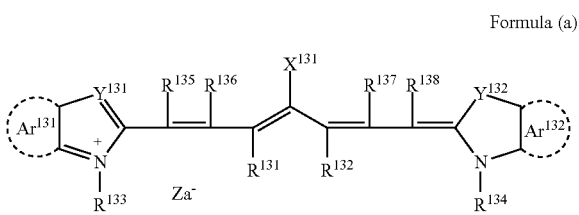

Formula (a)

In the formula (a), $X^{131}$ represents a hydrogen atom, halogen atom, —$NPh_2$, —$X^{132}$-$L^{131}$ or the group shown below, where Ph represents a phenyl group.

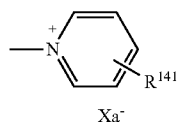

In the formula, $X^{132}$ represents an oxygen atom, nitrogen atom or sulfur atom, and $L^{131}$ represents a $C_{1-12}$ hydrocarbon group, aryl group having a hetero atom (N, S, O, halogen, Se), and $C_{1-12}$ hydrocarbon group having a hetero atom. $X_a^-$ is synonymous with $Z_a^-$ described later. $R^{141}$ represents a substituent group selected from hydrogen atom or alkyl group, aryl group, substituted or unsubstituted amino group, and halogen atom.

Each of $R^{131}$ and $R^{132}$ independently represents $C_{1-12}$ hydrocarbon group. From the viewpoint of stability of coating liquid for forming the photo sensitive layer, each of $R^{131}$ and $R^{132}$ is preferably a $C_2$ or longer hydrocarbon group. $R^{131}$ and $R^{132}$ may combine with each other to form a ring which is preferably a five-membered ring or six-membered ring.

$Ar^{131}$ and $Ar^{132}$ may be same or different, and each represents an aryl group which may have a substituent group. Preferable examples of the aryl group include benzene ring group and naphthalene ring group. Preferable examples of the substituent group include $C_{12}$ or shorter hydrocarbon group, halogen atom, and $C_{12}$ or shorter alkoxy group. $Y^{131}$ and $Y^{132}$ may be same or different, and each represents a sulfur atom or $C_{12}$ or shorter dialkylmethylene group. $R^{133}$ and $R^{134}$ may be same or different, and each represents a $C_{20}$ or shorter hydrocarbon group which may have a substituent group. Preferable examples of the substituent group include a $C_{12}$ or shorter alkoxy group, carboxyl group, and sulfo group. $R^{135}$, $R^{136}$, $R^{137}$ and $R^{138}$ may be same or different, and each represents a hydrogen atom or $C_{12}$ or shorter hydrocarbon group. From the viewpoint of availability of the source materials, hydrogen atom is preferable. $Z_a^-$ represents a counter anion. Note that $Z_a^-$ is not necessary if the cyanine colorant represented by the formula (a) has an anionic substituent group in the structure thereof, and is omissible if there is no need of neutralization of electric charge. Preferable examples of $Z_a^-$ include halide ion, perchlorate ion, tetrafluoroborate ion, hexafluorophosphate ion and sulfonate ion from the viewpoint of storage stability of coating liquid for forming the image-recording layer. Particularly preferable examples include perchlorate ion, hexafluorophosphate ion and aryl sulfonate ion.

Specific examples of the cyanine colorant represented by the formula (a) include the compounds described in paragraphs [0017] to [0019] of Japanese Laid-Open Patent Publication No. 2001-133969, paragraphs [0016] to [0021] of Japanese Laid-Open Patent Publication No. 2002-023360, and paragraphs [0012] to [0037] of Japanese Laid-Open Patent Publication No. 2002-040638, preferable examples include those described in paragraphs [0034] to [0041] of Japanese Laid-Open Patent Publication No. 2002-278057, and paragraphs [0080] to [0086] of Japanese Laid-Open Patent Publication No. 2008-195018, and particularly preferable examples include those described in paragraphs [0035] to [0043] of Japanese Laid-Open Patent Publication No. 2007-90850.

Also compounds described in paragraphs [0008] to [0009] of Japanese Laid-Open Patent Publication No. H05-5005, and paragraphs [0022] to [0025] of Japanese Laid-Open Patent Publication No. 2001-222101 are preferably used.

The infrared absorbing dye may be used alone, or in combination of two or more species, and may contain an infrared absorber other than infrared absorbing dye, which is exemplified by pigment. As the pigment, the compounds described in paragraphs [0072] to [0076] of Japanese Laid-Open Patent Publication No. 2008-195018 are preferable.

The content of the sensitizing dye (E) is preferably 0.05 to 30 parts by mass relative to the total solid content (100 parts by mass) of the image-recording layer, more preferably 0.1 to 20 parts by mass, and particularly 0.2 to 10 parts by mass.

(F) Low-Molecular-Weight Hydrophilic Compound

The image-recording layer may contain a low-molecular-weight hydrophilic compound, for the purpose of improving the on-press developability without degrading the printing durability.

Examples of the low-molecular-weight hydrophilic compound, categorized as water-soluble organic compound, include glycols such as ethylene glycol, diethylene glycol, triethylene glycol, propylene glycol, dipropylene glycol, and tripropylene glycol, and ether or ester derivatives thereof; polyols such as glycerin, pentaerythritol, and tris(2-hydroxyethyl)isocyanurate; organic amines such as triethanolamine, diethanolamine, and monoethanolamine, and salts thereof; organic sulfonic acids such as alkyl sulfonic acid, toluenesulfonic acid, and benzenesulfonic acid, and salts thereof; organic sulfamic acids such as alkyl sulfamic acid, and salt thereof; organic sulfuric acids such as alkyl sulfuric acid, alkyl ether sulfuric acid, and salts thereof; organic phosphonic acids such as phenylphosphonic acid, and salt thereof; organic carboxylic acids such as tartaric acid, oxalic acid, citric acid, malic acid, lactic acid, gluconic acid, and amino acid, and salts thereof; and betaines.

Among them, at least one species selected from polyols, organic sulfate salts, organic sulfonate salts, and betaines are preferably contained in the present invention.

Specific examples of the organic sulfonate salt include alkylsulfonate salt such as sodium n-butylsulfonate, sodium n-hexylsulfonate, sodium 2-ethylhexylsulfonate, sodium cyclohexylsulfonate, and sodium n-octylsulfonate; alkylsulfonate salt having an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, and sodium 5,8,11,14-tetraoxatetracosane-1-sulfonate; aryl sulfonate salt such as sodium benzenesulfonate, sodium p-toluenesulfonate, sodium p-hydroxybenzenesulfonate, sodium p-styrenesulfonate, sodium dimethyl isophthalate-5-sulfonate, sodium 1-naphthylsulfonate, sodium 4-hydroxynaphthylsulfonate, disodium 1,5-naphthalenedisulfonate, and trisodium 1,3,6-naphthalenetrisulfonate; the compounds described in paragraphs [0026] to [0031] of Japanese Laid-Open Patent Publication No. 2007-276454, and paragraphs [0020] to [0047] of Japanese Laid-Open Patent Publication No. 2009-154525. The salt may also be potassium salts or lithium salts.

The organic sulfate salts are exemplified by sulfate salts of alkyl, alkenyl, alkynyl, aryl or heterocyclic monoether of polyethylene oxide. The number of ethylene oxide unit is preferably 1 to 4, and the salts are preferably sodium salt, potassium salt or lithium salt. Specific examples thereof include the compounds described in paragraphs [0034] to [0038] of Japanese Laid-Open Patent Publication No. 2007-276454.

The betaine is preferably a compound having $C_{1-5}$ hydrocarbon substituent group on the nitrogen atom, and preferable examples include trimethylammonium acetate, dimethylpropylammonium acetate, 3-hydroxy-4-trimethylammoniobutyrate, 4-(1-pyridinio)butyrate, 1-hydroxyethyl-1-imidazolio acetate, trimethylammonium methanesulfonate, dimethylpropylammonium methanesulfonate, 3-trimethylammonium-1-propanesulfonate, and 3-(1-pyridinio)-1-propanesulfonate.

The low-molecular-weight hydrophilic compound scarcely exhibits a surfactant activity due to its small size of the hydrophobic portion, so that fountain solution does not immerse into the exposed area of the image-recording layer (image-forming area) to consequently degrade the hydrophobicity and film strength of the image-forming area, and thereby the ink receptivity and printing durability of the image-recording layer are kept at desirable levels.

The content of the low-molecular-weight hydrophilic compound in the image-recording layer is preferably 0.5 to 20% by mass of the total solid content of the image-recording layer, more preferably 1 to 15% by mass, and more preferably 2 to 10% by mass. In this range, desirable levels of on-press developability and printing durability are obtained. The low-molecular-weight hydrophilic compound may be used alone, or in combination of two or more species.

(G) Sensitizer

The image-recording layer may contain a sensitizer such as phosphonium compound, nitrogen-containing low-molecular-weight compound, and ammonium group-containing polymer, aiming at improving inking performance. In particular, for the case where the protective layer contains an inorganic layered compound, the sensitizer functions as a surface coating agent of the inorganic layered compound, and prevent the inking performance from degrading in the process of printing, due to the inorganic layered compound.

Preferable examples of the phosphonium compound include those described in Japanese Laid-Open Patent Publication Nos. 2006-297907 and 2007-50660. Specific examples thereof include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio)heptane sulfate, and 1,9-bis(triphenylphosphonio)nonanenaphthalene-2,7-disulfonate.

The nitrogen-containing low-molecular-weight compound is exemplified by amine salts, and quaternary ammonium salts. Other examples include imidazolinium salts, benzoimidazolinium salts, pyrydinium salts, and quinolinium salts. Among them, quaternary ammonium salts and pyrydinium salts are preferable. Specific examples include tetramethylammonium hexafluorophosphate, tetrabutylammonium hexafluorophosphate, dodecyltrimethylammonium p-toluenesulfonate, benzyl triethylammonium hexafluorophosphate, benzyl dimethyloctylammonium hexafluorophosphate, benzyl dimethyldodecylammonium hexafluorophosphate, the compounds described in paragraphs [0021] to [0037] of Japanese Laid-Open Patent Publication No. 2008-284858, and the compounds described in paragraphs [0030] to [0057] of Japanese Laid-Open Patent Publication No. 2009-90645.

While the ammonium group-containing polymer may be arbitrarily selected so long as it has an ammonium group in the structure thereof, a preferable polymer contains, as a copolymerizable component, 5 to 80 mol % of (meth)acrylate having an ammonium group in the side chain thereof. Specific examples include the polymers described in paragraphs [0089] to [0105] of Japanese Laid-Open Patent Publication No. 2009-208458.

The ammonium salt-containing polymer preferably has a reduced specific viscosity (in ml/g), measured by the method of measurement described below, of 5 to 120, more preferably 10 to 110, and particularly 15 to 100. Mass average molecular weight, converted from the reduced specific viscosity, is preferably 10,000 to 150,000, more preferably 17,000 to 140,000, and particularly 20,000 to 130,000.

<<Method of Measuring Reduced Specific Viscosity>>

In a 20-ml measuring flask, 3.33 g (1 g as solid content) of a 30% polymer solution is weighed, and the flask is filled up with N-methylpyrrolidone. The obtained solution is allowed to stand in a thermostat chamber at 30° C. for 30 minutes, and then placed in a Ubbelohde reduced viscosity tube (viscometer constant=0.010 cSt/s), and the time it takes for the solution to elute at 30° C. is measured. The measurement is repeated twice using the same sample, to thereby find an average value. The blank (N-methylpyrrolidone only) is also measured similarly, and the reduced specific viscosity (ml/g) is calculated by the formula below.

$$\text{Reduced specific viscosity (ml/g)} = \frac{\dfrac{\text{Elution time of sample solution (sec)} - \text{Elution time of blank (sec)}}{\text{Elution time of blank (sec)}}}{3.33 \, (g) \times \dfrac{30}{100}}{20 \, (ml)}$$

Specific examples of the ammonium group-containing polymer will be enumerated below:

(1) 2-(trimethylammonio)ethyl methacrylate p-toluenesulfonate/3,6-dioxaheptyl methacrylate copolymer (molar ratio=10/90, mass average molecular weight: 450,000)
(2) 2-(trimethylammonio)ethyl methacrylate hexafluorophosphate/3,6-dioxaheptyl methacrylate copolymer (molar ratio=20/80, mass average molecular weight: 600,000)
(3) 2-(ethyldimethylammonio)ethyl methacrylate p-toluenesulfonate/hexyl methacrylate copolymer (molar ratio=30/70, mass average molecular weight: 450,000)
(4) 2-(trimethylammonio)ethyl methacrylate hexafluorophosphate/2-ethylhexyl methacrylate copolymer (molar ratio=20/80, mass average molecular weight: 600,000)
(5) 2-(trimethylammonio)ethyl methacrylate methylsulfate/hexyl methacrylate copolymer (molar ratio=40/60, mass average molecular weight: 700,000)
(6) 2-(butyldimethylammonio)ethyl methacrylate hexafluorophosphate/3,6-dioxaheptyl methacrylate copolymer (molar ratio=25/75 mass average molecular weight: 650,000)

(7) 2-(butyldimethylammonio)ethyl acrylate hexafluorophosphate/3,6-dioxaheptyl methacrylate copolymer (molar ratio=20/80, mass average molecular weight: 650,000)
(8) 2-(butyldimethylammonio)ethyl methacrylate 13-ethyl-5,8,11-trioxa-1-heptadecane sulfonate/3,6-dioxaheptyl methacrylate copolymer (molar ratio=20/80, mass average molecular weight: 750,000)
(9) 2-(butyldimethylammonio)ethyl methacrylate hexafluorophosphate/3,6-dioxaheptyl methacrylate/2-hydroxy-3-methacryloyloxypropyl methacrylate copolymer (molar ratio=15/80/5 mass average molecular weight: 650,000)

The content of the sensitizer is preferably 0.01 to 30.0% by mass of the total solid content of the image-recording layer, more preferably 0.01 to 15.0% by mass, and still more preferably 1 to 5% by mass.

(H) Hydrophobization Precursor

The image-recording layer may contain a hydrophobization precursor, for the purpose of improving the on-press developability. The hydrophobization precursor means a fine particle capable of turning, upon heating, the image-recording layer into hydrophobic. The fine particle is preferably at least one species selected from hydrophobic thermoplastic polymer particle, thermoreactive polymer particle, polymer particle having polymerizable group, and microcapsule and microgel (crosslinked polymer particle) containing hydrophobic compound. Among them, polymer particle and microgel having polymerizable group are preferable.

Preferable examples of the hydrophobic thermoplastic polymer particle include those described in Research Disclosure No. 333003 published in January 1992, Japanese Laid-Open Patent Publication Nos. H09-123387, H09-131850, H09-171249, H09-171250 and European Patent No. 931647.

Specific examples of polymer composing the polymer particle include ethylene, styrene, vinyl chloride, methyl acrylate, ethyl acrylate, methyl methacrylate, ethyl methacrylate, vinylidene chloride, acrylonitrile, vinylcarbazole, acrylate or methacrylate having a polyalkylene structure, all of which being available in the form of monomer, homopolymer, copolymer and mixture. Among them, more preferable examples include polystyrene, copolymer containing styrene and acrylonitrile, and methyl polymethacrylate.

Average particle size of the hydrophobic thermoplastic polymer particle used in the present invention is preferably 0.01 to 2.0 µm.

The thermoreactive polymer particle used in the present invention is exemplified by polymer particle having a thermoreactive group which forms a hydrophobic domain as a result of crosslinking by thermal reaction and concomitant change in the functional group.

While the thermoreactive group contained in the polymer particle used in the present invention may be arbitrarily selected from those capable of proceeding any type of reaction so long as it can form a chemical bond, it is preferably a polymerizable group. The preferable examples include ethylenic unsaturated group which undergoes radical polymerization reaction (acryloyl group, methacryloyl group, vinyl group, allyl group, etc.); cation polymerizable group (vinyl group, vinyloxy group, epoxy group, oxetanyl group, etc.); isocyanate group or block thereof which undergoes addition reaction; epoxy group, vinyloxy group and functional group containing an activated hydrogen atom reactive with them (amino group, hydroxy group, carboxyl group, etc.); carboxyl group which undergoes condensation reaction, and functional group capable of reacting therewith and having a hydroxy group or amino group; and acid anhydride which undergoes ring-opening addition reaction, and amino group or hydroxy group allow to react therewith.

The microcapsule used in the present invention contains all of, or a part of, the constituents of the image-recording layer, typically as described in Japanese Laid-Open Patent Publication Nos. 2001-277740 and 2001-277742. The constituents of the image-recording layer may also be contained outside the microcapsule. Still alternatively, the image-recording layer containing microcapsule may be configured so as to contain the hydrophobic constituents encapsulated in the microdapsule, and hydrophilic constituents outside the microcapsule.

The microgel used in the present invention may contain at least either therein or on the surface thereof, a part of constituents of the image-recording layer. In particular, an embodiment of reactive microgel, configured by attaching the radical-polymerizable group onto the surface thereof, is preferable from the viewpoint of image-forming sensitivity and printing durability.

Encapsulation of the constituents of the image-recording layer into the microcapsule or microgel is arbitrarily selectable from those known in the art.

Average particle size of the microcapsule or microgel is preferably 0.01 to 3.0 µm, more preferably 0.05 to 2.0 µm, and particularly 0.10 to 1.0 µm. Satisfactory levels of resolution and long-term stability may be ensured in the above-described ranges.

The content of the hydrophobization precursor is preferably 5 to 90% by mass relative to the total solid content of the image-recording layer.

(I) Other Components of Image-Recording Layer

The image-recording layer preferably contains chain transfer agent. The chain transfer agent is defined typically in "Kobunshi Jiten (The Dictionary of Polymer), 3rd Edition" (edited by The Society of Polymer Science, Japan, 2005) p. 683-684. The chain transfer agent adoptable herein includes compound having SH, PH, SiH or GeH in the molecule thereof. These groups may produce a radical by donating a hydrogen to a low-active radical species, or, may produce a radical after being oxidized, followed by deprotonation. It is particularly preferable for the image-recording layer to contain a thiol compound (2-mercapto benzimidazoles, 2-mercapto benzthiazoles, 2-mercapto benzoxazoles, 3-mercapto triazoles, 5-mercapto tetrazoles, etc.).

The content of the chain transfer agent is preferably 0.01 to 20 parts by mass relative to the total solid content (100 parts by mass) of the image-recording layer, more preferably 1 to 10 parts by mass, and particularly 1 to 5 parts by mass.

The image-recording layer may further contain various additives as needed. The additives are exemplified by surfactant for enhancing developability and improving coating surface texture; hydrophilic polymer for improving developability and dispersion stability of the microcapsule; colorant and baking agent for easy discrimination between the image-forming area and the non-image-forming area; polymerization inhibitor for avoiding unnecessary thermal polymerization of the polymerizable compound in the process of manufacturing or storage of the image-recording layer; hydrophobic low-molecular-weight compound such as higher aliphatic acid derivative for avoiding inhibition of oxygen-induced polymerization; inorganic particle and organic particle for improving strength of cured film in the image-forming area; co-sensitizer for improving the sensitivity; and plasticizer for improving plasticity. These compounds may be any of those known in the art, such as those disclosed in paragraphs [0161] to [0215] of Japanese Laid-Open Patent Publication No. 2007-206217, paragraph [0067] of Published Japanese Translation of PCT International Publication for Patent Application No. 2005-509192, and paragraphs [0023] to [0026], and [0059] to [0066] of Japanese Laid-Open Patent Publication No. 2004-310000. The surfactant may also be those which may be added to the developer described later.

(Formation of Image-Recording Layer)

The image-recording layer in the lithographic printing plate precursor according to the present invention may be formed by an arbitrary method known in the art, without special limitation. The image-recording layer is formed by dispersing or dissolving the above-described necessary components of the image-recording layer into a solvent to prepare a coating liquid, and then coating the liquid. The solvent adoptable herein is exemplified by methyl ethyl ketone, ethylene glycol monomethyl ether, 1-methoxy-2-propanol, 2-methoxyethyl acetate, 1-methoxy-2-propyl acetate, and γ-butyrolactone, but not limited thereto. The solvent may be used alone, or in combination of two or more species. The solid content of the coating liquid is preferably 1 to 50% by mass.

The amount of coating (solid content) of the image-recording layer is preferably 0.3 to 3.0 g/m$^2$. Method of coating may be arbitrarily selected from various methods, including bar coater coating, spin coating, spray coating, curtain coating, dip coating, air knife coating, blade coating, and roll coating.

The copolymer (A) may be incorporated into the image-recording layer or undercoat layer, by adding the copolymer (A) to the coating liquid for forming the image-recording layer, or to the coating liquid for forming the undercoat layer. For the case where the copolymer (A) is contained in the image-recording layer, the content of the copolymer (A) (solid content) is preferably 0.1 to 100 mg/m$^2$, more preferably 1 to 30 mg/m$^2$, and still more preferably 5 to 24 mg/m$^2$.

[Support]

The support used for the lithographic printing plate precursor according to the present invention is not specifically limited, provided that it is plate-like hydrophilic support with dimensional stability. Aluminum plate is particularly preferable as the support. The aluminum plate preferably undergoes surface treatment such as roughening or anodizing prior to use. The surface of aluminum plate may be roughened by various methods including mechanical roughening, electrochemical roughening (eroding the surface by an electrochemical process), and chemical roughening (selectively eroding the surface in a chemical process). Preferable examples of these methods of treatment are descried in paragraphs [0241] to [0245] of Japanese Laid-Open Patent Publication No. 2007-206217.

The support preferably has a center line average roughness of 0.10 to 1.2 µm. In this range, the support will exhibit good adhesiveness with the image-recording layer, good printing durability, and good staining resistance.

Color density of the support is preferably 0.15 to 0.65 in terms of reflection density value. In this range, good image forming performance by virtue of suppressed halation in the process of pattern-wise exposure, and readiness of plate check after development may be ensured.

The support is preferably 0.1 to 0.6 mm thick, more preferably 0.15 to 0.4 mm thick, and still more preferably 0.2 to 0.3 mm thick.

<Hydrophilization>

In the lithographic printing plate precursor according to the present invention, it is also effective to hydrophilize the surface of the support, for the purpose of improving the hydrophilicity in the non-image-forming area and of preventing printing blot.

Methods of hydrophilization of the surface of the support include alkali metal silicate treatment by which the support is dipped into an aqueous solution of sodium silicate or the like, for electrolytic treatment; treatment using potassium fluorozirconate; and treatment using polyvinyl phosphonate. The method using an aqueous solution of polyvinyl phosphonate is preferably used.

[Protective Layer]

For the purpose of blocking diffusive intrusion of oxygen which may inhibit the polymerization reaction in the process of exposure to light, the lithographic printing plate precursor according to the present invention is preferably provided with the protective layer (oxygen barrier layer) on the image-recording layer. Materials for composing the protective layer are arbitrarily selectable either from water-soluble polymer and water-insoluble polymer, and two or more species may be combined as necessary. More specifically, polyvinyl alcohol, modified polyvinyl alcohol, polyvinyl pyrrolidone, water-soluble cellulose derivative, and poly(meth)acrylonitrile are exemplified. Among them, water-soluble polymer compound is preferably used by virtue of its relatively good crystallinity. More specifically, a good result may be obtained by using polyvinyl alcohol as a major constituent, from the viewpoint of achieving excellent basic performances such as oxygen barrier performance, and removability in development.

Polyvinyl alcohol used for the protective layer may partially be substituted, at the hydroxy groups thereof, by ester, ether or acetal, so long as a certain amount of unsubstituted vinyl alcohol units, necessary for ensuring oxygen barrier performance and water-solubility, is contained. Similarly, polyvinyl alcohol may also contain other polymerizable component partially in the structure thereof. Polyvinyl alcohol may be obtained by hydrolyzing polyvinyl acetate. Specific examples of polyvinyl alcohol include those having a degree of hydrolysis of 69.0 to 100 mol %, and having a number of polymerizable repeating units of 300 to 2400. More specific examples include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706 and PVA L-8, all of which commercially available from Kuraray Co. Ltd. Polyvinyl alcohol may be used alone, or in the form of mixture. The content of polyvinyl alcohol in the protective layer is preferably 20 to 95% by mass, and more preferably 30 to 90% by mass.

Also modified polyvinyl alcohol may preferably be used. In particular, acid-modified polyvinyl alcohol having the carboxylate group or sulfonate group is preferably used. More specifically, preferable examples include the polyvinyl alcohol described in Japanese Laid-Open Patent Publication Nos. 2005-250216 and 2006-259137.

For the case where polyvinyl alcohol is used in a mixed form with other materials, the materials to be mixed are preferably modified polyvinyl alcohol, polyvinyl pyrrolidone or a modified product thereof, from the viewpoint of oxygen barrier performance and readiness of removal in development. The content in the protective layer is 3.5 to 80% by mass, preferably 10 to 60% by mass, and more preferably 15 to 30% by mass.

The protective layer may be added with several percents, relative to the polymer, of glycerin, dipropylene glycol or the like so as to give flexibility. Alternatively, several percents by mass, relative to the polymer, of anionic surfactants such as the sodium alkyl sulfuric acid and sodium alkyl sulfonate; ampholytic surfactants such as alkylamino carboxylate salt, and alkylamino dicarboxylate salt; and nonionic surfactants such as polyoxyethylene alkyl phenyl ether polymer may be added.

In addition, for the purpose of improving the oxygen barrier performance and surface protective performance of the image-recording layer, the protective layer may contain an inorganic layered compound. Among the inorganic layered compounds, fluorine-containing swellable synthetic mica, which is a synthetic inorganic layered compound, is particularly useful. More specifically, preferable examples include the inorganic layered compounds described in Japanese Laid-Open Patent Publication No. 2005-119273.

The amount of coating of the protective layer is preferably 0.05 to 10 g/m$^2$, and is more preferably 0.1 to 5 g/m$^2$ if the inorganic layered compound is contained, and whereas more preferably 0.5 to 5 g/m$^2$ if the inorganic layered compound is not contained.

[Back Coat Layer]

The lithographic printing plate precursor according to the present invention may be provided with a back coat layer on the back surface of the support as necessary. The back coat layer is preferably exemplified by a cover layer composed of the organic polymer compounds described in Japanese Laid-Open Patent Publication No. H05-45885, or composed of the metal oxides described in Japanese Laid-Open Patent Publication No. H06-35174 which are obtained by allowing organic metal compound or inorganic metal compound to hydrolyze or undergo polycondensation. Among them, alkoxy compounds of silicon, such as $Si(OCH_3)_4$, $Si(OCH_5)_4$, $Si(OC_3H_7)_4$, $Si(OC_4H_9)_4$ are preferable in view of inexpensiveness and availability of the source materials.

[Processes for Preparing Lithographic Printing Plates]

Lithographic printing plates can be prepared by imagewise exposing a lithographic printing plate precursor of the present invention and developing it.

A process for preparing a lithographic printing plate according to the present invention comprises: imagewise exposing a lithographic printing plate precursor of the present invention; and developing the exposed lithographic printing plate precursor in a developer at pH 2 to 14; characterized in that the developing step comprises removing unexposed areas of the image-recording layer and the protective layer simultaneously in the presence of the developer.

Preferably, the process for preparing a lithographic printing plate according to the present invention comprises forming a protective layer on the surface of the image-recording layer opposite to the substrate; wherein the developing step comprises removing the image-recording layer in unexposed areas and the protective layer simultaneously in the presence of the developer further containing a surfactant provided that no water-washing step is included.

A second embodiment of the process for preparing a lithographic printing plate according to the present invention comprises: imagewise exposing a lithographic printing plate precursor of the present invention; and supplying a printing ink and a dampening solution to remove the image-recording layer in unexposed areas on a printing press.

Preferred embodiments of each step of the processes for preparing a lithographic printing plate according to the present invention are explained in order below. It should be noted that lithographic printing plates can also be prepared from the lithographic printing plate precursors of the present invention by the processes for preparing a lithographic printing plate according to the present invention when the developing step includes a water-washing step.

<Exposure>

The method of manufacturing the lithographic printing plate of the present invention includes exposing the lithographic printing plate precursor according to the present invention in a pattern-wise manner. The lithographic printing plate precursor according to the present invention is exposed by laser shot through a transparent original having a line image or halftone image or the like, or laser scanning modulated by digital data.

Wavelength of light source is preferably 300 to 450 nm or 750 to 1400 nm. When the light source of 300 to 450 nm is used, the lithographic printing plate precursor preferably contains, in the image-recording layer thereof, a sensitizing dye showing an absorption maximum in this wavelength. On the other hand, for the case where the light source of 750 to 1400 nm is used, the lithographic printing plate precursor preferably contains, in the image-recording layer thereof, an infrared absorber, which is a sensitizing dye showing an absorption maximum in this wavelength range. The light source of 300 to 450 nm is preferably a semiconductor laser. The light source of 750 to 1400 nm is preferably a solid-state laser or semiconductor laser capable of emitting infrared radiation. The infrared laser preferably has an output of 100 mW or larger, exposure time per pixel is preferably 20 microseconds or shorter, and exposure energy is preferably 10 to 300 mJ/cm$^2$. A multi-beam laser device is preferably used in order to shorten the exposure time. An exposure mechanism may be based on any of internal drum system, external drum system, and flat bed system.

The pattern-wise exposure may be proceeded by a general method using a plate setter, for example. When the on-machine development is adopted, the lithographic printing plate precursor may be set on a printing machine and may be exposed pattern-wise on the printing machine.

<Development>

The development may be implemented by (1) a method of development using a developer of pH2 to 14 (developer process), or (2) a method of development on a printing machine, while feeding fountain solution and/or ink (on-machine development).

(Developer Process)

In the developer process, the lithographic printing plate precursor is treated using the developer of pH2 to 14, so as to remove the unexposed area of the image-recording layer, and thereby lithographic printing plate is manufactured.

In a general process of development using a strong alkaline developer (pH12 or above), the protective layer is removed by pre-water washing, subjected to alkaline development, post-water washing for removing alkali by water washing, gum solution treatment, and drying process, to thereby obtain the lithographic printing plate.

According to a first preferable embodiment of the present invention, the developer used herein has pH value of 2 to 14. In this embodiment, the developer preferably contains a surfactant or water-soluble polymer compound, so as to concomitantly allow the development and gum solution treatment to proceed. Accordingly, the post-water washing is not indispensable, and the development and the gum solution treatment may be proceeded in a single solution.

Also the pre-water washing is not indispensable, so that also the removal of the protective layer may be proceeded concomitantly with the gum solution treatment. In the method of manufacturing the lithographic printing plate of the present invention, the development and gum solution treatment is preferably followed by removal of excessive developer using a squeeze roller for example, and drying.

The development by developer in the lithographic printing plate precursor of the present invention may be proceeded as usual at 0 to 60° C., preferably 15 to 40° C. or around, typically by a method of dipping the exposed lithographic printing plate precursor into a developer followed by rubbing with a brush, or a method of spraying a developer followed by rubbing with a brush.

The development using the developer is successfully implemented on an automatic processor, equipped with a developer feeder and a rubbing member. The automatic processor having rotating brush rollers as the rubbing member is particularly preferable. The automatic processor preferably has a unit for removing excessive developer, such as squeeze rollers, and a drying unit such as a hot air blower, on the downstream side of the developing unit. Moreover, the automatic processor may have a pre-heating unit for heating the exposed lithographic printing plate precursor, on the upstream side of the developing unit.

An example of automatic processor used for the method of manufacturing a lithographic printing plate of the present invention will be briefed below, referring to FIG. 2.

Figure 2:
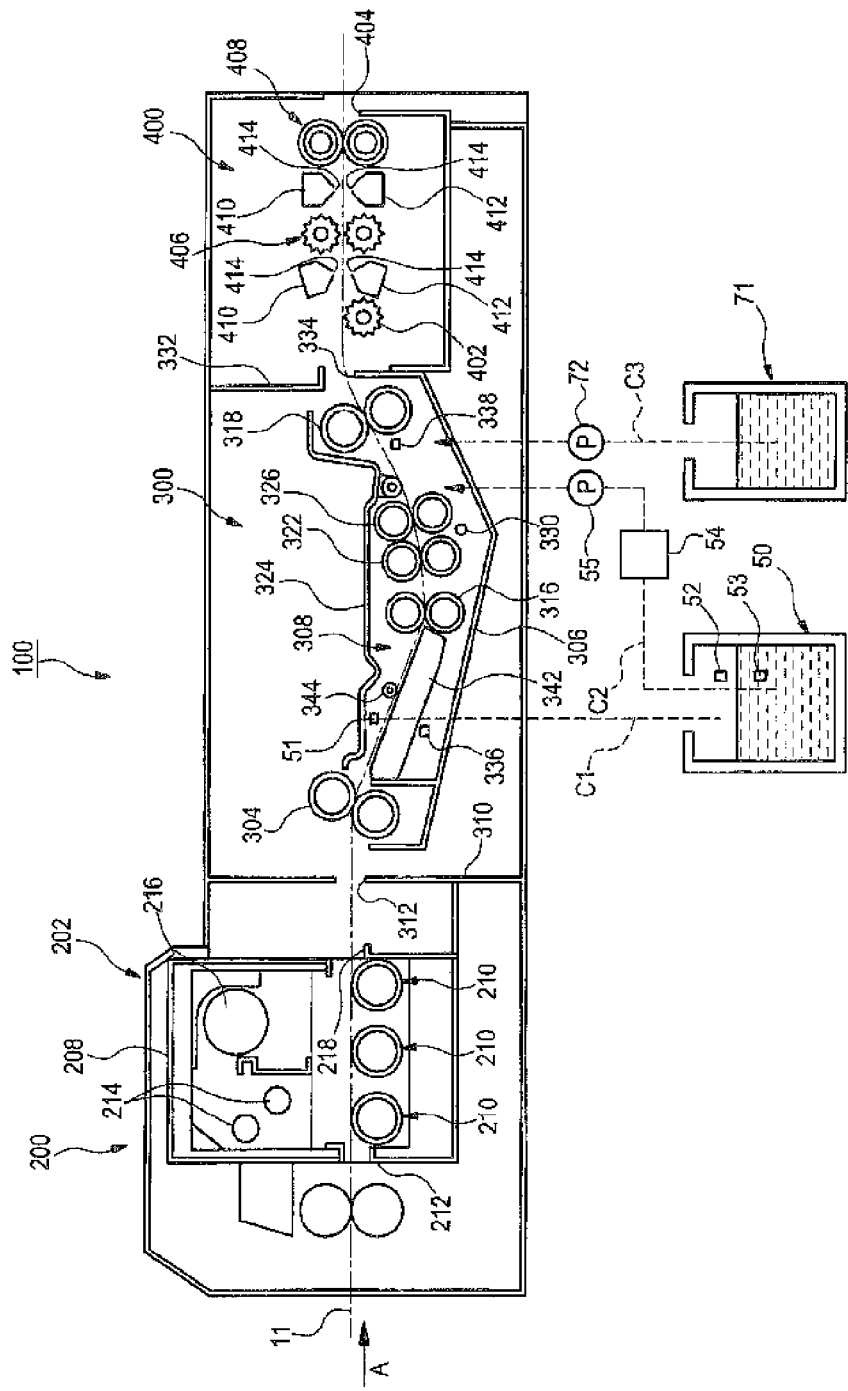
FIG. 2 is an explanatory drawing illustrating another exemplary configuration of the automatic processor.

The automatic processor 100 illustrated in FIG. 2 is composed of a chamber shaped by an equipment frame 202, and has a pre-heating section 200, a developing section 300 and a drying section 400 aligned in line in the direction of a feed path 11 along which the lithographic printing plate precursor is fed (indicated by arrow A).

The pre-heating section 200 has a heating chamber 208 with a feeding port 212 and an output port 218, and has tandem rollers 210, heaters 214 and a circulating fan 216 arranged therein.

The developing section 300 is partitioned by an outer panel 310 from the pre-heating section 200, and the outer panel 310 has an insertion slit 312.

Inside the developing section 300, there is provided a process tank 306 having therein a developing tank 308 filled with a developer, and an insertion roller pair 304 for guiding the lithographic printing plate precursor into the process tank 306. The upper portion of the developing tank 308 is covered with a shielding lid 324.

Inside the developing tank 308, there is provided a guide roller 344 and a guiding member 342, an immersed roller pair 316, a brush roller pair 322, a brush roller pair 326, and an output roller pair 318 which are aligned in sequence from the upstream side of the feeding direction. The lithographic printing plate precursor brought into the developing tank 308 is dipped in the developer, and allowed to pass through the rotating brush roller pairs 322, 326, to be removed with the non-image-forming area.

Below the brush roller pairs 322, 326, there is provided a spray pipe 330. The spray pipe 330 is connected to a pump (not illustrated), and the developer in the developing tank 308 sucked up by the pump is ejected through the spray pipe 330 into the developing tank 308.

On the sidewall of the developing tank 308, there is provided an overflow port 51 opened at the top end portion of a first circulating pipe C1, so as to allow an excessive portion of the developer to flow into the overflow port 51, run down through the first circulating pipe C1, to be discharged into an external tank 50 provided outside the developing section 300.

The external tank 50 is connected to a second circulating pipe C2. The second circulating pipe C2 is provided with a filter unit 54 and a developer feed pump 55. By the developer feed pump 55, the developer is fed from the external tank 50 to the developing tank 308. The external tank 50 is provided with a upper level gauge 52 and a lower level gauge 53.

The developing tank 308 is connected through a third circulating pipe C3 to a supplementary water tank 71. The third circulating pipe C3 is provided with a water supplement pump 72 by which water reserved in the supplementary water tank 71 is fed to the developing tank 308.

A liquid temperature sensor 336 is provided on the upstream side of the immersed roller pair 316, and a level gauge 338 is provided on the upstream side of the output roller pair 318.

A partition board 332 placed between the developing section 300 and the drying section 400 has an insertion slit 334 provided thereto. On a path between the developing section 300 and the drying section 400, there is provided a shutter (not illustrated) which closes the path when the lithographic printing plate precursor 11 does not travel on the path.

The drying section 400 has a support roller 402, ducts 410, 412, a feed roller pair 406, ducts 410, 412, and a feed roller pair 408 aligned therein in sequence. Each of the ducts 410, 412 has a slit hole 414 provided to the tip thereof. The drying section 400 has provided thereto an unillustrated drying unit such as a hot air blower, heat generator or the like. The drying section 400 has a discharge port 404, through which the lithographic printing plate dried by the drying unit is ejected.

In the present invention, the developer used for the development by developer is preferably an aqueous solution of pH2 to 14, or contains a surfactant. The developer is preferably an aqueous solution mainly composed of water (with a water content of 60% by mass or more), wherein an aqueous solution containing a surfactant (anionic, nonioic, cationic, amphoritic ion-based, etc.), or an aqueous solution containing a water-soluble polymer compound is particularly preferable. Also an aqueous solution containing both of surfactant and water-soluble polymer compound is preferable. The developer is preferably pH3.5 to 13, more preferably pH6 to 13, and particularly pH6.5 to 10.5. In particular, for the case where the developer of pH2.0 to 10.0 is used, it is difficult to concomitantly preventing all of staining resistance, printing durability, and long-term staining resistance from degrading. The reason why may be explained as below. When species of the developer is tried to change, while leaving the material for composing the lithographic printing plate precursor unchanged, the developer of pH2.0 to 10.0 will degrade the staining resistance of the unexposed area, as compared with the case where the conventional alkali developer of pH12 to 13 was used.

The anionic surfactant used for the developer in the present invention is not specifically limited and is preferably selectable from fatty acid salts, abietate salts, hydroxyalkanesulfonate salts, alkanesulfonate salts, dialkylsulfosuccinate salts, straight-chain alkylbenzenesulfonate salts, branched alkylbenzenesulfonate salts, alkylnaphthalenesulfonate salts, alkyl diphenyl ether (di)sulfonate salts, alkylphenoxypolyoxyethylenealkylsulfonate salts, polyoxyethylenealkylsulfophenyl ether salts, sodium salts of N-alkyl-N-oleyltaurin, disodium salts of N-alkyl sulfolsuccinate monoamide, petroleum sulfonate salts, sulfated castor oil, sulfated beef tallow, sulfate ester salts of fatty acid alkyl ester, alkyl sulfate ester salts, polyoxyethylenealkyl ether sulfate ester salts, fatty acid monoglyceride sulfate ester salts, polyoxyethylenealkylphenyl ether sulfate ester salts, polyoxyethylenestyrylphenyl ether sulfate ester salts, alkylphosphoester salts, polyoxyethylenealkyl ether phosphoester salts, polyoxyethylenealkylphenyl ether phosphoester salts, partially saponified styrene-maleic anhydride copolymer, partially saponified olefin-maleic anhydride copolymer, and naphthalene sulfonate salt-formalin condensates. Among them, alkylbenzenesulfonate salts, alkylnaphthalenesulfonate salts, and alkyldiphenyl ether (di)sulfonate salts are particularly preferable.

The cationic surfactant used for the developer in the present invention is arbitrarily selectable from those known in the art, without special limitation. The examples include alkylamine salts, quaternary ammonium salts, alkylimidazolinium salt, polyoxyethylene alkylamine salts, and polyethylene polyamine derivative.

The nonionic surfactant used for the developer in the present invention is not specifically limited, and is selectable from ethylene oxide adduct of polyethylene glycol-type higher alcohol, ethylene oxide adduct of alkylphenol, ethylene oxide adduct of alkylnaphthol, ethylene oxide adduct of phenol, ethylene oxide adduct of naphthol, ethylene oxide adduct of fatty acid, ethylene oxide adduct of polyhydric alcohol fatty acid ester, ethylene oxide adduct of higher alkylamine, ethylene oxide adduct of fatty acid amide, ethylene oxide adduct of fat, ethylene oxide adduct of polypropylene glycol, dimethylsiloxane-ethylene oxide block copolymer, dimethylsiloxane-(propylene oxide-ethylene oxide) block copolymer, fatty acid ester of polyhydric alcohol-type glycerol, fatty acid ester of pentaerythritol, fatty acid ester of sorbitol and sorbitan, fatty acid ester of sucrose, polyhydric alcohol alkyl ether, and fatty acid amide of alkanolamines. Among them, those having an aromatic ring and an ethylene oxide chain are preferable, and more preferable examples include ethylene oxide adduct of alkyl substituted or unsubstituted phenol, or ethylene oxide adduct of alkyl substituted or unsubstituted naphthol.

The ampholytic ion-based surfactant used for the developer in the present invention is not specifically limited, and is selectable from amine oxide-based surfactant such as alkyldimethylamine oxide; betaine-based surfactant such as alkyl betaine; and amino acid-based surfactant such as sodium salt of alkylaminofatty acid. In particular, alkyl dimethylamine oxide which may have a substituent group, alkyl carboxybetaine which may have a substituent group, and alkyl sulfobetaine which may have a substituent group are preferably used. More specifically, the compounds represented by the formula (2) in paragraph [0256] of Japanese Laid-Open Patent Publication No. 2008-203359; the compounds represented by the formula (I), formula (II) and formula (VI) in paragraph [0028] of Japanese Laid-Open Patent Publication No. 2008-276166; and the compounds described in paragraphs [0022] to [0029] of Japanese Laid-Open Patent Publication No. 2009-47927 may be used Two or more species of the surfactant may be used in the developer. The content of the surfactant contained in the developer is preferably 0.01 to 20% by mass, and more preferably 0.1 to 10% by mass.

Examples of the water-soluble polymer compound used for the developer in the present invention include soybean polysaccharides, modified starch, gum arabic, dextrin, cellulose derivative (carboxymethyl cellulose, carboxyethyl cellulose, methyl cellulose, etc.) and modified product thereof, pullulan, polyvinyl alcohol and derivative thereof, polyvinylpyrrolidone, polyacrylamide and acrylamide copolymer, vinyl methyl ether/maleic anhydride copolymer, vinyl acetate/maleic anhydride copolymer, styrene/maleic anhydride copolymer, polyvinylsulfonic acid and salt thereof, and polystyrenesulfonic acid and salt thereof.

The soybean polysaccharides are selectable from those known in the art, such as those commercially available under the trade name of Soyafive (from Fuji Oil Co. Ltd.) with a variety of grades. Among them, those showing a viscosity of a 10% by mass aqueous solution of 10 to 100 mPa/sec are preferably used.

Also the modified starch is selectable from those known in the art, which may be prepared for example by decomposing starch derived from corn, potato, tapioca, rice, wheat or the like by acid or enzyme, so as to give molecules having 5 to 30 glucose residues, and by adding thereto oxypropylene in an alkaline solution.

Two or more species of the water-soluble polymer compounds may be used in the developer. The content of the water-soluble polymer compound in the developer is preferably 0.1 to 20% by mass, and more preferably 0.5 to 10% by mass.

The developer used in the present invention may contain a pH buffering agent. For the developer of the present invention, the pH buffering agent is arbitrarily selectable without special limitation, so long as it exhibits a buffering action, in the range from pH2 to 14. In the present invention, a weak alkaline buffering agent is preferably used, wherein the examples include (a) carbonate ion and hydrogen carbonate ion, (b) borate ion, (c) water-soluble amine compound and ion thereof, and combination of these ions. More specifically, (a) combination of carbonate ion and hydrogen carbonate ion, (b) borate ion, or (c) combination of water-soluble amine compound and ion thereof, for example, exhibits a pH buffering action in the developer, capable of suppressing pH from fluctuating even if the developer is used over a long period, and is therefore capable of suppressing degradation in the developability and generation of development scum due to fluctuation in pH. In the method of manufacturing the lithographic printing plate of the present invention, the combination of carbonate ion and hydrogen carbonate ion is particularly preferable.

In order to allow carbonate ion and hydrogen carbonate ion to reside in the developer, one possible method is to add a carbonate salt and a hydrogen carbonate salt into the developer, and another method is to adjust pH after the carbonate salt or hydrogen carbonate salt are added, so as to generate carbonate ion or hydrogen ion. While the carbonate salt and the hydrogen carbonate salt are not specifically limited, alkali metal salt is preferable. The alkali metal is exemplified by lithium, sodium, and potassium, wherein sodium is particularly preferable. The alkali metal may be used alone, or in combination of two or more species.

Total content of carbonate ion and hydrogen carbonate ion is preferably 0.05 to 5 mol/L in the developer, more preferably 0.07 to 2 mol/L, and particularly 0.1 to 1 mol/L.

The developer used in the present invention may contain an organic solvent. Examples of the organic solvent adoptable herein include aliphatic hydrocarbons (hexane, heptane, Isopar E, Isopar H, Isopar G (from Esso), etc.), aromatic hydrocarbon (toluene, xylene, etc.), halogenated hydrocarbon (methylene dichloride, ethylene dichloride, trichloroethylene, monochlorobenzene, etc.), and polar solvent. Examples of the polar solvent include alcohols (methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methylphenyl carbinol, n-amyl alcohol, methylamyl alcohol, etc.); ketones (acetone, methyl ethyl ketone, ethyl butyl ketone, methyl isobutyl ketone, cyclohexanone, etc.); esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate, etc.); and others (triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide, N-methylpyrrolidone, etc.).

Two or more species of the organic solvent may be contained in the developer. If the organic solvent is not water-soluble, it may be used after solubilizing it into water with the aid of the surfactant or the like. When the developer contains the organic solvent, the content of the organic solvent is preferably less than 40% by mass, from the viewpoint of safety and inflammability.

Besides the above-described components, the developer of the in the present invention may also contain antiseptic, chelating compound, defoamer, organic acid, inorganic acid, inorganic salt and so forth. More specifically, the compounds described in paragraphs [0266] to [0270] of Japanese Laid-Open Patent Publication No. 2007-206217 are preferably used.

In the present invention, the developer may be used both as a developer and a supplementary developer for the lithographic printing plate precursor. It is also preferably adoptable to the automatic processor described in the above. In the process of development on the automatic processor, since the developer is exhausted with the progress of development, so that the supplementary solution or fresh developer may be used to restore the process capacity.

<On-machine Development System>

In the on-machine development system, the lithographic printing plate precursor after pattern-wise exposure is fed, on a printing machine, with an oil-based ink and water-based component, so as to remove the image-recording layer selectively in the non-image-forming area, to thereby give a lithographic printing plate.

More specifically, the lithographic printing plate precursor is exposed pattern-wise and then set on the printing machine without development, or, the lithographic printing plate precursor is set on the printing machine and then exposed pattern-wise on the printing machine. Next, printing is started by feeding the oil-based ink and the water-based component. In the non-image-forming area, the uncured image-recording layer is removed in the early stage of printing, by dissolution or dispersion with the aid of the oil-based ink and/or water-based component fed thereto, and thereby the hydrophilic surface exposes in the area. On the other hand, in the light-exposed area, the image-recording layer cured by exposure forms an acceptance sites for oil-based ink where a lipophilic surface exposes. While it is arbitrary which of the oil-based ink and the water-based component is the first to be fed onto the surface of plate, it is more preferable to feed the oil-based ink first, in view of preventing the water-based component from being contaminated by components of the removed image-recording layer. In this way, the lithographic printing plate precursor is developed on the printing machine, and is directly used in a large number of impressions. The oil-based ink and the water-based component are preferably a printing ink and fountain solution, respectively, which are used for general planographic printing.

In the method of manufacturing a lithographic printing plate from a lithographic printing plate precursor according to the present invention, the entire surface of the lithographic printing plate precursor may be heated before exposure, or during exposure, or between exposure and development, irrespective of the development style. By the heating, the image forming reaction in the image-recording layer may be accelerated, to thereby advantageously improve the sensitivity and printing durability, and stabilize the sensitivity. For the development by developer, it is also effective to subject the developed plate to post-heating or exposure over the entire surface, aiming at improving the strength of the image-forming area and printing durability. In general, the pre-heating is preferably proceeded under a mild condition typically at 150° C. or lower. Too high temperature may result in curing of the non-image-forming area. On the other hand, the post-heating after development needs a very strong condition, typically at 100 to 500° C. Too low temperature may result in insufficient strength of the image-forming area, whereas too high temperature may degrade the support, or decompose the image-forming area.

EXAMPLE

Features of the present invention will further be detailed referring to Examples. Note that the amount of use, ratio, details of processes, and procedures of processes described in Examples below may be arbitrarily modified, without departing from the spirit of the present invention. The scope of the present invention is, therefore, not restrictively understood by the specific examples described below.

(A) Synthesis Example

<Synthesis of Polymers P-5 to P-13>

A 500-ml three-neck flask was charged with vinylphosphonic acid (15.8 g), [3-(methacryloylamino)propyl] dimethyl-(3-sulfopropyl)ammoniumbetaine inner salt (17.9 g), 2-methacrylamide ethylamine (11.3 g), and distilled water (240 g), and the mixture was heated with stirring for 10 minutes at 55° C. under a stream of nitrogen gas. Then, a solution of VA-046B (1.4 g) (from Wako Pure Chemical Industries, Ltd.) dissolved in distilled water (40 g) was added dropwise over 3 hours. Then, VA-046B (1.4 g) (from Wako Pure Chemical Industries, Ltd.) was added, and the mixture was heated at 80° C. for 3 hours, and then cooled after completion of heating. The resulting polymer solution was adjusted to pH 9.7 by adding NaOH. Then, 4-hydroxy-tetramethylpiperidinyloxy (4-OH-TEMPO) (0.2 g) (from Tokyo Chemical Industry Co., Ltd.) was added, and the mixture was heated to 55° C., and reacted with itaconic anhydride (30.0 g) at 55° C. for 6 hours. Then, the mixture was extracted with ethyl acetate (500 g), and the lower layer was collected. To the collected lower layer was added the ion exchange resin Amberlyst 15 (15 g) (from Aldrich), and the mixture was filtered to give an aqueous solution of polymer P-5.

Further, P-6 to P-13 were synthesized by using citraconic anhydride, maleic anhydride, 2,3-dimethylmaleicanhydride, 1-cyclohexene-1,2-dicarboxylic anhydride, cis-4-cyclohexene-1,2-dicarboxylic anhydride, 5-norbornene-2,3-dicarboxylic anhydride, exo-3,6-epoxy-1,2,3,6-tetrahydrophthalic anhydride, and allylsuccinic anhydride respectively in place of itaconic anhydride.

<Synthesis of Polymer P-29>

A 500-ml three-neck flask was charged with vinylphosphonic acid (19.5 g), 2-acrylamide-2-methylpropanesulfonic acid (14.9 g), maleic anhydride (10.6 g), and N-methylpyrrolidone (180 g), and the mixture was heated with stirring for 10 minutes at 75° C. under a stream of nitrogen gas. Then, a solution of V-601 (1.4 g) (from Wako Pure Chemical Industries, Ltd.) dissolved in N-methylpyrrolidone (30 g) was added dropwise over 3 hours. Then, V-601 (1.4 g) was added, and the mixture was heated at 90° C. for 3 hours, and then cooled after completion of heating. The resulting polymer solution was adjusted to pH 9.7 by adding a 1N NaOH aqueous solution. Then, 4-OH-TEMPO (0.2 g) was added, and the mixture was heated to 55° C., and reacted with 2-methacrylamide ethylamine (30 g) at 55° C. for 3 hours. Then, the mixture was extracted with water (200 g) and ethyl acetate (800 g), and the lower layer was collected. To the collected lower layer was added the ion exchange resin Amberlyst 15 (15 g), and the mixture was filtered to give an aqueous solution of P-29.

Other polymers of the present invention were also synthesized in the same manner.

(B) Lithographic Printing Plates (1) Preparation of Lithographic Printing Plate Precursors

[Preparation of Aluminum Substrate 1]

An aluminum plate having a thickness of 0.3 mm (grade: JIS A1050) was degreased using an aqueous solution of 10% by mass of sodium aluminate at 50° C. for 30 seconds to remove the rolling oil on the surface, and then grained on the aluminum surface using three nylon brushes containing bunches of bristles having a diameter of 0.3 mm and an aqueous suspension of a pumice having a median diameter of 25 μm (specific gravity 1.1 g/cm$^3$), and thoroughly washed with water. This plate was etched by immersion in an aqueous solution of 25% by mass of sodium hydroxide at 45° C. for 9 seconds, and washed with water, and then further immersed in an aqueous solution of 20% by mass of nitric acid at 60° C. for 20 seconds, and washed with water. The amount of the grained surface etched here was about 3 g/m$^2$.

Then, the plate was continuously subjected to an electrochemical surface-roughening treatment using 60 Hz AC voltage. The electrolyte used here was an aqueous solution of 1% by mass of nitric acid (containing 0.5% by mass of aluminum ions) at a temperature of 50° C. The electrochemical surface-roughening treatment took place using a carbon counter electrode and an AC power supply generating a trapezoidal wave where the time required for the current value to reach the peak from zero TP was 0.8 msec and the duty ratio was 1:1. An auxiliary ferrite anode was used. The peak current density was 30 A/dm$^2$, and 5% of the current from the power supply was shunted to the auxiliary anode. The quantity of electricity in the electrolysis in nitric acid was 175 C/dm$^2$ when the aluminum plate acted as an anode. Then, the plate was washed with water by spraying.

Then, the plate was subjected to an electrochemical surface-roughening treatment in the same manner as the electrolysis in nitric acid except that an aqueous solution of 0.5% by mass of hydrochloric acid (containing 0.5% by mass of aluminum ions) was used as an electrolyte at a temperature of 50° C. and the quantity of electricity was 50 C/dm$^2$ when the aluminum plate acted as an anode, and then the plate was washed with water by spraying. This plate was subjected to an anodic oxidation treatment using a DC power supply at a current density of 15 A/dm$^2$ and an aqueous solution of 15% by mass of sulfuric acid (containing 0.5% by mass of aluminum ions) as an electrolyte to form an anodic oxide coating of 2.5 g/m$^2$, then washed with water, and dried to prepare aluminum substrate 1.

The center line average roughness (Ra) of the substrate obtained in this manner was determined to be 0.51 μm using a needle having a diameter of 2 μm.

[Preparation of Aluminum Substrate 2]

The aluminum substrate 1 was treated in an aqueous solution of 1% by mass of sodium silicate at 20° C. for 10 seconds to prepare aluminum substrate 2. Its surface roughness was determined to be 0.54 μm (expressed as Ra according to JIS B0601).

[Preparation of Aluminum Substrate 3]

An aluminum plate having a thickness of 0.24 mm (grade 1050, temper H16) was degreased by immersion in an aqueous solution of 5% sodium hydroxide kept at 65° C. for 1 minute, and then washed with water. This aluminum plate was neutralized by immersion in an aqueous solution of 10% hydrochloric acid kept at 25° C. for 1 minute, and then washed with water. Then, this aluminum plate was subjected to an electrolytic surface-roughening treatment using AC at a current density of 100 A/dm$^2$ in an aqueous solution of 0.3% by mass of hydrochloric acid at 25° C. for 60 seconds, and then desmutted in an aqueous solution of 5% sodium hydroxide kept at 60° C. for 10 seconds. This aluminum plate was subjected to an anodic oxidation treatment in an aqueous solution of 15% sulfuric acid at 25° C. under conditions of a current density of 10 A/dm$^2$ and a voltage of 15 V for 1 minute to prepare an aluminum substrate. Its surface roughness was determined to be 0.44 μm (expressed as Ra according to JIS B0601).

[Formation of a Primer Layer]

A coating solution for primer layer having the composition shown below was applied using a bar coater, and dried at 100° C. for 1 minute to form a primer layer. The coating mass of the primer layer was 12 mg/m$^2$ after drying.

<Coating Solution for Primer Layer>

| <Coating solution for primer layer> | |
| --- | --- |
| One of the polymers or the polymers for comparison indicated in the tables below | 0.50 g |
| Methanol | 90.0 g |
| Pure water | 10.0 g |

[Formation of Image-recording Layer 1]

A coating solution for image-recording layer 1 having the composition shown below was applied using a bar coater, and then dried in an oven at 90° C. for 60 seconds to form image-recording layer 1 having a coating mass of 1.3 g/m$^2$ after drying.

| <Coating solution for image-recording layer 1> | |
| --- | --- |
| Binder polymer (1) shown below (mass average molecular weight: 80,000) | 0.34 g |
| Polymerizable compound (1) shown below (PLEX6661-O from Degussa Japan Co., Ltd.) | 0.68 g |
| Sensitizing dye (1) shown below | 0.06 g |
| Polymerization initiator (1) shown below | 0.18 g |
| Chain transfer agent (1) shown below | 0.02 g |
| Dispersion of a ε-phthalocyanine pigment (containing 15 parts by mass of the pigment, 10 parts by mass of a dispersant (allyl methacrylate/methacrylic acid copolymer (mass average molecular weight: 60,000, molar ratio: 83/17)), and 15 parts by mass of cyclohexanone) | 0.40 g |
| Thermal polymerization inhibitor (N-nitrosophenylhydroxylamine aluminum salt) | 0.01 g |
| Fluorosurfactant (1) shown below (mass average molecular weight: 10,000) | 0.001 g |
| Polyoxyethylene-polyoxypropylene condensate (Pluronic L44 from ADEKA) | 0.02 g |
| Dispersion of a yellow pigment (containing 15 parts by mass of the yellow pigment Novoperm Yellow H2G (from Clariant), 10 parts by mass of a dispersant (allyl methacrylate/methacrylic acid copolymer (mass average molecular weight: 60,000, molar ratio: 83/17)), and 15 parts by mass of cyclohexanone) | 0.04 g |
| 1-Methoxy-2-propanol | 3.5 g |
| Methyl ethyl ketone | 8.0 g |

Binder polymer(1)

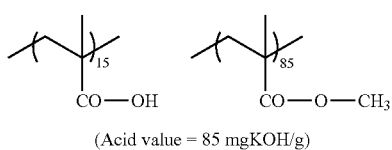

(Acid value = 85 mgKOH/g)

Polymerizable compound(1)

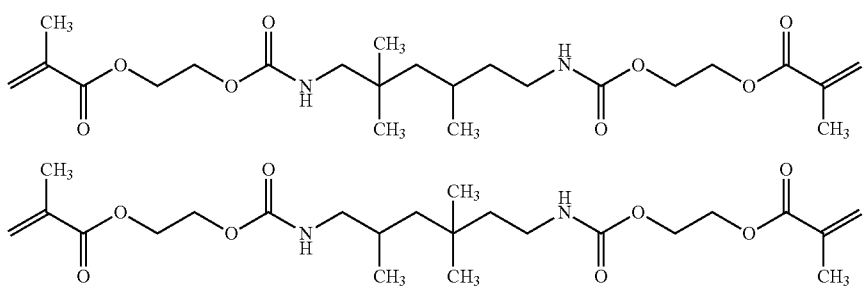

[Mixture of the isomer]

Sensitizing dye(1)

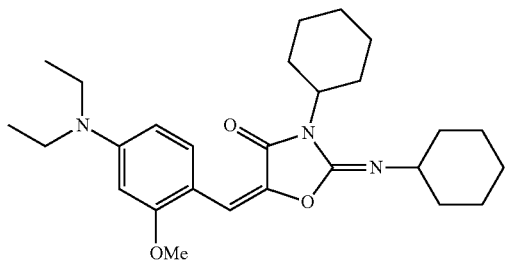

Polymerization initiator(1)

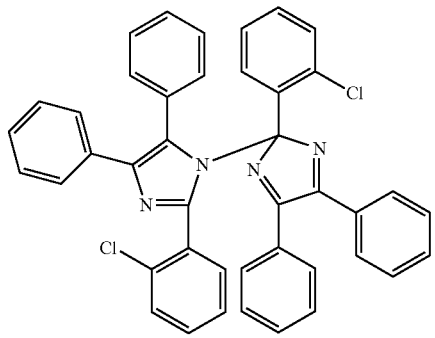

Chain transfer agent(1)

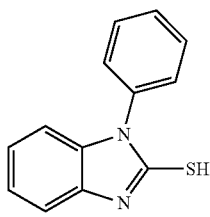

Fluorosurfactant(1)

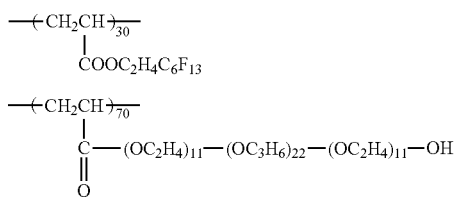

[Formation of Image-recording Layer 2]

A coating solution for image-recording layer 2 having the composition shown below was applied using a bar coater, and then dried in an oven at 90° C. for 60 seconds to form image-recording layer 2 having a coating mass of 1.3 g/m² after drying.

| <Coating solution for image-recording layer 2> | |
|---|---|
| Binder polymer (1) shown above (mass average molecular weight: 50,000) | 0.04 g |
| Binder polymer (2) shown below (mass average molecular weight: 80,000) | 0.30 g |
| Polymerizable compound (1) shown above (PLEX6661-O from Degussa Japan Co., Ltd.) | 0.17 g |
| Polymerizable compound (2) shown below | 0.51 g |
| Sensitizing dye (2) shown below | 0.03 g |
| Sensitizing dye (3) shown below | 0.015 g |
| Sensitizing dye (4) shown below | 0.015 g |
| Polymerization initiator (1) shown above | 0.13 g |

-continued

| <Coating solution for image-recording layer 2> | |
|---|---|
| Chain transfer agent: mercaptobenzothiazole | 0.01 g |
| Dispersion of a ε-phthalocyanine pigment (containing 15 parts by mass of the pigment, 10 parts by mass of a dispersant (allyl methacrylate/methacrylic acid copolymer (mass average molecular weight: 60,000, molar ratio: 83/17)), and 15 parts by mass of cyclohexanone) | 0.40 g |
| Thermal polymerization inhibitor (N-nitrophenylhydroxylamine aluminum salt) | 0.01 g |
| Fluorosurfactant (1) shown above (mass average molecular weight: 10,000) | 0.001 g |
| 1-Methoxy-2-propanol | 3.5 g |
| Methyl ethyl ketone | 8.0 g |

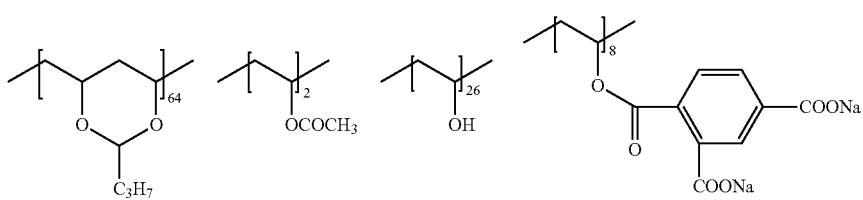
(Acid value = 65 mgKOH/g)
Binder polymer (2)
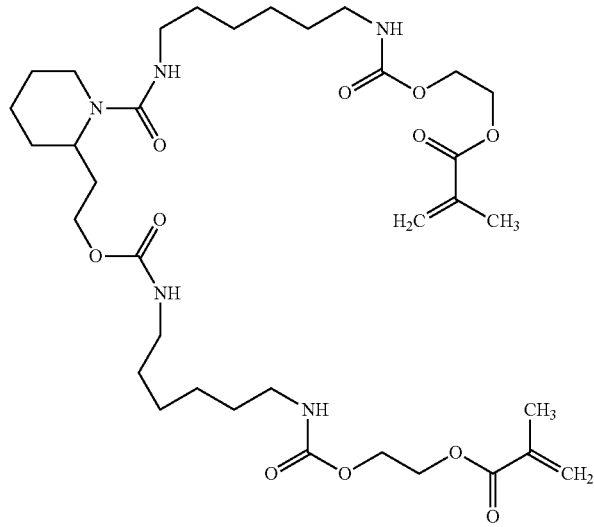
Polymerizable compound
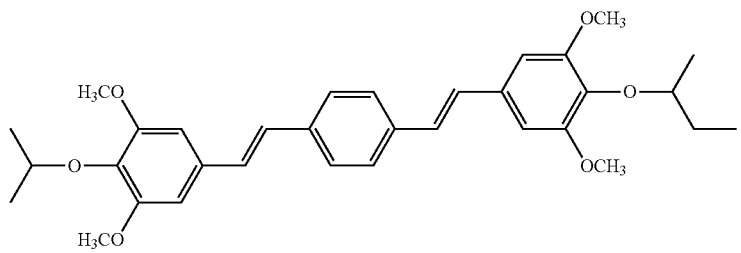
Sensitizing dye (2)
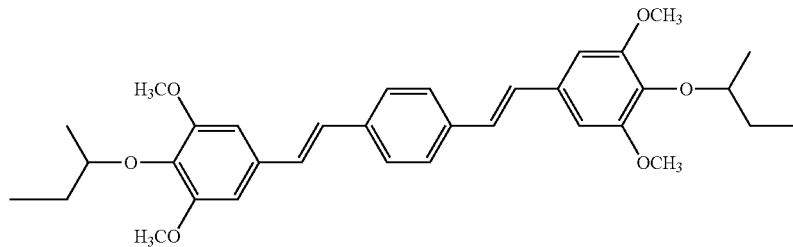
Sensitizing dye (3)
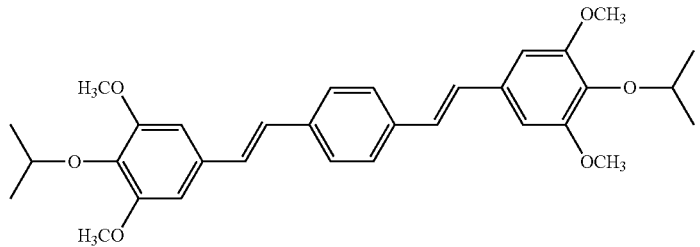
Sensitizing dye (4)

[Formation of Image-recording Layer 3]

A coating solution for image-recording layer 3 having the composition shown below was applied using a bar coater, and then dried in an oven at 100° C. for 60 seconds to form image-recording layer 3 having a coating mass of 1.0 g/m² after drying. The coating solution for image-recording layer 3 was prepared by mixing the sensitizer solution (1) and hydrophobizing solution (1) shown below and stirring the mixture immediately before it was applied.

| <Sensitizer solution (1)> | |
|---|---|
| Binder polymer (3) shown below | 0.162 g |
| IR absorber (1) shown below | 0.030 g |
| Polymerization initiator (3) shown below | 0.162 g |
| Polymerizable compound (ARONIX M215 from Toagosei Co., Ltd.) | 0.385 g |
| PIONIN A-20 (from TAKEMOTO OIL & FAT Co., Ltd.) | 0.055 g |
| Oil-sensitizer (1) shown below | 0.044 g |
| Fluorosurfactant (1) shown above | 0.008 g |
| Methyl ethyl ketone | 1.091 g |
| 1-Methoxy-2-propanol | 8.609 g |
| <Hydrophobizing soluion (1)> | |
| Aqueous dispersion of hydrophobizing agent (1) shown below | 2.640 g |
| Distilled water | 2.425 g | dropwise via the dropping funnel over about one hour. After completion of the dropwise addition, the reaction was continued for 5 hours, and then unreacted monomers were removed by steam distillation. Then, the mixture was cooled and adjusted to pH 6 with aqueous ammonia, and finally pure water was added to reduce non-volatiles to 15% by mass, thereby giving an aqueous dispersion of hydrophobizing agent (1) consisting of polymer microparticles. The particle size distribution of the polymer microparticles had a maximum at a particle size of 60 nm.

The particle size distribution was determined by taking an electron micrograph of the polymer microparticles and measuring the particle size of a total of 5000 microparticles on the photograph, and plotting the frequency of appearance of each of 50 particle sizes on a logarithmic scale from the maximum to zero of the measured particle sizes. The particle sizes of nonspherical particles were determined as the particle sizes of spherical particles having the same particle areas as those on the photograph.

[Formation of Protective Layer 1]

A coating solution for protective layer 1 having the composition shown below was applied using a bar coater at a coating mass of 0.75 g/m² after drying, and then dried at 125° C. for 70 seconds to form a protective layer.

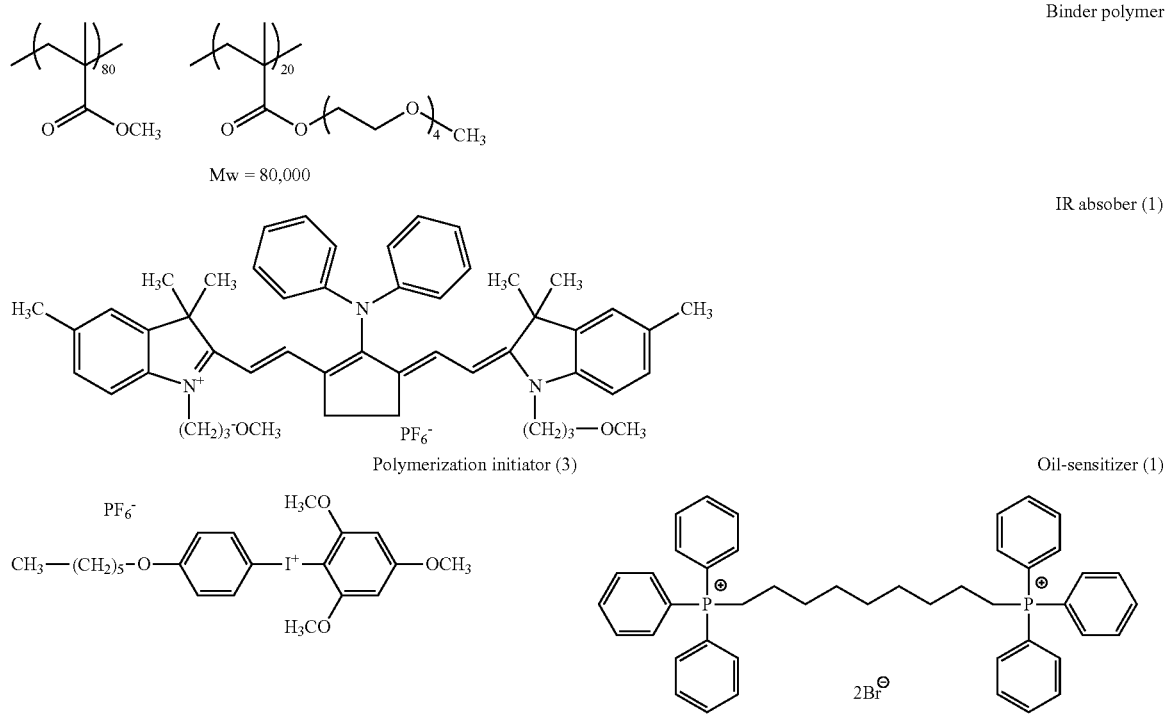

Binder polymer

Mw = 80,000

IR absober (1)

Polymerization initiator (3)

Oil-sensitizer (1)

(Preparation of an Aqueous Dispersion of Hydrophobizing Agent (1))

A 1000-ml four-neck flask equipped with a stirrer, a thermometer, a dropping funnel, a nitrogen inlet, and a reflux condenser was charged with distilled water (350 mL) under deoxygenation by nitrogen gas purging and heated until the internal temperature reached 80° C. To this were added sodium dodecylsulfate (1.5 g) as a dispersant, and ammonium persulfide (0.45 g) as an initiator, and then a mixture of glycidylmethacrylate (45.0 g) and styrene (45.0 g) was added

| <Coating solution for protective layer 1> | |
|---|---|
| Polyvinyl alcohol (degree of saponification: 98 mol %, degree of polymerization: 500) | 40 g |
| Polyvinylpyrrolidone (molecular weight: 50,000) | 5 g |
| Poly[vinylpyrrolidone/vinyl acetate (1/1)] (molecular weight: 70,000) | 0.5 g |
| Surfactant (EMALEX 710 from Nihon Emulsion Co., Ltd.) | 0.5 g |
| Water | 950 g |

[Formation of Protective Layer 2]

A coating solution for protective layer 2 having the composition shown below was applied using a bar coater at a coating mass of 0.75 g/m² after drying, and then dried at 125° C. for 70 seconds to form a protective layer.

| <Coating solution for a protective layer 2> | |
|---|---|
| Dispersion of inorganic laminar compound (1) described below | 1.5 g |
| Aqueous solution of 6% by mass of sulfonic acid-modified polyvinyl alcohol (CKS50 from The Nippon Synthetic Chemical Industry Co., Ltd. having a degree of saponification of 99 mol % or more and a degree of polymerization of 300) | 0.55 g |
| Aqueous solution of 6% by mass of polyvinyl alcohol (an aqueous solution of 6% by mass of PVA-405 from KURRAY CO., LTD. having a degree of saponification of 81.5 mol %, and a degree of polymerization of 500) | 0.03 g |
| Aqueous solution of 1% by mass of a surfactant (EMALEX 710 from Nihon Emulsion Co., Ltd.) | 0.86 g |
| Ion exchange water | 6.0 g |

(Preparation of a Dispersion of Inorganic Laminar Compound (1))

To 193.6 g of ion exchange water was added 6.4 g of the synthetic mica Somasif ME-100 (from Co-op Chemical Co., Ltd.), and the mixture was dispersed using a homogenizer until the average particle size (determined by laser scattering) reached 3 μm to prepare a dispersion of inorganic laminar compound (1). The resulting dispersed particles had an aspect ratio of 100 or more.

The aluminum substrates, primer layers, image-recording layers, and protective layers were combined as shown in the tables below to prepare lithographic printing plate precursors of Examples and Comparative examples. The polymers used in Comparative examples are shown below.

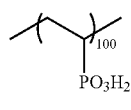
(R-1)

Mw = 20,000

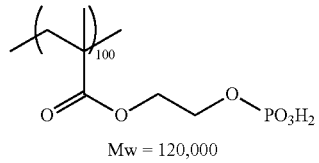
(R-2)

Mw = 120,000

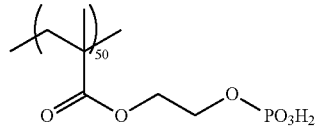
(R-3)

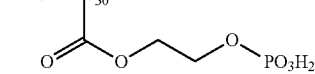

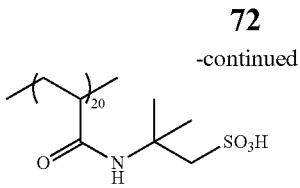

Mw = 180,000

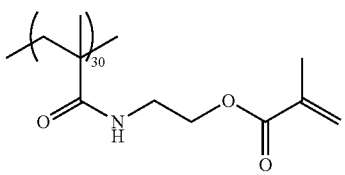

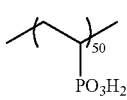
(R-4)

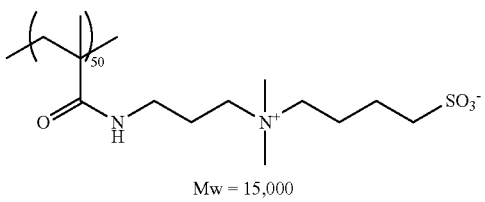

Mw = 15,000

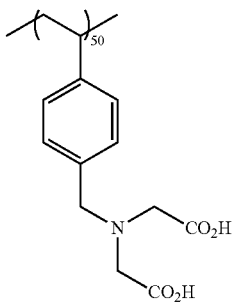
(R-5)

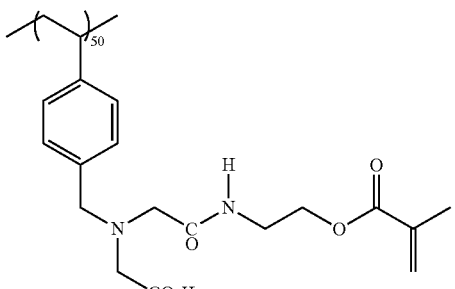

Mw = 130,000

TABLE 1

| Lithographic printing plate | Aluminum support | Specific polymer compound | Coating liquid for forming image-recording layer | Coating liquid for forming protective layer |
|---|---|---|---|---|
| A-1 | 1 | P-1 | 1 | 1 |
| A-2 | 1 | P-2 | 1 | 1 |
| A-3 | 1 | P-3 | 1 | 1 |
| A-4 | 1 | P-4 | 1 | 1 |
| A-5 | 1 | P-5 | 1 | 1 |

TABLE 1-continued

| Lithographic printing plate | Aluminum support | Specific polymer compound | Coating liquid for forming image-recording layer | Coating liquid for forming protective layer |
|---|---|---|---|---|
| A-6 | 1 | P-6 | 1 | 1 |
| A-7 | 1 | P-7 | 1 | 1 |
| A-8 | 1 | P-8 | 1 | 1 |
| A-9 | 1 | P-9 | 1 | 1 |
| A-10 | 1 | P-10 | 1 | 1 |
| A-11 | 1 | P-11 | 1 | 1 |
| A-12 | 1 | P-12 | 1 | 1 |
| A-13 | 1 | P-13 | 1 | 1 |
| A-14 | 1 | P-14 | 1 | 1 |
| A-15 | 1 | P-15 | 1 | 1 |
| A-16 | 1 | P-16 | 1 | 1 |
| A-17 | 1 | P-17 | 1 | 1 |
| A-18 | 1 | P-18 | 1 | 1 |
| A-19 | 1 | P-19 | 1 | 1 |
| A-20 | 1 | P-20 | 1 | 1 |
| A-21 | 1 | P-21 | 1 | 1 |
| A-22 | 1 | P-22 | 1 | 1 |
| A-23 | 1 | P-23 | 1 | 1 |
| A-24 | 1 | P-24 | 1 | 1 |
| A-25 | 1 | P-25 | 1 | 1 |
| A-26 | 1 | P-26 | 1 | 1 |
| A-27 | 1 | P-27 | 1 | 1 |
| A-28 | 1 | P-28 | 1 | 1 |
| A-29 | 1 | P-29 | 1 | 1 |
| A-30 | 1 | P-30 | 1 | 1 |
| A-31 | 1 | P-31 | 1 | 1 |
| A-32 | 1 | P-32 | 1 | 1 |
| A-33 | 1 | P-33 | 1 | 1 |
| A-34 | 1 | P-34 | 1 | 1 |
| A-35 | 1 | P-35 | 1 | 1 |
| A-36 | 1 | P-36 | 1 | 1 |
| A-37 | 1 | P-37 | 1 | 1 |
| A-38 | 1 | P-38 | 1 | 1 |
| A-39 | 1 | P-39 | 1 | 1 |
| A-40 | 1 | P-40 | 1 | 1 |
| A-55 | 1 | P-41 | 1 | 1 |
| A-56 | 1 | P-42 | 1 | 1 |
| A-57 | 1 | P-43 | 1 | 1 |
| A-58 | 1 | P-44 | 1 | 1 |
| A-59 | 1 | P-45 | 1 | 1 |

TABLE 2

| Lithographic printing plate | Aluminum support | Specific polymer compound | Coating liquid for forming image-recording layer | Coating liquid for forming protective layer |
|---|---|---|---|---|
| A-41 | 3 | P-5 | 2 | 1 |
| A-42 | 3 | P-6 | 2 | 1 |
| A-43 | 3 | P-14 | 2 | 1 |
| A-44 | 3 | P-27 | 2 | 1 |
| A-45 | 3 | P-29 | 2 | 1 |
| A-46 | 3 | P-30 | 2 | 1 |
| A-47 | 3 | P-36 | 2 | 1 |
| A-48 | 2 | P-5 | 3 | 2 |
| A-49 | 2 | P-6 | 3 | 2 |
| A-50 | 2 | P-14 | 3 | 2 |
| A-51 | 2 | P-27 | 3 | 2 |
| A-52 | 2 | P-29 | 3 | 2 |
| A-53 | 2 | P-30 | 3 | 2 |
| A-54 | 2 | P-36 | 3 | 2 |
| B-1 | 1 | R-1 | 1 | 1 |
| B-2 | 1 | R-2 | 1 | 1 |
| B-3 | 1 | R-3 | 1 | 1 |
| B-4 | 1 | R-4 | 1 | 1 |
| B-5 | 1 | R-5 | 1 | 1 |
| B-6 | 3 | R-2 | 2 | 1 |
| B-7 | 3 | R-4 | 2 | 1 |
| B-8 | 3 | R-5 | 2 | 1 |
| B-9 | 2 | R-4 | 3 | 2 |
| B-10 | 2 | R-5 | 3 | 2 |

(2) Evaluation of Lithographic Printing Plate Precursors

Examples 1 to 59 and Comparative Examples 1 to 11

[Exposure, Development and Printing]

Various lithographic printing plate precursors shown in the tables below were imagewise exposed using Violet semiconductor laser platesetter Vx9600 (incorporating an InGaN semiconductor laser (emission wavelength 405 nm±10 nm/output 30 mW)) from FUJIFILM Electronic Imaging Ltd. (FFEI). The imagewise exposure was performed using an FM screen (TAFFETA 20) from Fujifilm Corporation at a resolution of 2,438 dpi and a surface exposure dose of 0.05 mJ/cm² to attain a dot area fraction of 50%.

Then, the plate precursors were preheated at 100° C. for 30 seconds, and then the image was developed using the developers shown below in an automatic developing machine having a structure as shown in FIG. 2. The automatic developing machine was provided with one brush roll of 50 mm in outside diameter having polybutylene terephthalate bristles (bristle diameter 200 μm, bristle length 17 mm) and rotating in the same direction as the feed direction at 200 rpm (corresponding to a peripheral speed of 0.52 m/sec at the bristle tips of the brush). The temperature of the developers was 30° C. The lithographic printing plate precursors were fed at a feed speed of 100 cm/min. The developing step was followed by drying in a drying part. The drying temperature was 80° C. When developer 2 was used, the plate precursors were washed with water before the drying step after development.

The compositions of developers 1 to 5 are shown below. In the compositions below, Newcol B13 (from NIPPON NYUKAZAI CO., LTD.) is polyoxyethylene β-nephthyl ether (average number of oxyethylene groups n=13), and gum arabic has a mass average molecular weight of 200,000.

| <Developer 1> | |
|---|---|
| Sodium carbonate | 13.0 g |
| Sodium hydrogen carbonate | 7.0 g |
| Newcol B13 | 50.0 g |
| Ammonium phosphate monobasic | 2.0 g |
| 2-Bromo-2-nitropropane-1,3-diol | 0.01 g |
| 2-Methyl-4-isothiazolin-3-one | 0.01 g |
| Trisodium citrate | 15.0 g |
| Distilled water (pH: 9.8) | 913.98 g |

| <Developer 2> | |
|---|---|
| Potassium hydroxide | 0.15 g |
| Newcol B13 | 5.0 g |
| Chelset 400 (chelating agent) | 0.1 g |
| Distilled water (pH: 12.05) | 94.75 g |

| <Developer 3> | |
|---|---|
| Gum arabic | 25.0 g |
| Enzymatically modified potato starch | 70.0 g |
| Sodium salt of dioctyl sulfosuccinic acid ester | 5.0 g |
| Ammonium phosphate monobasic | 1.0 g |
| Citric acid | 1.0 g |
| 2-Bromo-2-nitropropane-1,3-diol | 0.01 g |
| 2-Methyl-4-isothiazolin-3-one | 0.01 g |
| Zwitterionic surfactant shown below (W-1) | 70.0 g |
| Anionic surfactant shown below (AN-1) | 3.0 g |

| <Developer 3> (continued) | |
|---|---|
| Distilled water | 824.98 g |
| (adjusted to pH 4.5 with phosphoric acid and sodium hydroxide) | |

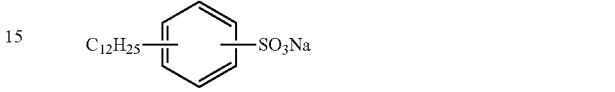
(AN-1)

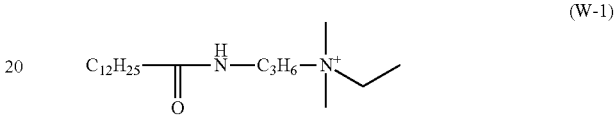
(W-1)

| <Developer 4> | |
|---|---|
| Water | 937.2 g |
| Anionic surfactant shown below (W-2) | 23.8 g |
| Phosphoric acid | 3 g |
| Phenoxypropanol | 5 g |
| Triethanolamine | 6 g |
| Potato dextrin | 25 g |
| (adjusted to pH 6.8 with phosphoric acid) | |

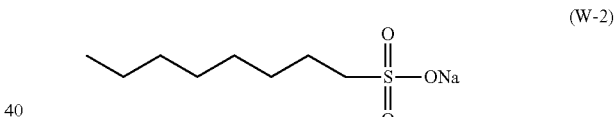
(W-2)

| <Developer 5> | |
|---|---|
| Water | 88.6 g |
| Nonionic surfactant shown below (W-3) | 2.4 g |
| Nonionic surfactant shown below (W-4) | 2.4 g |
| Nonionic surfactant | 1.0 g |
| (EMALEX 710 from Nippon Emulsion Co., Ltd.) | |
| Phenoxypropanol | 1.0 g |
| Octanol | 0.6 g |
| N-(2-hydroxyethyl)morpholine | 1.0 g |
| Triethanolamine | 0.5 g |
| Sodium gluconate | 1.0 g |
| Trisodium citrate | 0.5 g |
| Tetrasodium ethylenediaminetetraacetate | 0.05 g |
| Polystyrene sulfonate | 1.0 g |
| (Versa TL77 (a 30% solution) from Alco Chemical) | |
| (adjusted to pH 7.0 with phosphoric acid) | |

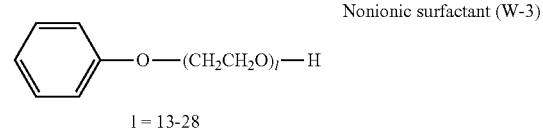
Nonionic surfactant (W-3)

l = 13-28

-continued

Nonionic surfactant (W-4)

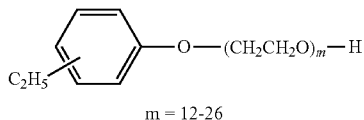

m = 12-26

The lithographic printing plates obtained were mounted on the printing press SOR-M from Heidelberg Printing Machines AG to perform printing with a dampening solution (EU-3 (an etching solution from Fujifilm Corporation)/water/isopropyl alcohol=1/89/10 (volume ratio)) and TRANS-G (N) black ink (from DIC Corporation) at a printing speed of 6000 sheets/hr.

[Evaluation]

Each lithographic printing plate precursor was evaluated for printing durability, staining resistance, staining resistance over time and developability as described below. The results are shown in the tables below.

<Printing Durability>

As the number of prints increased, the ink density on printing paper decreased because the image-recording layer gradually wore and lost its ink receptivity. In each printing plate exposed at the same exposure dose, printing durability was evaluated by determining the number of prints when the ink density (reflection density) decreased by 0.1 as compared with the density at the start of printing. The evaluation of printing durability was reported as the relative printing durability defined below using Comparative example 1, Comparative example 7 and Comparative example 10 as references (1.0) respectively for Examples 1 to 43 and Comparative examples 1 to 6; for Examples 44 to 50 and Comparative examples 7 to 9; and for Examples 51 to 59 and Comparative examples 10 to 12. Higher values of the relative printing durability indicate higher printing durability.

Relative printing durability=(Printing durability of test lithographic printing plate precursor)/(Printing durability of reference lithographic printing plate precursor).

<Staining Resistance>

After printing was started, the 20th print was sampled to evaluate staining resistance by the density of the ink deposited on non-image areas. The ink deposition on non-image areas was reported as a score of visual evaluation per 75 cm$^2$ because it does not always occur uniformly. Scores of visual evaluation were assigned according to ink-deposited area fractions in non-image areas as follows: score 10 for 0%, score 9 for more than 0% and 10% or less, score 8 for more than 10% and 20% or less, score 7 for more than 20% and 30% or less, score 6 for more than 30% and 40% or less, score 5 for more than 40% and 50% or less, score 4 for more than 50% and 60% or less, score 3 for more than 60% and 70% or less, score 2 for more than 70% and 80% or less, score 1 for more than 80% and 90% or less, and score 0 for more than 90% and 100% or less. Higher scores indicate better staining resistance.

<Staining Resistance Over Time>

After each lithographic printing plate was prepared, it was left in a constant temperature and humidity chamber set at 60° C. and a relative humidity of 60% for three days. This printing plate was used to evaluate staining resistance over time in the same manner as described for the evaluation of staining resistance. Higher scores indicate better staining resistance over time.

<Developability>

The developing step described above was performed at varying feed speeds, and the cyan density in non-image areas of the resulting lithographic printing plate was measured by a MacBeth densitometer. Developability was evaluated by determining the feed speed when the cyan density in non-image areas equaled to the cyan density in the aluminum substrate. The evaluation of developability was reported as the relative developability defined below using Comparative example 1, Comparative example 7 and Comparative example 10 respectively as references (1.0) for Examples 1 to 43 and Comparative examples 1 to 6; for Examples 44 to 50 and Comparative examples 7 to 9; and for Examples 51 to 59 and Comparative examples 10 to 12. Higher values of the relative developability indicate higher developability and better performance.

Relative developability=(Feed speed of test lithographic printing plate precursor)/(Feed speed of reference lithographic printing plate precursor).

TABLE 3

| | Lithographic printing plate precursor | Developer | Printing performance | | | |
|---|---|---|---|---|---|---|
| | | | Printing durability | Staining resistance | Staining resistance over time | Developability |
| Example 1 | A-1 | 1 | 1.6 | 7 | 7 | 1.2 |
| Example 2 | A-2 | 1 | 1.7 | 7 | 7 | 1.2 |
| Example 3 | A-3 | 1 | 1.7 | 7 | 7 | 1.2 |
| Example 4 | A-4 | 1 | 1.6 | 7 | 7 | 1.2 |
| Example 5 | A-5 | 1 | 2.0 | 10 | 9 | 1.3 |
| Example 6 | A-5 | 3 | 1.6 | 8 | 7 | 1.1 |
| Example 7 | A-5 | 4 | 1.8 | 10 | 10 | 1.1 |
| Example 8 | A-5 | 5 | 1.9 | 9 | 9 | 1.1 |
| Example 9 | A-6 | 1 | 1.9 | 10 | 9 | 1.3 |
| Example 10 | A-7 | 1 | 2.0 | 10 | 9 | 1.2 |
| Example 11 | A-8 | 1 | 2.0 | 9 | 9 | 1.2 |
| Example 12 | A-9 | 1 | 1.8 | 8 | 8 | 1.0 |
| Example 13 | A-10 | 1 | 1.5 | 8 | 7 | 1.0 |
| Example 14 | A-11 | 1 | 1.5 | 8 | 7 | 1.0 |
| Example 15 | A-12 | 1 | 1.5 | 8 | 7 | 1.0 |
| Example 16 | A-13 | 1 | 1.5 | 8 | 7 | 1.0 |
| Example 17 | A-14 | 1 | 1.9 | 10 | 10 | 1.3 |
| Example 18 | A-15 | 1 | 1.9 | 10 | 9 | 1.3 |

TABLE 3-continued

|  | Lithographic printing plate precursor | Developer | Printing durability | Staining resistance | Staining resistance over time | Developability |
|---|---|---|---|---|---|---|
| Example 19 | A-16 | 1 | 1.6 | 8 | 8 | 1.1 |
| Example 20 | A-17 | 1 | 1.6 | 8 | 8 | 1.1 |
| Example 21 | A-18 | 1 | 1.8 | 8 | 8 | 1.1 |
| Example 22 | A-19 | 1 | 1.8 | 8 | 7 | 1.1 |
| Example 23 | A-20 | 1 | 1.7 | 9 | 9 | 1.1 |
| Example 24 | A-21 | 1 | 1.7 | 8 | 7 | 1.2 |
| Example 25 | A-22 | 1 | 1.7 | 7 | 7 | 1.0 |
| Example 26 | A-23 | 1 | 1.7 | 7 | 7 | 1.2 |
| Example 27 | A-24 | 1 | 2.0 | 10 | 10 | 1.1 |
| Example 28 | A-25 | 1 | 1.6 | 10 | 9 | 1.1 |
| Example 29 | A-26 | 1 | 1.6 | 9 | 9 | 1.1 |
| Example 30 | A-27 | 1 | 1.8 | 8 | 8 | 1.1 |
| Example 31 | A-28 | 1 | 1.8 | 8 | 8 | 1.1 |
| Example 32 | A-29 | 1 | 1.5 | 8 | 7 | 1.1 |
| Example 33 | A-30 | 1 | 1.5 | 8 | 8 | 1.2 |
| Example 34 | A-31 | 1 | 1.7 | 9 | 8 | 1.1 |
| Example 35 | A-32 | 1 | 1.9 | 10 | 10 | 1.2 |
| Example 36 | A-33 | 1 | 1.9 | 8 | 7 | 1.0 |
| Example 37 | A-34 | 1 | 1.9 | 10 | 10 | 1.0 |
| Example 38 | A-35 | 1 | 1.8 | 9 | 8 | 1.0 |
| Example 39 | A-36 | 1 | 2.0 | 10 | 9 | 1.0 |
| Example 40 | A-37 | 1 | 1.4 | 9 | 8 | 1.0 |
| Example 41 | A-38 | 1 | 1.4 | 8 | 8 | 1.0 |
| Example 42 | A-39 | 1 | 1.6 | 8 | 8 | 1.1 |
| Example 43 | A-40 | 1 | 1.8 | 10 | 9 | 1.1 |
| Example 81 | A-55 | 1 | 1.4 | 8 | 7 | 1.0 |
| Example 82 | A-56 | 1 | 1.5 | 8 | 8 | 1.0 |
| Example 83 | A-57 | 1 | 1.5 | 10 | 9 | 1.1 |
| Example 84 | A-58 | 1 | 1.5 | 9 | 9 | 1.2 |
| Example 85 | A-59 | 1 | 1.8 | 8 | 7 | 1.0 |
| Comparative Example 1 | B-1 | 1 | 1.0 | 3 | 3 | 1.0 |
| Comparative Example 2 | B-2 | 1 | 1.1 | 2 | 2 | 0.9 |
| Comparative Example 3 | B-3 | 1 | 1.2 | 4 | 4 | 1.0 |
| Comparative Example 4 | B-4 | 1 | 0.6 | 5 | 5 | 1.0 |
| Comparative Example 5 | B-5 | 1 | 1.2 | 5 | 4 | 1.0 |
| Comparative Example 6 | None | 1 | 0.8 | 0 | 0 | 0.2 |

TABLE 4

|  | Lithographic printing plate precursor | Developer | Printing durability | Staining resistance | Staining resistance over time | Developability |
|---|---|---|---|---|---|---|
| Example 44 | A-5 | 2 | 1.6 | 9 | 8 | 1.3 |
| Example 45 | A-6 | 2 | 1.8 | 9 | 8 | 1.2 |
| Example 46 | A-14 | 2 | 1.7 | 9 | 9 | 1.2 |
| Example 47 | A-27 | 2 | 1.6 | 8 | 7 | 1.1 |
| Example 48 | A-29 | 2 | 1.4 | 8 | 7 | 1.3 |
| Example 49 | A-30 | 2 | 1.5 | 8 | 7 | 1.2 |
| Example 50 | A-36 | 2 | 1.8 | 9 | 8 | 1.0 |
| Comparative Example 7 | B-2 | 2 | 1.0 | 4 | 2 | 1.0 |
| Comparative Example 8 | B-4 | 2 | 0.2 | 5 | 4 | 1.0 |
| Comparative Example 9 | B-5 | 2 | 1.2 | 5 | 2 | 1.0 |

TABLE 5

|  | Lithographic printing plate precursor | Developer | Printing durability | Staining resistance | Staining resistance over time | Developability |
|---|---|---|---|---|---|---|
| Example 51 | A-41 | 4 | 1.9 | 10 | 9 | 1.3 |
| Example 52 | A-41 | 1 | 1.9 | 10 | 9 | 1.3 |
| Example 53 | A-41 | 5 | 1.9 | 10 | 9 | 1.3 |
| Example 54 | A-42 | 4 | 1.9 | 10 | 9 | 1.4 |
| Example 55 | A-43 | 4 | 1.8 | 10 | 10 | 1.3 |
| Example 56 | A-44 | 4 | 1.7 | 8 | 8 | 1.1 |
| Example 57 | A-45 | 4 | 1.6 | 8 | 7 | 1.3 |
| Example 58 | A-46 | 4 | 1.6 | 8 | 8 | 1.2 |
| Example 59 | A-47 | 4 | 2.0 | 10 | 9 | 1.0 |
| Comparative Example 10 | B-6 | 4 | 1.0 | 3 | 2 | 1.0 |
| Comparative Example 11 | B-7 | 4 | 0.5 | 4 | 4 | 0.9 |
| Comparative Example 12 | B-8 | 4 | 1.1 | 4 | 2 | 1.0 |

The tables above show that Comparative examples 1, 2, 7 and 10 using polymers solely composed of repeat units having a functional group interacting with the substrate surface were poor in printing durability, staining resistance, and staining resistance over time.

Comparative examples 4, 8 and 11 having no ethylenically unsaturated group in a side chain of their repeat units were shown to be poor in the balance among staining resistance, staining resistance over time and developability.

Comparative examples 5, 9 and 12 having an ethylenically unsaturated bond in a side chain of their repeat units but not complying with the repeat unit represented by formula (1) were shown to be poor in staining resistance and developability.

In contrast, Examples 1 to 59 having repeat units satisfying the criteria of the present invention were shown to be excellent in staining resistance, staining resistance over time and developability without compromising printing durability.

<Exposure, Development and Printing>

Various lithographic printing plate precursors shown in the tables below were imagewise exposed at a 50% tint using Trendsetter 3244VX from Creo (incorporating a water-cooled 40 W infrared semiconductor laser (830 nm)) under conditions of an output power of 9 W, an external drum rotational speed of 210 rpm, and a resolution of 2,400 dpi. Then, the image was developed using developer 1 or 4 in an automatic developing machine having the structure shown in FIG. 1 with heater settings that allow the plate surface to reach a temperature of 100° C. in the preheating part and at a feed speed that allows an immersion time in the developer (developing time) of 20 seconds.

The lithographic printing plates obtained were mounted on the printing press SOR-M from Heidelberg Printing Machines AG to perform printing with a dampening solution (EU-3 (an etching solution from Fujifilm Corporation)/water/isopropyl alcohol=1/89/10 (volume ratio)) and TRANS-G (N) black ink (from DIC Corporation) at a printing speed of 6000 sheets/hr.

Each lithographic printing plate precursor was evaluated for printing durability, staining resistance, staining resistance over time, and developability in the same manner as in Example 1. The evaluation of printing durability and developability was made by using Comparative example 13 and Comparative example 15 as references (1.0) respectively for Examples 60 to 66 and Comparative examples 13 and 14; and for Examples 67 to 73 and Comparative examples 15 and 16.

TABLE 6

|  | Lithographic printing plate precursor | Developer | Printing durability | Staining resistance | Staining resistance over time | Developability |
|---|---|---|---|---|---|---|
| Example 60 | A-48 | 1 | 2.4 | 10 | 9 | 1.4 |
| Example 61 | A-49 | 1 | 2.5 | 10 | 9 | 1.3 |
| Example 62 | A-50 | 1 | 2.3 | 10 | 10 | 1.4 |
| Example 63 | A-51 | 1 | 2.2 | 8 | 8 | 1.2 |
| Example 64 | A-52 | 1 | 1.9 | 8 | 7 | 1.3 |
| Example 65 | A-53 | 1 | 1.8 | 8 | 8 | 1.3 |
| Example 66 | A-54 | 1 | 2.1 | 10 | 9 | 1.1 |
| Comparative Example 13 | B-9 | 1 | 1.0 | 4 | 4 | 1.0 |
| Comparative Example 14 | B-10 | 1 | 1.6 | 4 | 1 | 1.0 |

TABLE 7

|  | Lithographic printing plate precursor | Developer | Printing durability | Staining resistance | Staining resistance over time | Developability |
|---|---|---|---|---|---|---|
| Example 67 | A-48 | 4 | 2.3 | 10 | 9 | 1.5 |
| Example 68 | A-49 | 4 | 2.3 | 10 | 9 | 1.5 |
| Example 69 | A-50 | 4 | 2.2 | 10 | 10 | 1.4 |
| Example 70 | A-51 | 4 | 2.0 | 8 | 8 | 1.3 |
| Example 71 | A-52 | 4 | 1.8 | 8 | 7 | 1.3 |
| Example 72 | A-53 | 4 | 1.7 | 8 | 8 | 1.3 |
| Example 73 | A-54 | 4 | 1.9 | 10 | 9 | 1.1 |
| Comparative Example 15 | B-9 | 4 | 1.0 | 3 | 3 | 1.0 |
| Comparative Example 16 | B-10 | 4 | 1.4 | 3 | 1 | 0.8 |

The tables above show that Comparative examples 13 and 15 using a polymer solely composed of repeat units having a functional group interacting with the substrate surface were poor in printing durability, staining resistance, and staining resistance over time.

Comparative examples 14 and 16 having an ethylenically unsaturated bond in a side chain of their repeat units but not containing the repeat unit represented by formula (1) were shown to be poor in staining resistance and developability.

In contrast, Examples 60 to 73 having repeat units satisfying the criteria of the present invention were shown to be excellent in staining resistance, staining resistance over time and developability without compromising printing durability.

<Exposure, Development and Printing>

Various lithographic printing plate precursors shown in the table below were exposed using Luxel PLATESETTER T-6000III incorporating an infrared semiconductor laser from Fujifilm Corporation, under conditions of an external drum rotational speed of 1000 rpm, a laser output of 70%, and a resolution of 2400 dpi. The image formed by exposure included solid areas and halftone areas produced by 20 μm dot FM screening. The exposed lithographic printing plate precursors were mounted on the plate cylinder of the printing press LITHRONE 26 from KOMORI Corporation without developing the image. The image was developed on press with a dampening solution consisting of Ecolity-2 (from Fujifilm Corporation)/tap water=2/98 (volume ratio) and Values-G(N) black ink (from DIC Corporation) by supplying the dampening solution and the ink according to the standard automatic print starting mode of LITHRONE 26, followed by printing on 100 sheets of Tokubishi Art paper (76.5 kg) at a printing speed of 10000 sheets/hr.

[Evaluation]

Each lithographic printing plate precursor was evaluated for on-press developability and printing durability as described below. Staining resistance and staining resistance over time were evaluated as described in Example 1. The results are shown in the table below.

<On-Press Developability>

On-press developability was evaluated by determining the number of sheets of printing paper required to complete on-press development in non-image areas of the image-recording layer on the printing press until the ink was no more transferred to the non-image areas.

<Printing Durability>

After the evaluation of on-press developability, printing was further continued. As the number of prints increased, the ink density on the prints decreased because the image-recording layer gradually wore. Printing durability was evaluated by determining the number of prints at the end of printing when the dot area fraction of halftone dots produced by FM screening in a print measured by a Gretag densitometer decreased by 5% as compared with the value measured in the 100th print. The evaluation of printing durability was reported as the relative printing durability defined below using Comparative example 17 as reference (1.0). Higher values of the relative printing durability indicate higher printing durability.

Relative printing durability=(Printing durability of test lithographic printing plate precursor)/(Printing durability of reference lithographic printing plate precursor).

TABLE 8

|  | Lithographic printing plate precursor | Printing performance | | | |
|---|---|---|---|---|---|
|  |  | Printing durability | Staining resistance | Staining resistance over time | On-press developability |
| Example 74 | A-48 | 2.0 | 10 | 9 | 20 |
| Example 75 | A-49 | 2.0 | 10 | 9 | 20 |
| Example 76 | A-50 | 1.9 | 10 | 9 | 15 |
| Example 77 | A-51 | 2.0 | 8 | 7 | 20 |
| Example 78 | A-52 | 1.7 | 8 | 7 | 20 |
| Example 79 | A-53 | 1.7 | 8 | 7 | 20 |
| Example 80 | A-54 | 1.9 | 10 | 10 | 15 |
| Comparative Example 17 | B-9 | 1.0 | 5 | 2 | 80 |
| Comparative Example 18 | B-10 | 1.3 | 3 | 2 | 200 |

The table above shows that Comparative example 17 using a polymer solely composed of repeat units having a functional group interacting with the substrate surface was poor in printing durability, staining resistance, and staining resistance over time.

Comparative example 18 having an ethylenically unsaturated bond in a side chain of the repeat unit but not containing the repeat unit represented by formula (1) was shown to be poor in staining resistance and on-press developability.

In contrast, Examples 74 to 80 having repeat units satisfying the criteria of the present invention were shown to be excellent in staining resistance, staining resistance over time and developability without compromising printing durability.

The present disclosure relates to the subject matter contained in Japanese Patent Application No. 180797/2011, filed on Aug. 22, 2011, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A lithographic printing plate precursor comprising a primer layer and an image-recording layer in this order in a substrate, wherein the primer layer comprises (A) a polymer containing a repeat unit represented by formula (1);

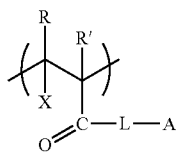

Formula (1)

in formula (1), R and R' each represent a hydrogen atom, halogen atom, or methyl group, L represents a divalent linking group containing —C(=O)—NR$^0$— (wherein R$^0$ represents a hydrogen atom or an optionally substituted alkyl group); A and X each represent a monovalent organic group, provided that at least one of A and X represents an organic group containing a carboxyl group or a salt of a carboxylic group and at least one of A and X represents an organic group containing an ethylenically unsaturated bond.

2. The lithographic printing plate precursor according to claim 1, wherein the polymer (A) contains a repeat unit represented by formula (2) and/or a repeat unit represented by formula (3);

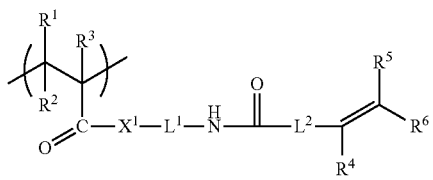

Formula (2)

in formula (2), $R^1$, $R^2$ and $R^3$ each represent a hydrogen atom, halogen atom or methyl group, $X^1$ represents —O— or —N($R^7$)— wherein $R^7$ represents a hydrogen atom or an optionally substituted alkyl group, $L^1$ represents a divalent linking group, and $L^2$ represents a single bond or an optionally substituted divalent linking group; $R^4$, $R^5$ and $R^6$ each represent a hydrogen atom, halogen atom, carboxyl group, hydroxyl group, or an optionally substituted alkyl group or aryl group, provided that at least one of the substituent which $L^2$ has, $R^4$, $R^5$ and $R^6$ represents a carboxyl group or a salt of a carboxylic group, or a group substituted by a carboxyl group or a salt of a carboxylic group; any two or more of the substituent which $L^2$ has, $R^4$, $R^5$ and $R^6$ may be joined together to form a ring;

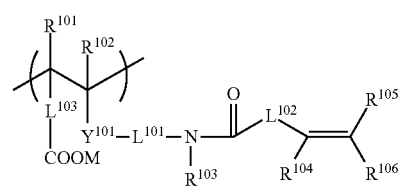

Formula (3)

in formula (3), $R^{101}$ and $R^{102}$ each represent a hydrogen atom, halogen atom or methyl group, $Y^{101}$ represents —CO—O— or —CO—N($R^{107}$)— wherein $R^{107}$ represents a hydrogen atom or an optionally substituted alkyl group, $R^{103}$ represents a hydrogen atom or an optionally substituted alkyl group, $L^{101}$ represents a divalent linking group, and $L^{102}$ represents a single bond or an optionally substituted divalent linking group; $R^{104}$, $R^{105}$ and $R^{106}$ each represent a hydrogen atom, halogen atom, carboxyl group, hydroxyl group, or an optionally substituted alkyl group or an optionally substituted aryl group, or any two or more of $L^{102}$, $R^{104}$, $R^{105}$, and $R^{106}$ may be joined together to form a ring; $L^{103}$ represents a single bond or an optionally substituted divalent linking group, and M represents a hydrogen atom or a monovalent metal ion or ammonium.

3. The lithographic printing plate precursor according to claim 1, wherein the polymer (A) contains at least one of a repeat unit represented by formula (3), a repeat unit represented by formula (4) and a repeat unit represented by formula (5);

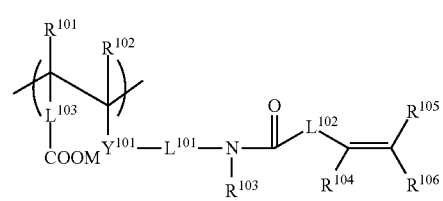

(Formula (3))

in formula (3), $R^{101}$ and $R^{102}$ each represent a hydrogen atom, halogen atom or methyl group, $Y^{101}$ represents —CO—O— or —CO—N($R^{107}$)— wherein $R^{107}$ represents a hydrogen atom or an optionally substituted alkyl group, $R^{103}$ represents a hydrogen atom or an optionally substituted alkyl group, $L^{101}$ represents a divalent linking group, and $L^{102}$ represents a single bond or an optionally substituted divalent linking group; $R^{104}$, $R^{105}$ and $R^{106}$ each represent a hydrogen atom, halogen atom, carboxyl group, hydroxyl group, or an optionally substituted alkyl group or an optionally substituted alkyl aryl group, or any two or more of $L^{102}$, $R^{104}$, $R^{105}$, and $R^{106}$ may be joined together to form a ring; $L^{103}$ represents a single bond or an optionally substituted divalent linking group, and M represents a hydrogen atom or a monovalent metal ion or ammonium;

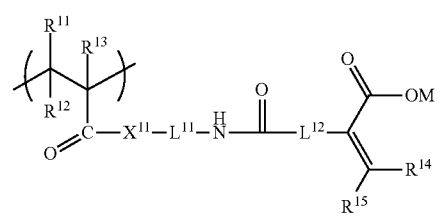

Formula (4)

in formula (4), $R^{11}$, $R^{12}$ and $R^{13}$ each represent a hydrogen atom, halogen atom or methyl group, $X^{11}$ represents —O— or —N($R^{16}$)— wherein $R^{16}$ represents a hydrogen atom or an optionally substituted alkyl group, $L^{11}$ represents a divalent linking group, and $L^{12}$ represents a single bond or an optionally substituted divalent linking group; $R^{14}$ and $R^{15}$ each represent a hydrogen atom, halogen atom, carboxyl group, hydroxyl group, or an optionally substituted alkyl group or an optionally substituted aryl group, or any two or more of $L^{12}$, $R^{14}$ and $R^{15}$ may be joined together to form a ring; M represents a hydrogen atom or a monovalent metal ion or ammonium;

Formula (5)

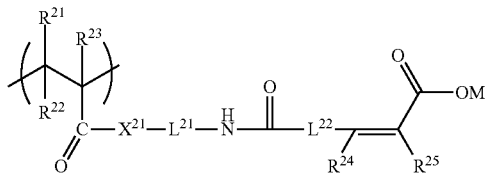

in formula (5), $R^{21}$, $R^{22}$ and $R^{23}$ each represent a hydrogen atom, halogen atom or methyl group, $X^{21}$ represents —O— or —N($R^{26}$)— wherein $R^{26}$ represents a hydrogen atom or an optionally substituted alkyl group, $L^{21}$ represents a divalent linking group, and $L^{22}$ represents a single bond or an optionally substituted divalent linking group; $R^{24}$ and $R^{25}$ each represent a hydrogen atom, halogen atom, carboxyl group, hydroxyl group, or an optionally substituted alkyl group or an optionally substituted aryl group, or any two or more of $L^{22}$, $R^{24}$ and $R^{25}$ may be joined together to form a ring; M represents a hydrogen atom or a monovalent metal ion or ammonium.

4. The lithographic printing plate precursor according to claim 1, wherein the polymer (A) further contains (a2) a repeat unit having a structure interacting with the substrate surface in a side chain and/or (a3) a repeat unit having a hydrophilic group in a side chain.

5. The lithographic printing plate precursor according to claim 4, wherein the repeat unit (a2) having a structure interacting with the substrate surface in a side chain has any one or more of structures represented by formulae (a2-1) to (a2-6) below in a side chain;

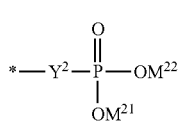 (a2-1)

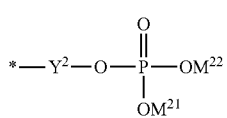 (a2-2)

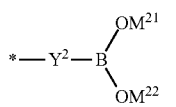 (a2-3)

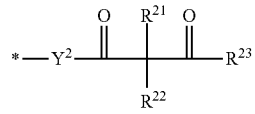 (a2-4)

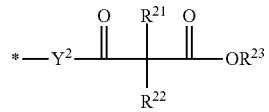 (a2-5)

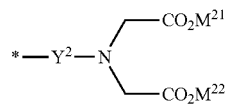 (a2-6)

in formulae (a2-1), (a2-2), (a2-3), (a2-4), (a2-5) and (a2-6), $M^{21}$ and $M^{22}$ each represent a hydrogen atom, a metal atom categorized into an alkali metal or an alkaline earth metal, or ammonium; $R^{21}$ to $R^{23}$ each independently represent a hydrogen atom or alkyl group; $Y^2$ represents a single bond or a divalent linking group selected from the group consisting of —CO—, —O—, —NH—, a divalent aliphatic group, a divalent aromatic group and a combination thereof; and the asterisk (*) indicates the point of attachment to the main chain of the polymer compound.

6. The lithographic printing plate precursor according to claim 4, wherein the repeat unit (a3) having a hydrophilic group in a side chain has a structure represented by formula (a3-1) and/or formula (a3-2) below in the side chain;

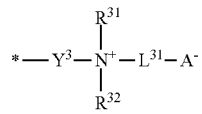 (a3-1)

in formula (a3-1), $R^{31}$ and $R^{32}$ each independently represent a hydrogen atom, alkyl group, alkenyl group, alkynyl group, aryl group, or heterocyclyl group, or $R^{31}$ and $R^{32}$ may be joined together to form a ring structure, $L^{31}$ represents a linking group, and $A^-$ represents an anion-containing structure; and $Y^3$ represents a divalent linking group attached to the main chain of the polymer compound; and the asterisk (*) indicates the point of attachment to the main chain of the polymer compound;

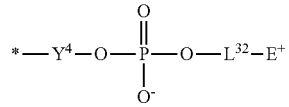 (a3-2)

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; and the asterisk (*) indicates the point of attachment to the main chain of the polymer compound.

7. The lithographic printing plate precursor according to claim 1, wherein the polymer (A) contains (a2) and (a3) below:
(a2) a repeat unit having any one or more of structures represented by formulae (a2-1) to (a2-6) in a side chain:

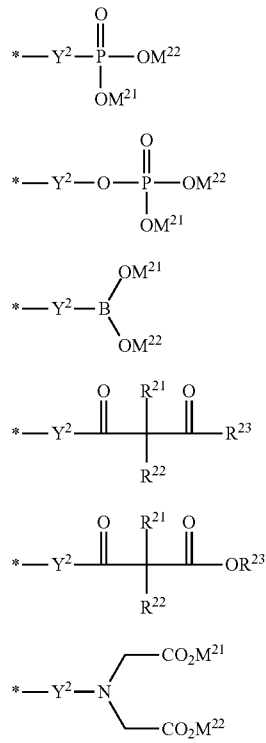

in formulae (a2-1), (a2-2), (a2-3), (a2-4), (a2-5) and (a2-6), $M^{21}$ and $M^{22}$ each represent a hydrogen atom, a metal atom categorized into an alkali metal or an alkaline earth metal, or ammonium; $R^{21}$ to $R^{23}$ each independently represent a hydrogen atom or alkyl group; $Y^2$ represents a single bond or a divalent linking group selected from the group consisting of —CO—, —O—, —NH—, a divalent aliphatic group, a divalent aromatic group and a combination thereof; and the asterisk (*) indicates the point of attachment to the main chain of the polymer compound;
(a3) a repeat unit having a structure represented by formula (a3-1) and/or (a3-2) in a side chain:

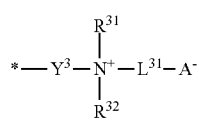

in formula (a3-1), $R^{31}$ and $R^{32}$ each independently represent a hydrogen atom, alkyl group, alkenyl group, alkynyl group, aryl group, or heterocyclyl group, or $R^{31}$ and $R^{32}$ may be joined together to form a ring structure, $L^{31}$ represents a linking group, and $A^-$ represents an anion-containing structure; $Y^3$ represents a divalent linking group attached to the main chain of the polymer compound; the asterisk (*) indicates the point of attachment to the main chain of the polymer compound;

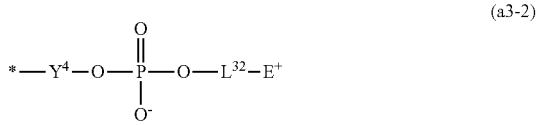

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; and the asterisk (*) indicates the point of attachment to the main chain of the polymer compound.

8. The lithographic printing plate precursor according to claim 2, wherein $L^1$ in formula (2), $L^{101}$ in formula (3), $L^{11}$ in formula (4), and $L^{21}$ in formula (5) above represent a divalent aliphatic group, and $L^2$ in formula (2), $L^{102}$ in formula (3), $L^{12}$ in formula (4), and $L^{22}$ in formula (5) above represent a single bond or a divalent aliphatic group.

9. The lithographic printing plate precursor according to claim 2, wherein the polymer (A) further contains (a2) a repeat unit having a structure interacting with the substrate surface in a side chain and/or (a3) a repeat unit having a hydrophilic group in a side chain.

10. The lithographic printing plate precursor according to claim 9, wherein the repeat unit (a2) having a structure interacting with the substrate surface in a side chain has any one or more of structures represented by formulae (a2-1) to (a2-6) below in a side chain;

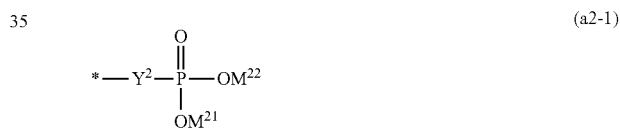

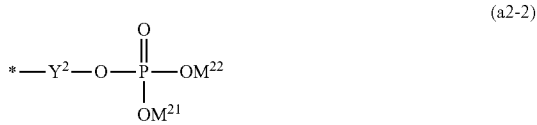

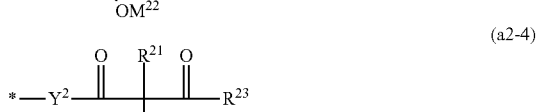

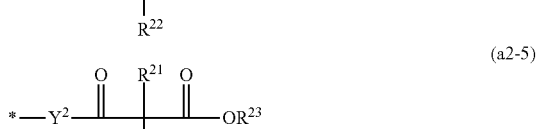

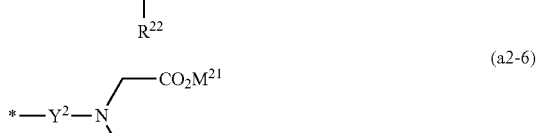

in formulae (a2-1), (a2-2), (a2-3), (a2-4), (a2-5) and (a2-6), $M^{21}$ and $M^{22}$ each represent a hydrogen atom, a metal atom categorized into an alkali metal or an alkaline earth metal, or ammonium; $R^{21}$ to $R^{23}$ each independently represent a hydrogen atom or alkyl group; $Y^2$ represents a single bond or a divalent linking group selected from the group consisting of —CO—, —O—, —NH—, a divalent aliphatic group, a divalent aromatic group and a combination thereof; and the asterisk (*) indicates the point of attachment to the main chain of the polymer compound.

11. The lithographic printing plate precursor according to claim 9, wherein the repeat unit (a3) having a hydrophilic group in a side chain has a structure represented by formula (a3-1) and/or formula (a3-2) below in the side chain;

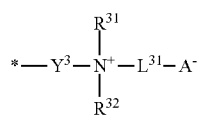

(a3-1)

in formula (a3-1), $R^{31}$ and $R^{32}$ each independently represent a hydrogen atom, alkyl group, alkenyl group, alkynyl group, aryl group, or heterocyclyl group, or $R^{31}$ and $R^{32}$ may be joined together to form a ring structure, $L^{31}$ represents a linking group, and $A^-$ represents an anion-containing structure; and $Y^3$ represents a divalent linking group attached to the main chain of the polymer compound; the asterisk (*) indicates the point of attachment to the main chain of the polymer compound;

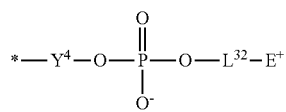

(a3-2)

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound.

12. The lithographic printing plate precursor according to claim 1, wherein the image-recording layer comprises (B) a polymerization initiator, (C) a polymerizable compound and (D) a binder.

13. The lithographic printing plate precursor according to claim 2, wherein the image-recording layer comprises (B) a polymerization initiator, (C) a polymerizable compound and (D) a binder.

14. The lithographic printing plate precursor according to claim 1, wherein the image-recording layer can be removed by an aqueous solution at pH 2 to 14.

15. The lithographic printing plate precursor according to claim 1, wherein the image-recording layer can be removed by at least one of a printing ink and a dampening solution.

16. A process for preparing a lithographic printing plate, comprising:
imagewise exposing a lithographic printing plate precursor according to claim 1; and
developing the exposed lithographic printing plate precursor in the presence of a developer at pH 2 to 14 to remove the image-recording layer in unexposed areas.

17. The process for preparing a lithographic printing plate according to claim 16, comprising forming a protective layer on the surface of the image-recording layer opposite to the substrate;
wherein the developing step comprises removing the image-recording layer in unexposed areas and the protective layer simultaneously in the presence of the developer further containing a surfactant provided that no water-washing step is included.

18. A process for preparing a lithographic printing plate, comprising:
imagewise exposing a lithographic printing plate precursor according to claim 1; and
supplying a printing ink and a dampening solution to remove the image-recording layer in unexposed areas on a printing press.

19. A copolymer comprising (a1) to (a3) below:
(a1) a repeat unit represented by formula (1):

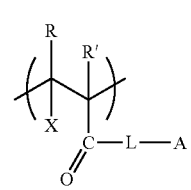

Formula (1)

in formula (1), R and R' each represent a hydrogen atom, halogen atom, or methyl group, L represents a divalent linking group containing —C(=O)—NR$^0$— wherein $R^0$ represents a hydrogen atom or an optionally substituted alkyl; A and X each represent a monovalent organic group, provided that at least one of A and X represents an organic group containing a carboxyl group or a salt of a carboxylic group and at least one of A and X represents an organic group containing an ethylenically unsaturated bond; and (a2) a repeat unit having any one or more of structures represented by formulae (a2-1) to (a2-6) in a side chain:

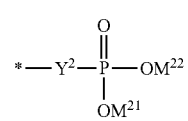

(a2-1)

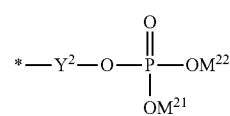

(a2-2)

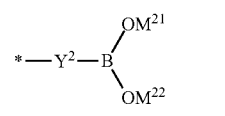

(a2-3)

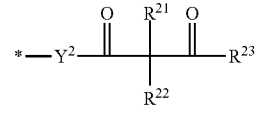

(a2-4)

(a2-5)

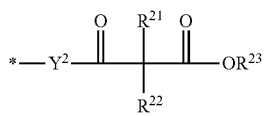

(a2-6)

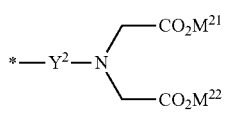

in formulae (a2-1), (a2-2), (a2-3), (a2-4), (a2-5) and (a2-6), $M^{21}$ and $M^{22}$ each represent a hydrogen atom, a metal atom contained in an alkali metal or an alkaline earth metal, or ammonium; $R^{21}$ to $R^{23}$ each independently represent a hydrogen atom or alkyl group; $Y^2$ represents a single bond, or a divalent linking group selected from the group consisting of —CO—, —O—, —NH—, a divalent aliphatic group, a divalent aromatic group and a combination thereof; the asterisk (*) indicates the point of attachment to the main chain of the polymer compound;

(a3) a repeat unit having a structure represented by formula (a3-1) and/or (a3-2) in a side chain:

(a3-1)

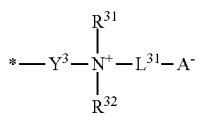

in formula (a3-1), $R^{31}$ and $R^{32}$ each independently represent a hydrogen atom, alkyl group, alkenyl group, alkynyl group, aryl group, or heterocyclyl, or $R^{31}$ and $R^{32}$ may be joined together to form a ring structure, $L^{31}$ represents a linking group, and $A^-$ represents an anion-containing structure; $Y^3$ represents a divalent linking group attached to the main chain of the polymer compound; and the asterisk (*) indicates the point of attachment to the main chain of the polymer compound;

(a3-2)

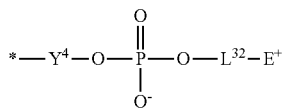

in formula (a3-2), $L^{32}$ represents a linking group, and $E^+$ represents a cation-containing structure; $Y^4$ represents a single bond, or a divalent linking group selected from the group consisting of —CO—, —O—, —NH—, a divalent aliphatic group, a divalent aromatic group and a combination thereof;
the asterisk (*) indicates the point of attachment to the main chain of the polymer compound.

20. The copolymer according to claim 19, wherein the repeat unit represented by formula (1) is a repeat unit represented by formula (4) or a repeat unit represented by formula (5):

Formula (4)

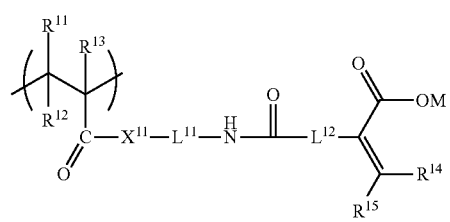

in formula (4), $R^{11}$, $R^{12}$ and $R^{13}$ each represent a hydrogen atom, halogen atom or methyl, $X^{11}$ represents —O— or —N($R^{16}$)— wherein $R^{16}$ represents a hydrogen atom or an optionally substituted alkyl group, $L^{11}$ represents a divalent linking group, and $L^{12}$ represents a single bond or an optionally substituted divalent linking group; $R^{14}$ and $R^{15}$ each represent a hydrogen atom, halogen atom, carboxyl, hydroxyl, or an optionally substituted alkyl or aryl, or any two or more of $L^{12}$, $R^{14}$ and $R^{15}$ may be joined together to form a ring; M represents a hydrogen atom or a monovalent metal ion or ammonium;

Formula (5)

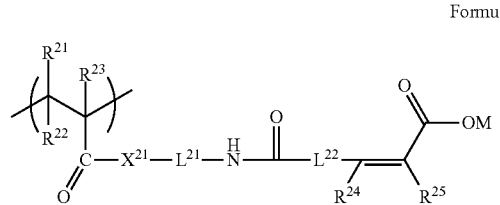

in formula (5), $R^{21}$, $R^{22}$ and $R^{23}$ each represent a hydrogen atom, halogen atom or methyl, $X^{21}$ represents —O— or —N($R^{26}$)— wherein $R^{26}$ represents a hydrogen atom or an optionally substituted alkyl, $L^{21}$ represents a divalent linking group, and $L^{22}$ represents a single bond or an optionally substituted divalent linking group; $R^{24}$ and $R^{25}$ each represent a hydrogen atom, halogen atom, carboxyl, hydroxyl, or an optionally substituted alkyl or aryl, or any two or more of $L^{22}$, $R^{24}$ and $R^{25}$ may be joined together to form a ring; and M represents a hydrogen atom or a monovalent metal ion or ammonium.

* * * * *